United States Patent
Yamazaki et al.

(10) Patent No.: US 9,911,755 B2
(45) Date of Patent: Mar. 6, 2018

(54) SEMICONDUCTOR DEVICE INCLUDING TRANSISTOR AND CAPACITOR

(71) Applicant: Semiconductor Energy Laboratory Co., Ltd., Atsugi-shi, Kanagawa-ken (JP)

(72) Inventors: Shunpei Yamazaki, Setagaya (JP); Hiroyuki Miyake, Atsugi (JP); Hideaki Shishido, Atsugi (JP); Masahiro Katayama, Tochigi (JP); Kenichi Okazaki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 96 days.

(21) Appl. No.: 14/107,688

(22) Filed: Dec. 16, 2013

(65) Prior Publication Data

US 2014/0175432 A1    Jun. 26, 2014

(30) Foreign Application Priority Data

Dec. 25, 2012 (JP) .................................. 2012-281874

(51) Int. Cl.
    *H01L 27/00*      (2006.01)
    *H01L 27/12*      (2006.01)

(52) U.S. Cl.
    CPC ...... *H01L 27/1225* (2013.01); *H01L 27/1248* (2013.01); *H01L 27/1255* (2013.01)

(58) Field of Classification Search
    CPC ............. H01L 27/1225; H01L 27/1248; H01L 27/1255

(Continued)

(56) References Cited

U.S. PATENT DOCUMENTS 5,299,041 A    3/1994   Morin et al.
5,724,107 A    3/1998   Nishikawa et al.
(Continued)

FOREIGN PATENT DOCUMENTS

CN    102013228     4/2011
CN    102473735 A   5/2012
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
(Continued)

*Primary Examiner* — Allen Parker
*Assistant Examiner* — Didarul Mazumder
(74) *Attorney, Agent, or Firm* — Eric J. Robinson; Robinson Intellectual Property Law Office, P.C.

(57) ABSTRACT

A semiconductor device includes a transistor including an insulating film, an oxide semiconductor film, a gate electrode overlapping with the oxide semiconductor film, and a pair of electrodes in contact with the oxide semiconductor film; a capacitor including a first light-transmitting conductive film over the insulating film, a dielectric film over the first light-transmitting conductive film, and a second light-transmitting conductive film over the dielectric film; an oxide insulating film over the pair of electrodes of the transistor; and a nitride insulating film over the oxide insulating film. The dielectric film is the nitride insulating film, the oxide insulating film has a first opening over one of the pair of electrodes, the nitride insulating film has a second opening over the one of the pair of electrodes, and the second opening is on an inner side than the first opening.

24 Claims, 53 Drawing Sheets

(58) Field of Classification Search
USPC .................. 438/85, 86, 104, 754; 257/43
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,140,198 A | 10/2000 | Liou |
| 6,294,274 B1 | 9/2001 | Kawazoe et al. |
| 6,392,722 B1 | 5/2002 | Sekime et al. |
| 6,421,101 B1 | 7/2002 | Zhang et al. |
| 6,545,305 B1 | 4/2003 | Randazzo |
| 6,559,477 B2 | 5/2003 | Tada et al. |
| 6,563,174 B2 | 5/2003 | Kawasaki et al. |
| 6,727,522 B1 | 4/2004 | Kawasaki et al. |
| 6,784,949 B1 | 8/2004 | Nagata et al. |
| 6,955,953 B2 | 10/2005 | Yamazaki et al. |
| 7,038,239 B2 | 5/2006 | Murakami et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,142,260 B2 | 11/2006 | Yang |
| 7,211,825 B2 | 5/2007 | Shih et al |
| 7,250,991 B2 | 7/2007 | Nagata et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,217 B2 | 4/2009 | Yang |
| 7,602,452 B2 | 10/2009 | Kato et al. |
| 7,602,456 B2 | 10/2009 | Tanaka et al. |
| 7,626,669 B2 | 12/2009 | Lim et al. |
| 7,674,650 B2 | 3/2010 | Akimoto et al. |
| 7,732,819 B2 | 6/2010 | Akimoto et al. |
| 7,745,798 B2 | 6/2010 | Takahashi |
| 7,773,167 B2 | 8/2010 | Tsai et al. |
| 7,847,904 B2 | 12/2010 | Kimura |
| 7,872,261 B2 | 1/2011 | Ikeda |
| 7,955,975 B2 | 6/2011 | Murakami et al. |
| 7,989,815 B2 | 8/2011 | Yamazaki et al. |
| 7,994,504 B2 | 8/2011 | Murakami et al. |
| 7,999,263 B2 | 8/2011 | Murakami et al. |
| 8,039,842 B2 | 10/2011 | Jinbo |
| 8,102,476 B2 | 1/2012 | Son et al. |
| 8,120,033 B2 | 2/2012 | Murakami et al. |
| 8,218,099 B2 | 7/2012 | Yamazaki et al. |
| 8,324,027 B2 | 12/2012 | Yamazaki et al. |
| 8,362,623 B2 | 1/2013 | Nakazawa et al. |
| 8,368,066 B2 | 2/2013 | Yamazaki et al. |
| 8,384,077 B2 | 2/2013 | Yano et al. |
| 8,389,988 B2 | 3/2013 | Yamazaki et al. |
| 8,441,011 B2 | 5/2013 | Yamazaki et al. |
| 8,481,373 B2 | 7/2013 | Okabe et al. |
| 8,492,758 B2 | 7/2013 | Yamazaki et al. |
| 8,502,215 B2 | 8/2013 | Murakami et al. |
| 8,537,318 B2 | 9/2013 | Kimura |
| 8,546,180 B2 | 10/2013 | Yamazaki et al. |
| 8,610,862 B2 | 12/2013 | Kimura |
| 8,822,990 B2 | 9/2014 | Yamazaki et al. |
| 8,937,307 B2 | 1/2015 | Yamazaki |
| 8,946,718 B2 | 2/2015 | Murakami et al. |
| 8,981,372 B2 | 3/2015 | Yamazaki |
| 8,981,374 B2 | 3/2015 | Kubota et al. |
| 9,105,727 B2 | 8/2015 | Murakami et al. |
| 9,177,969 B2 | 11/2015 | Kubota et al. |
| 9,196,639 B2 | 11/2015 | Endo |
| 9,214,563 B2 | 12/2015 | Yamazaki et al. |
| 9,224,870 B2 | 12/2015 | Yamazaki et al. |
| 9,252,287 B2 | 2/2016 | Yamazaki |
| 9,293,601 B2 | 3/2016 | Yamazaki et al. |
| 9,318,617 B2 | 4/2016 | Yamazaki et al. |
| 9,331,108 B2 | 5/2016 | Kubota et al. |
| 9,406,806 B2 | 8/2016 | Murakami et al. |
| 9,425,220 B2 | 8/2016 | Miyake et al. |
| 9,449,996 B2 | 9/2016 | Yamazaki et al. |
| 9,455,280 B2 | 9/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189210 A1 | 10/2003 | Yamazaki et al. |
| 2003/0189401 A1 | 10/2003 | Kido et al. |
| 2003/0218221 A1 | 11/2003 | Wager, III et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0183978 A1 | 9/2004 | Jeoung |
| 2004/0246424 A1 | 12/2004 | Sawasaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091399 A1 | 5/2006 | Lee |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170067 A1 | 8/2006 | Maekawa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166475 A1 | 7/2008 | Jeong et al. |
| 2008/0166834 A1 | 7/2008 | Kim et al. |
| 2008/0176364 A1 | 7/2008 | Yang et al. |
| 2008/0182358 A1 | 7/2008 | Cowdery-Corvan et al. |
| 2008/0213927 A1 | 9/2008 | Wang et al. |
| 2008/0224133 A1 | 9/2008 | Park et al. |
| 2008/0246042 A1 | 10/2008 | Ting |

(56) References Cited

U.S. PATENT DOCUMENTS

| | | |
|---|---|---|
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0303020 A1 | 12/2008 | Shin et al. |
| 2008/0308797 A1 | 12/2008 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134389 A1 | 5/2009 | Matsunaga |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0242888 A1 | 10/2009 | Hosoya |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0289256 A1 | 11/2009 | Jinbo |
| 2010/0044711 A1 | 2/2010 | Imai |
| 2010/0065837 A1 | 3/2010 | Omura et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072470 A1 | 3/2010 | Yamazaki et al. |
| 2010/0072471 A1 | 3/2010 | Yamazaki et al. |
| 2010/0084655 A1 | 4/2010 | Iwasaki et al. |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0117073 A1 | 5/2010 | Yamazaki et al. |
| 2010/0123136 A1 | 5/2010 | Lee et al. |
| 2010/0123148 A1* | 5/2010 | Park ............... H01L 33/20 257/94 |
| 2010/0163867 A1 | 7/2010 | Yamazaki et al. |
| 2010/0163874 A1 | 7/2010 | Koyama et al. |
| 2010/0244021 A1* | 9/2010 | Uochi ............. G02F 1/13454 257/43 |
| 2010/0289020 A1 | 11/2010 | Yano et al. |
| 2011/0024750 A1* | 2/2011 | Yamazaki ......... H01L 27/1214 257/57 |
| 2011/0024751 A1 | 2/2011 | Yamazaki et al. |
| 2011/0031491 A1 | 2/2011 | Yamazaki et al. |
| 2011/0031492 A1 | 2/2011 | Yamazaki et al. |
| 2011/0037068 A1 | 2/2011 | Yamazaki et al. |
| 2011/0049510 A1* | 3/2011 | Yamazaki ......... H01L 27/1225 257/43 |
| 2011/0057187 A1* | 3/2011 | Sakakura ......... H01L 27/1225 257/43 |
| 2011/0057918 A1 | 3/2011 | Kimura et al. |
| 2011/0084267 A1* | 4/2011 | Yamazaki ....... H01L 21/76828 257/43 |
| 2011/0084268 A1* | 4/2011 | Yamazaki ......... H01L 27/1214 257/43 |
| 2011/0084271 A1 | 4/2011 | Yamazaki et al. |
| 2011/0136302 A1 | 6/2011 | Yamazaki et al. |
| 2011/0140109 A1* | 6/2011 | Yamazaki ......... H01L 27/1225 257/57 |
| 2011/0140205 A1 | 6/2011 | Sakata et al. |
| 2011/0187688 A1 | 8/2011 | Yamazaki et al. |
| 2011/0241219 A1 | 10/2011 | Nakazawa et al. |
| 2011/0259420 A1 | 10/2011 | Yamazaki et al. |
| 2011/0284848 A1 | 11/2011 | Yamazaki |
| 2011/0297930 A1 | 12/2011 | Choi et al. |
| 2011/0303953 A1 | 12/2011 | Kamata |
| 2012/0002127 A1* | 1/2012 | Yamazaki ........... G09G 3/3677 349/43 |
| 2012/0062811 A1 | 3/2012 | Miyake |
| 2012/0108018 A1 | 5/2012 | Okabe et al. |
| 2012/0161820 A1 | 6/2012 | Koo et al. |
| 2012/0211745 A1 | 8/2012 | Ueda et al. |
| 2012/0241750 A1 | 9/2012 | Chikama et al. |
| 2012/0248433 A1 | 10/2012 | Nakano et al. |
| 2012/0273780 A1 | 11/2012 | Yamazaki et al. |
| 2012/0280230 A1 | 11/2012 | Akimoto et al. |
| 2012/0280238 A1 | 11/2012 | Kimura |
| 2012/0298988 A1 | 11/2012 | Hara et al. |
| 2012/0300151 A1 | 11/2012 | Yamazaki et al. |
| 2012/0319107 A1 | 12/2012 | Miyake |
| 2012/0319119 A1 | 12/2012 | Kim |
| 2013/0134424 A1 | 5/2013 | Kim et al. |
| 2013/0146452 A1 | 6/2013 | Yano et al. |
| 2013/0328044 A1 | 12/2013 | Yamazaki et al. |
| 2014/0014948 A1 | 1/2014 | Matsukura |
| 2014/0042432 A1 | 2/2014 | Yamazaki |
| 2014/0042443 A1 | 2/2014 | Yamazaki |
| 2014/0061636 A1 | 3/2014 | Miyake et al. |
| 2014/0061654 A1 | 3/2014 | Yamazaki et al. |
| 2014/0175433 A1 | 6/2014 | Yamazaki et al. |
| 2014/0175436 A1 | 6/2014 | Yamazaki |
| 2014/0183528 A1 | 7/2014 | Endo |
| 2014/0313446 A1 | 10/2014 | Kubota |
| 2015/0014680 A1 | 1/2015 | Yamazaki et al. |
| 2015/0301422 A1 | 10/2015 | Miyake et al. |
| 2015/0333088 A1 | 11/2015 | Yamazaki et al. |
| 2016/0190175 A1 | 6/2016 | Yamazaki et al. |
| 2016/0218226 A1 | 7/2016 | Yamazaki et al. |
| 2016/0322400 A1 | 11/2016 | Murakami et al. |
| 2017/0012062 A1 | 1/2017 | Yamazaki et al. |

FOREIGN PATENT DOCUMENTS

| | | |
|---|---|---|
| CN | 102714001 | 10/2012 |
| CN | 103270601 | 8/2013 |
| EP | 1737044 A | 12/2006 |
| EP | 2226847 A | 9/2010 |
| EP | 2579237 A | 4/2013 |
| EP | 2657974 A | 10/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-129234 A | 5/1989 |
| JP | 05-251705 A | 9/1993 |
| JP | 07-104312 A | 4/1995 |
| JP | 08-264794 A | 10/1996 |
| JP | 11-505377 | 5/1999 |
| JP | 2000-044236 A | 2/2000 |
| JP | 2000-105391 A | 4/2000 |
| JP | 2000-150900 A | 5/2000 |
| JP | 2001-051300 A | 2/2001 |
| JP | 2002-050761 A | 2/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 A | 4/2007 |
| JP | 2007-123861 | 5/2007 |
| JP | 2007-220817 A | 8/2007 |
| JP | 2008-060419 A | 3/2008 |
| JP | 2008-225514 A | 9/2008 |
| JP | 2010-072654 A | 4/2010 |
| JP | 2010-103451 A | 5/2010 |
| JP | 2010-243594 A | 10/2010 |
| JP | 2010-243741 A | 10/2010 |
| JP | 2011-076079 A | 4/2011 |
| JP | 2011-077517 A | 4/2011 |
| JP | 2011-091375 A | 5/2011 |
| JP | 2011-175250 A | 9/2011 |
| JP | 2011-243969 A | 12/2011 |
| JP | 2012-018970 A | 1/2012 |
| JP | 2012-238030 A | 12/2012 |

(56) References Cited

FOREIGN PATENT DOCUMENTS

| | | |
|---|---|---|
| JP | 2012-248829 A | 12/2012 |
| JP | 2013-140378 A | 7/2013 |
| KR | 2004-0012208 A | 2/2004 |
| KR | 2011-0025604 A | 3/2011 |
| KR | 2012-0112803 A | 10/2012 |
| TW | 201203690 | 1/2012 |
| TW | 201207826 | 2/2012 |
| TW | 201248860 | 12/2012 |
| WO | WO-2001/033292 | 5/2001 |
| WO | WO-2004/114391 | 12/2004 |
| WO | WO-2010/073425 | 7/2010 |
| WO | WO-2011/013561 | 2/2011 |
| WO | WO-2011/027664 | 3/2011 |
| WO | WO-2011/036999 | 3/2011 |
| WO | WO-2011/093151 | 8/2011 |
| WO | WO-2011/148537 | 12/2011 |
| WO | WO-2012/086513 | 6/2012 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashimi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08: SID International Symposium of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display with Driver Circuit Using Amorphous In—Ga—Zn—Oxide TFTs,", IDW '09: Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

(56) References Cited

OTHER PUBLICATIONS

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09: SID International Symposium Digest of Technical Papers, May 31, 2009, pp. 1110-1112.

Ohara.H et al., "21.3:4.0 In. QVGA AMOLED Display Using In—Ga—Zn—Oxide TFTs with a Novel Passivation Layer,", SID Digest '09: SID International Symposium Digest of Technical Papers, May 31, 2009, pp. 284-287.

Miyasaka.M, "SUFTLA Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '9: SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YbFe2O4, and Yb2Fe3O7 Types of Structures for Compounds in the IN2O3 and SC2O3—A2O3—Bo Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m>4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2013/084179) dated Feb. 4, 2014.

Written Opinion (Application No. PCT/JP2013/084179) dated Feb. 4, 2014.

Chinese Office Action (Application No. 201380067846.0) dated Apr. 28, 2017.

Taiwanese Office Action (Application No. 102147241) dated Apr. 27, 2017.

\* cited by examiner

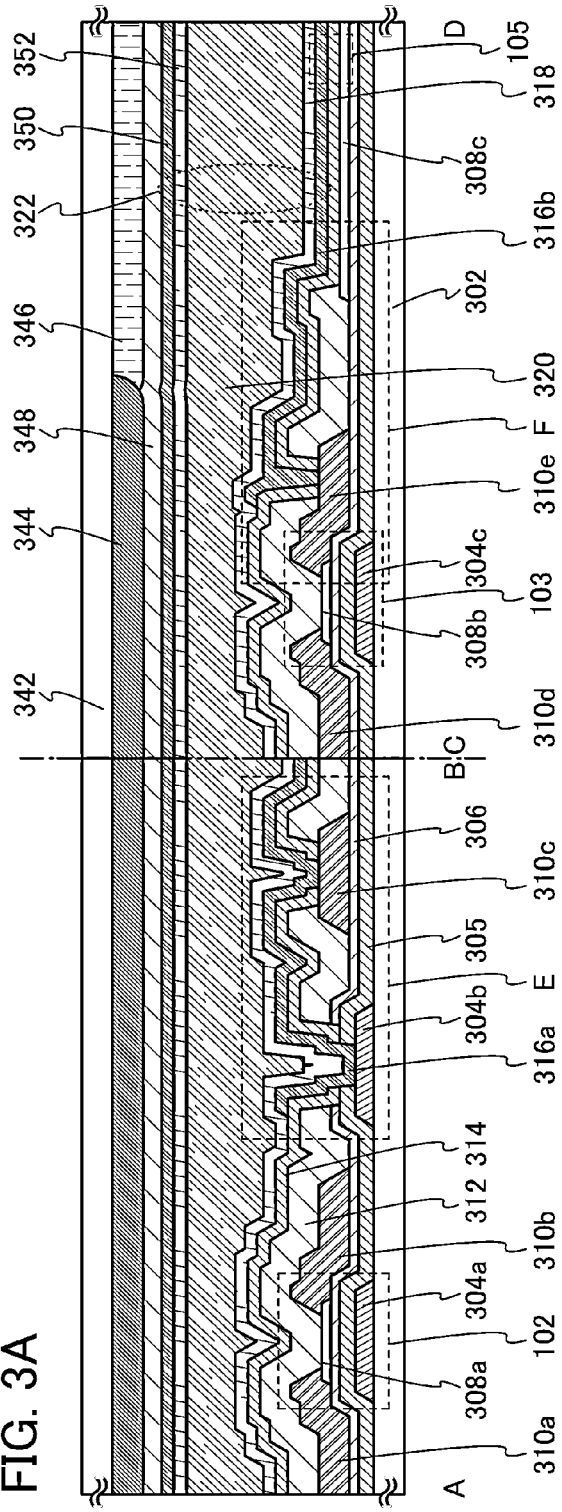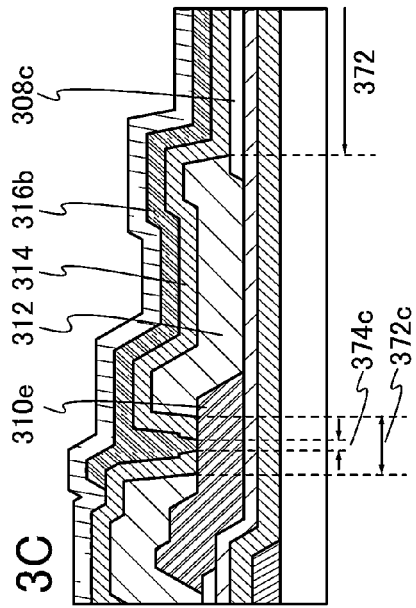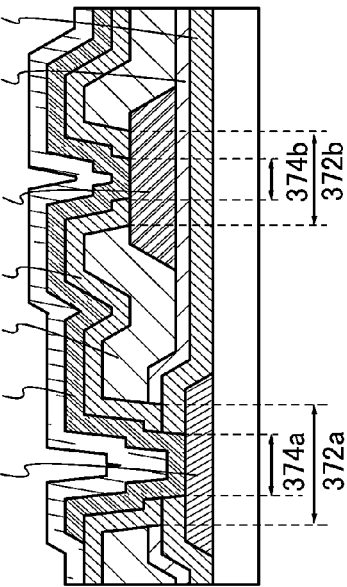

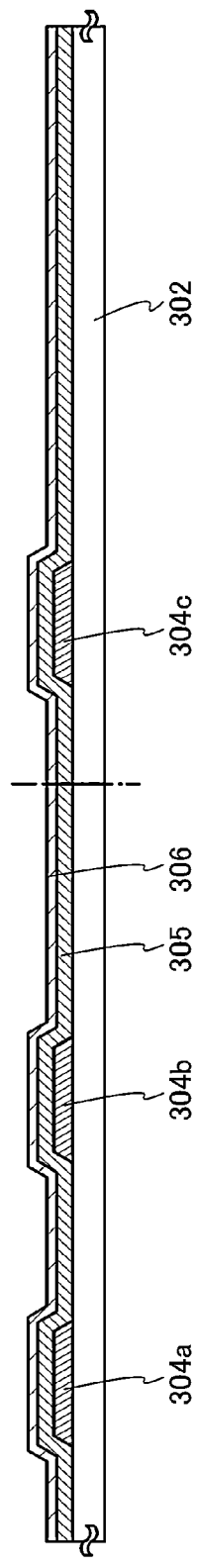
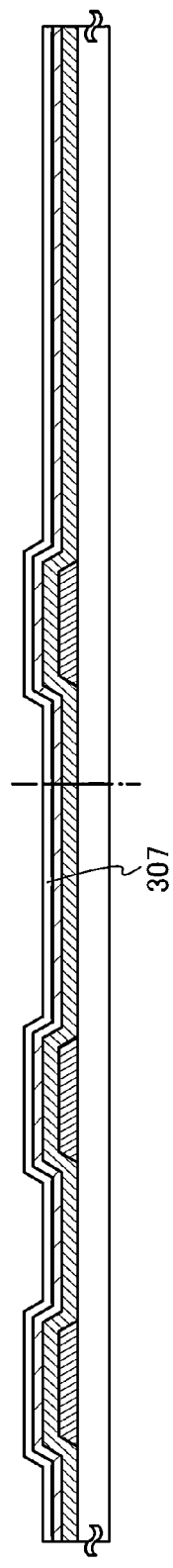
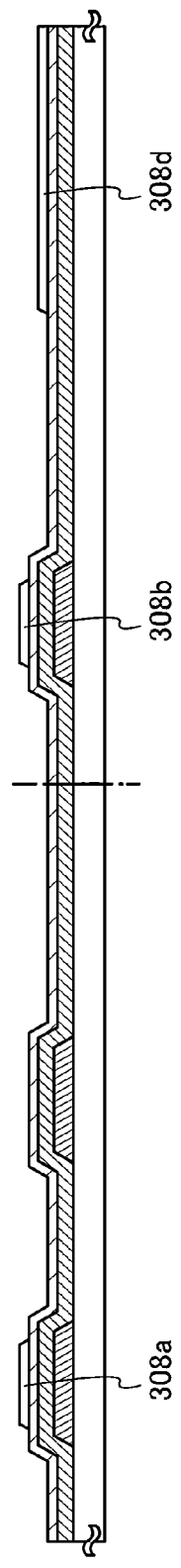

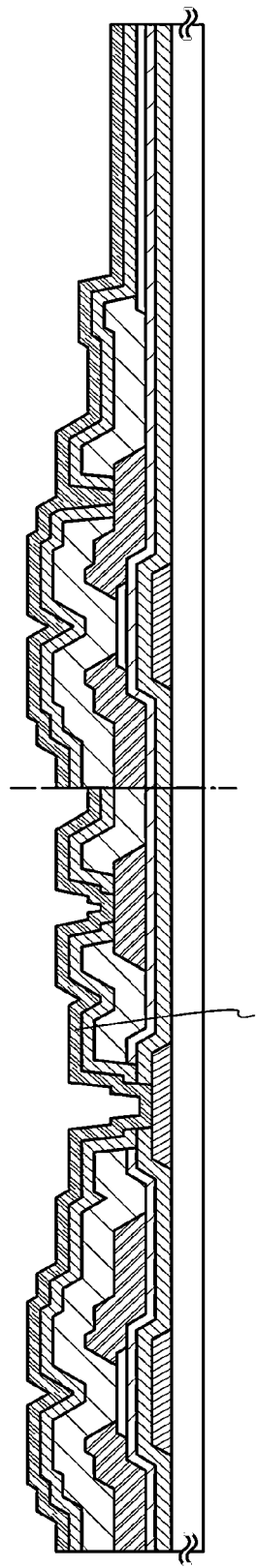
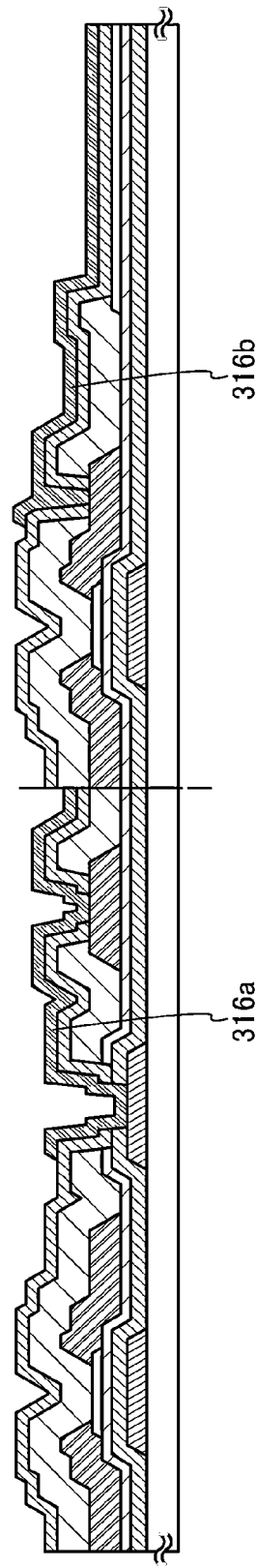
FIG. 7A
FIG. 7B

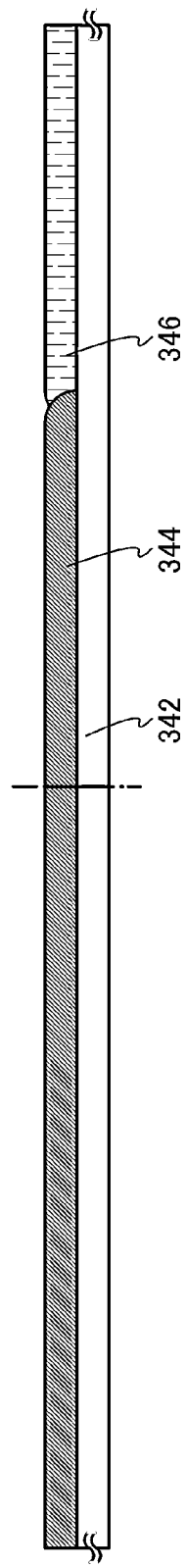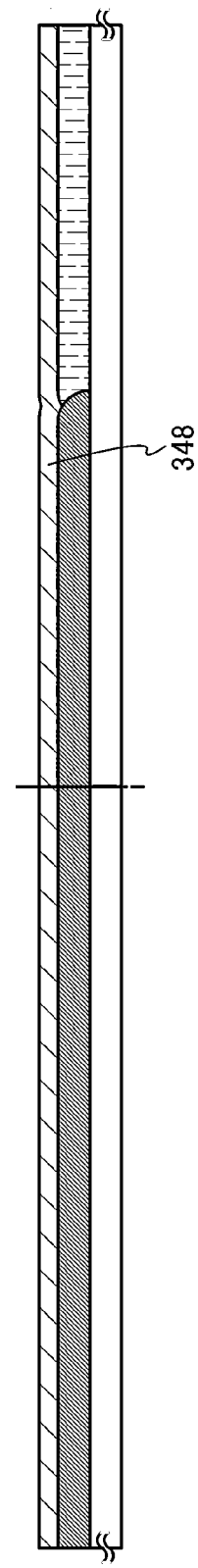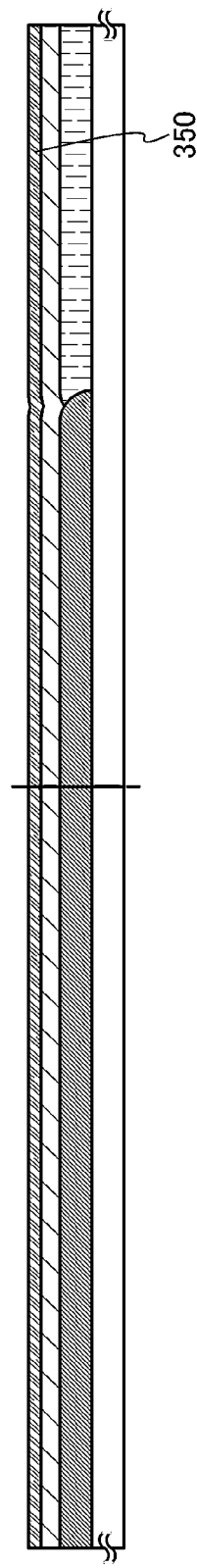

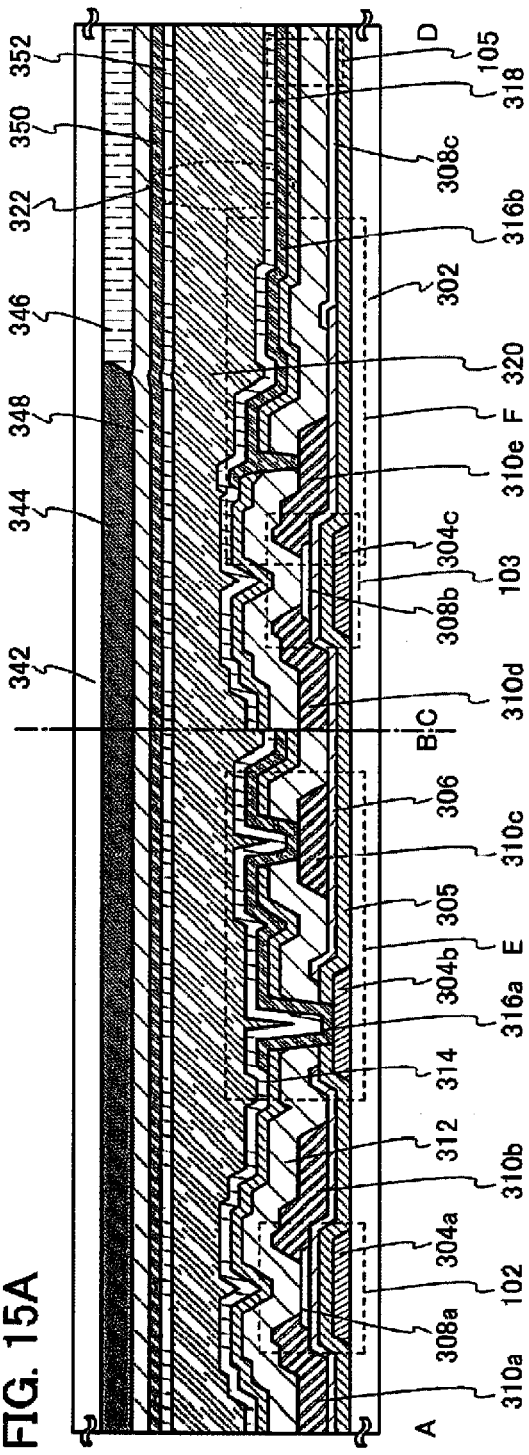
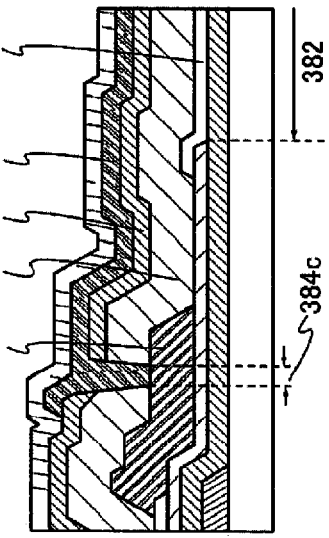
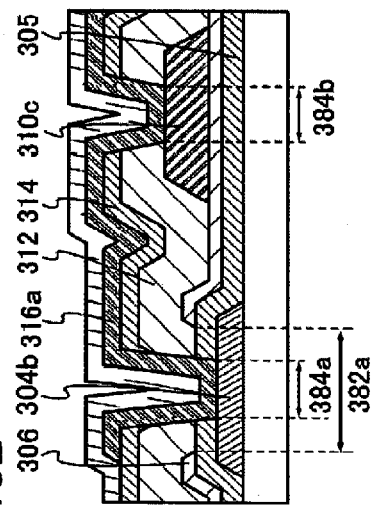

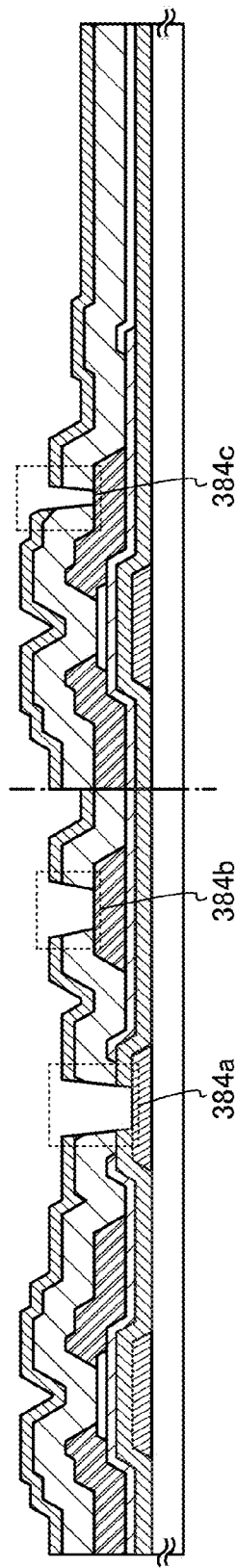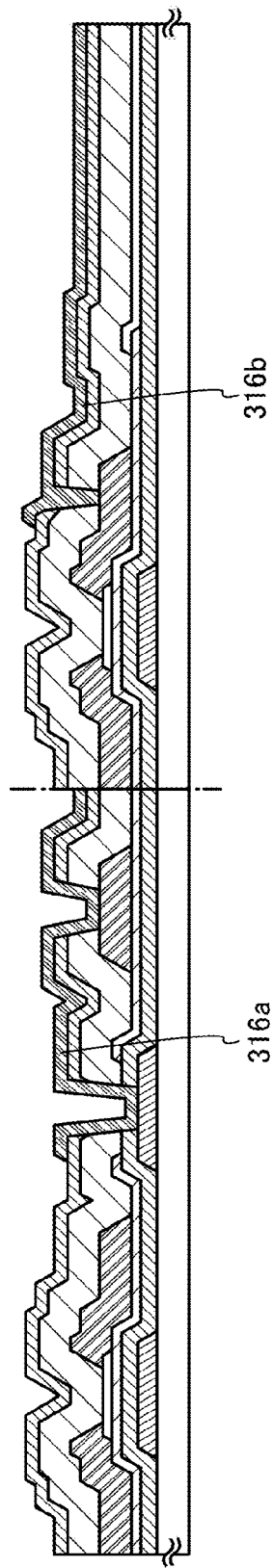

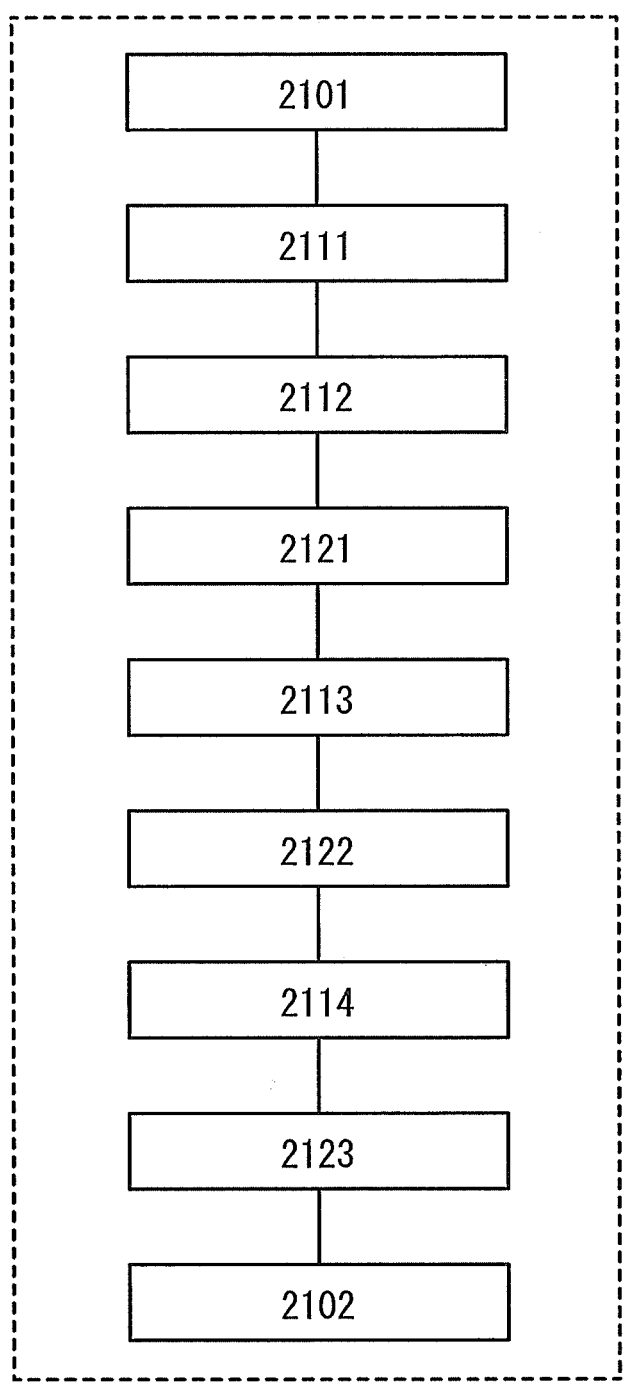

When not touched

Input voltage waveform

Output current waveform

When touched

Input voltage waveform

Output current waveform

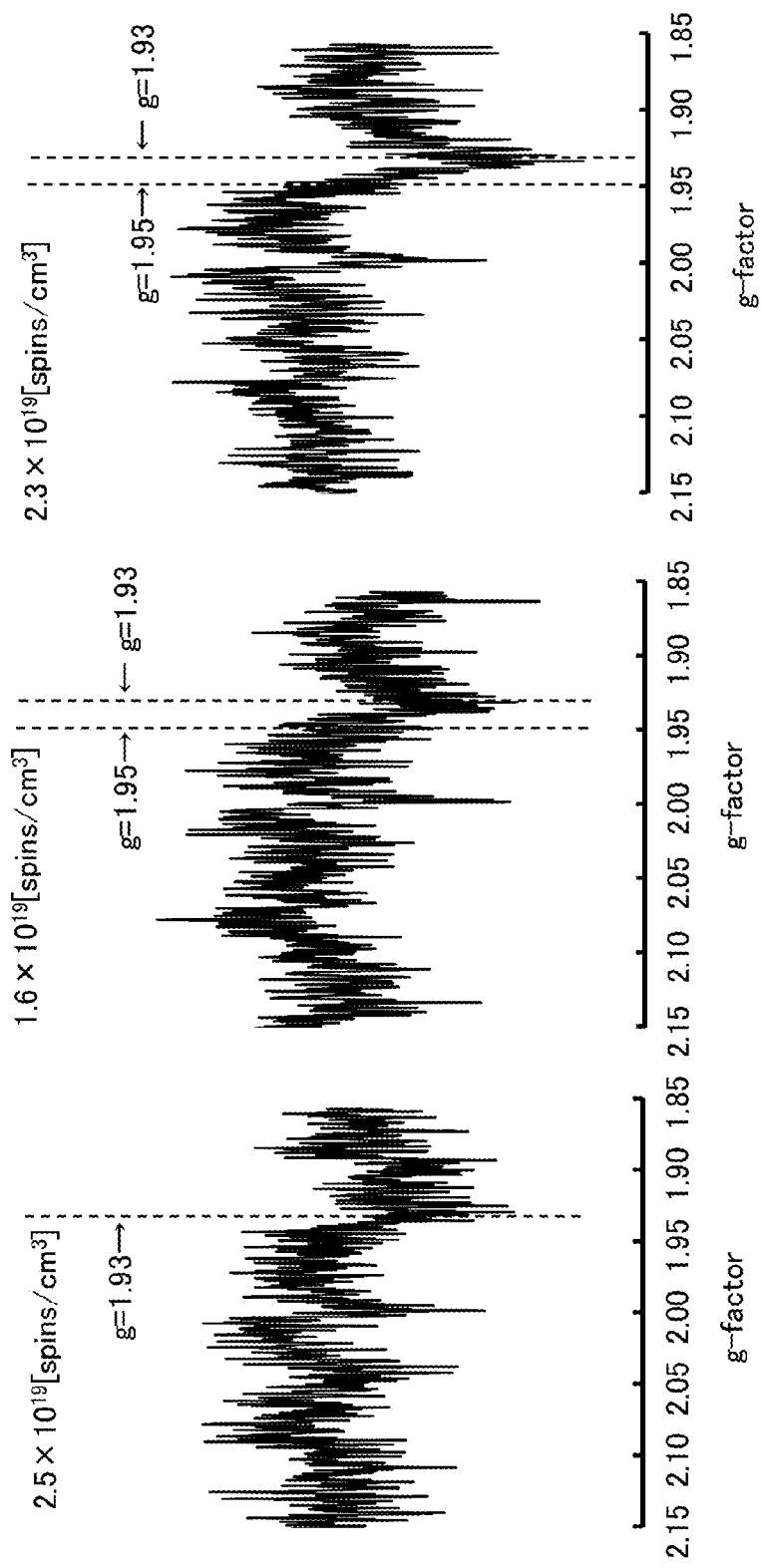

Point 1

Point 2

Point 3

Point 4

SEMICONDUCTOR DEVICE INCLUDING TRANSISTOR AND CAPACITOR

This application is based on Japanese Patent Application serial no. 2012-281874 filed with Japan Patent Office on Dec. 25, 2012, the entire contents of which are hereby incorporated by reference.

TECHNICAL FIELD

The present invention relates to an object, a process (including a method and a manufacturing method), a machine, a manufacture, or a composition of matter. In particular, one embodiment of the present invention relates to a semiconductor device, a display device, a light-emitting device, a driving method thereof, a manufacturing method thereof, or the like. In particular, one embodiment of the present invention relates to a semiconductor device, a display device, a light-emitting device, or the like each including an oxide semiconductor.

In this specification, a semiconductor device includes all of the devices that can function by utilizing electronic characteristics of a semiconductor in its category, and for example, an electrooptic device, a semiconductor circuit, and electronic equipment are all included in semiconductor devices.

BACKGROUND ART

In recent years, flat panel displays such as liquid crystal displays (LCDs) have been widespread. In each of pixels provided in the row direction and the column direction in a display device such as a flat panel display, a transistor serving as a switching element, a liquid crystal element electrically connected to the transistor, and a capacitor connected to the liquid crystal element in parallel are provided.

As a semiconductor material for forming a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, techniques for forming transistors using zinc oxide or an In—Ga—Zn oxide semiconductor are disclosed (see Patent Documents 1 and 2).

A display device which includes a capacitor in which an oxide semiconductor film provided over the same surface as an oxide semiconductor film of a transistor and a pixel electrode connected to the transistor are provided to be separated from each other with a given interval in order to increase the aperture ratio is disclosed (see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] U.S. Pat. No. 8,102,476.

DISCLOSURE OF INVENTION

In a capacitor, a dielectric film is provided between a pair of electrodes at least one of which is formed, in many cases, using a light-blocking conductive film partly serving as a gate electrode, a source electrode, a drain electrode, or the like of a transistor.

As the charge capacity of a capacitor is increased, a period in which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

However, in the case where one electrode of the capacitor is formed using a semiconductor film, the capacitance value charged in the capacitor can be lower than a predetermined value depending on a potential which is applied to the semiconductor film in some cases, so that a period during which alignment of liquid crystal molecules of a liquid crystal element is kept constant is shortened. As a result, the number of times of rewriting image data is increased, so that power consumption is increased.

One of methods for increasing the charge capacity of a capacitor is to increase the area occupied by the capacitor, specifically, to increase the area of a portion where two electrodes of the capacitor overlap with each other. However, when the area of a light-blocking conductive film is increased to increase the area of a portion where a pair of electrodes overlaps with each other, the aperture ratio of a pixel is lowered and thus display quality of an image is degraded.

In view of the above, one object of one embodiment of the present invention is to provide a semiconductor device or the like having a high aperture ratio and including a capacitor capable of increasing capacitance. Another object of one embodiment of the present invention is to provide a semiconductor device or the like which consumes less power. Another object of one embodiment of the present invention is to provide a semiconductor device or the like with high definition. Another object of one embodiment of the present invention is to improve electrical characteristics of a semiconductor device or the like including an oxide semiconductor. Another object of one embodiment of the present invention is to improve reliability of a semiconductor device or the like including an oxide semiconductor. Another object of one embodiment of the present invention is to control oxygen content of an oxide semiconductor. Another object of one embodiment of the present invention is to prevent a transistor from being normally on. Another object of one embodiment of the present invention is to control fluctuation, variation, or decrease in threshold voltage of a transistor. Another object of one embodiment of the present invention is to provide a transistor having low off-state current. Another object of one embodiment of the present invention is to provide a semiconductor device or the like with low off-state current. Another object of one embodiment of the present invention is to provide a semiconductor device or the like with low power consumption. Another object of one embodiment of the present invention is to provide an eye-friendly display device or the like. Another object of one embodiment of the present invention is to provide a semiconductor device or the like including a light-transmitting conductive film. Another object of one embodiment of the present invention is to provide a semiconductor device or the like using a semiconductor film with high reliability. Another object of one embodiment of the present invention is to provide a semiconductor device or the like using a light-transmitting electrode. Another object of one embodiment of the present invention is to provide a novel semiconductor device or the like. Another object of one embodiment of the present invention is to provide a semiconductor device or the like having excellent characteristics.

Note that the descriptions of these objects do not disturb the existence of other objects. Note that in one embodiment of the present invention, there is no need to achieve all the objects. Other objects will be apparent from and can be derived from the description of the specification, the drawings, the claims, and the like.

In one embodiment of the present invention, a transistor including a gate insulating film, an oxide semiconductor film over the gate insulating film, a gate electrode partly overlapping with the oxide semiconductor film with the gate insulating film provided therebetween, and a pair of electrodes in contact with the oxide semiconductor film; a capacitor including a first light-transmitting conductive film over the gate insulating film, a dielectric film over the first light-transmitting conductive film, and a second light-transmitting conductive film over the dielectric film; an oxide insulating film over the pair of electrodes of the transistor; and a nitride insulating film over the oxide insulating film are included. The dielectric film included in the capacitor is the nitride insulating film, the oxide insulating film has a first opening over each of one of the pair of electrodes and the first light-transmitting conductive film, the nitride insulating film has a second opening over the one of the pair of electrodes, and the second opening is on an inner side than the first opening. The second light-transmitting conductive film included in the capacitor is connected to the one of the pair of electrodes included in the transistor in the second opening over the one of the pair of electrodes.

In another embodiment of the present invention, a transistor including a gate insulating film, an oxide semiconductor film over the gate insulating film, a gate electrode partly overlapping with the oxide semiconductor film with the gate insulating film provided therebetween, and a pair of electrodes in contact with the oxide semiconductor film; a capacitor including a first light-transmitting conductive film over the gate insulating film, a dielectric film over the first light-transmitting conductive film, and a second light-transmitting conductive film over the dielectric film; an oxide insulating film over the pair of electrodes of the transistor; and a nitride insulating film over the oxide insulating film are included. The dielectric film included in the capacitor is the nitride insulating film, the second light-transmitting conductive film included in the capacitor is connected to one of the pair of electrodes included in the transistor, and hydrogen concentration of the oxide semiconductor film is different from that of the first light-transmitting conductive film.

Note that the hydrogen concentration of the first light-transmitting conductive film is preferably higher than that of the oxide semiconductor film. In the first light-transmitting conductive film, the hydrogen concentration measured by secondary ion mass spectrometry (SIMS) is greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$. In the oxide semiconductor film, the hydrogen concentration measured by SIMS is less than $5\times10^{19}$ atoms/cm$^3$, preferably less than $5\times10^{18}$ atoms/cm$^3$, more preferably less than or equal to $1\times10^{18}$ atoms/cm$^3$, still more preferably less than or equal to $5\times10^{17}$ atoms/cm$^3$, further preferably less than or equal to $1\times10^{16}$ atoms/cm$^3$.

The first light-transmitting conductive film has lower resistivity than the oxide semiconductor film. The resistivity of the first light-transmitting conductive film is preferably greater than or equal to $1\times10^{-8}$ times and less than or equal to $1\times10^{-1}$ times the resistivity of the oxide semiconductor film. The resistivity of the light-transmitting conductive film is typically greater than or equal to $1\times10^{-3}$ Ωcm and less than $1\times10^4$ Ωcm, preferably greater than or equal to $1\times10^{-3}$ Ωcm and less than $1\times10^{-1}$ Ωcm.

The oxide semiconductor film and the first light-transmitting conductive film each include a microcrystalline region. In the microcrystalline region, circumferentially arranged spots are observed in electron diffraction patterns using electron diffraction with a measurement area greater than or equal to 5 nmϕ and less than or equal to 10 nmϕ and circumferentially arranged spots are not observed in selected-area electron diffraction patterns. Note that the electron diffraction with a measurement area less than or equal to 10 nmϕ, preferably greater than or equal to 5 nmϕ and less than or equal to 10 nmϕ is referred to as nanobeam electron diffraction. A measurement area of the selected-area electron diffraction can be greater than or equal to 300 nmϕ. Further, the grain size of a crystal grain contained in the microcrystalline region is less than or equal to 10 nm. It is preferable that circumferentially arranged spots be observed in a whole region in the thickness direction of the oxide semiconductor film.

Further, the oxide semiconductor film and the first light-transmitting conductive film each include indium or zinc.

According to one embodiment of the present invention, a semiconductor device including a capacitor whose charge capacity is increased while improving the aperture ratio can be provided. Further, a semiconductor device with low power consumption can be provided.

BRIEF DESCRIPTION OF DRAWINGS

In the accompanying drawings:

FIGS. 3A to 3C are cross-sectional views illustrating one embodiment of a semiconductor device;

FIGS. 4A to 4C are cross-sectional views illustrating one embodiment of a method for manufacturing a semiconductor device;

FIGS. 7A and 7B are cross-sectional views illustrating one embodiment of a method for manufacturing a semiconductor device;

FIGS. 8A to 8C are cross-sectional views illustrating one embodiment of a method for manufacturing a semiconductor device;

FIGS. 15A to 15C are cross-sectional views illustrating one embodiment of a semiconductor device;

FIGS. 17A and 17B are cross-sectional views illustrating one embodiment of a method for manufacturing a semiconductor device;

FIG. 22 illustrates a deposition apparatus;

FIGS. 36A to 36C each show a result of ESR measurement;

BEST MODE FOR CARRYING OUT THE INVENTION

Figure 1A:
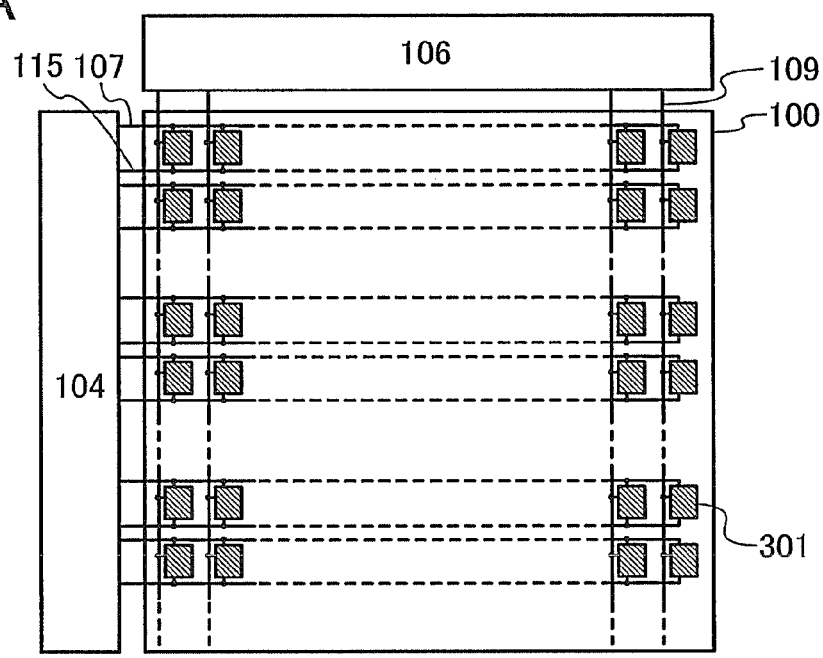
FIGS. 1A and 1B are a block diagram and a circuit diagram illustrating one embodiment of a semiconductor device.

Embodiments of the present invention will be described in detail below with reference to the accompanying drawings. However, the present invention is not limited to the description below, and it is easily understood by those skilled in the art that modes and details disclosed herein can be modified in various ways. In addition, the present invention is not construed as being limited to description of the embodiments.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales.

Note that ordinal numbers such as "first" and "second" in this specification and the like are used for convenience and do not denote the order of steps or the stacking order of layers. In addition, the ordinal numbers in this specification and the like do not denote particular names which specify the invention.

Functions of a "source" and a "drain" in one embodiment of the present invention are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used in many cases as synonymous words. Thus, in this specification, a potential may be rephrased as a voltage and a voltage may be rephrased as a potential unless otherwise specified.

In this specification, a mask is formed by a photolithography process, and after an etching step is performed, the mask is removed.

Embodiment 1

In this embodiment, a semiconductor device of one embodiment of the present invention is described with reference to drawings. Note that in this embodiment, a semiconductor device of one embodiment of the present invention is described taking a liquid crystal display device as an example.

<Structure of Semiconductor Device>

FIG. 1A illustrates an example of a semiconductor device. The semiconductor device in FIG. 1A includes a pixel portion 100, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 100 includes a plurality of pixels 301 arranged in a matrix. Furthermore, capacitor lines 115 arranged in parallel or substantially in parallel are provided along the scan lines 107. Note that the capacitor lines 115 may be arranged in parallel or substantially in parallel along the signal lines 109. The scan line driver circuit 104 and the signal line driver circuit 106 are collectively referred to as a driver circuit portion in some cases.

Each scan line 107 is electrically connected to the n pixels 301 in the corresponding row among the pixels 301 arranged in m rows and n columns in the pixel portion 100. Each signal line 109 is electrically connected to the m pixels 301 in the corresponding column among the pixels 301 arranged in m rows and n columns. Note that m and n are each an integer of 1 or more. Each capacitor line 115 is electrically connected to the n pixels 301 in the corresponding row among the pixels 301 arranged in m rows and n columns. Note that in the case where the capacitor lines 115 are arranged in parallel or substantially in parallel along the signal lines 109, each capacitor line 115 is electrically connected to the m pixels 301 in the corresponding column among the pixels 301 arranged in m rows and n columns.

Figure 1B:
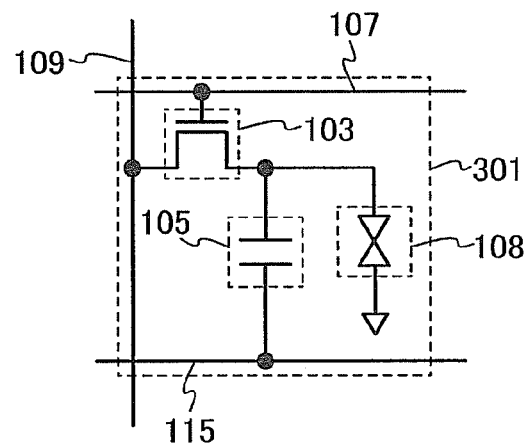

FIG. 1B is an example of a circuit diagram of the pixel 301 included in the semiconductor device illustrated in FIG. 1A. The pixel 301 in FIG. 1B includes a transistor 103 which is electrically connected to the scan line 107 and the signal line 109, a capacitor 105 one electrode of which is electrically connected to a drain electrode of the transistor 103 and the other electrode of which is electrically connected to the capacitor line 115 which supplies a constant potential, and a liquid crystal element 108. A pixel electrode of the liquid crystal element 108 is electrically connected to the drain electrode of the transistor 103 and the one electrode of the capacitor 105, and an electrode (counter electrode) facing the pixel electrode is electrically connected to a wiring which supplies a common potential.

The liquid crystal element 108 is an element which controls transmission or non-transmission of light by an optical modulation action of liquid crystal which is sandwiched between a substrate provided with the transistor 103 and the pixel electrode and a substrate provided with the counter electrode. The optical modulation action of liquid crystal is controlled by an electric field applied to the liquid crystal (including a vertical electric field and a diagonal electric field). Note that in the case where a counter electrode (also referred to as a common electrode) is provided over the substrate where the pixel electrode is provided, an electric field applied to liquid crystal is a transverse electric field.

Note that the liquid crystal element 108 can be used not only as a liquid crystal element but also as various elements such as a display element and a light-emitting element. Examples of a display element, a light-emitting element, and the like include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on the amount of current), an electron emitter, a liquid crystal element, electronic ink, an electrophoretic element, a grating light valve (GLV), a plasma display panel (PDP), a digital micromirror device (DMD), an interference modulation (IMOD) element, a piezoelectric ceramic display, or a carbon nanotube. Examples of a display device including an EL element include an EL display and the like. Examples of a display device including an electron emitter include a field emission display (FED), an SED-type flat panel display (SED: surface-conduction electron-emitter display), and the like. Examples of a display device including a liquid crystal element include liquid crystal displays (e.g., a transmissive liquid crystal display, a transflective liquid crystal display, a reflective liquid crystal display, a direct-view liquid crystal display, a projection liquid crystal display), and the like. Examples of a display device including electronic ink or an electrophoretic element include electronic paper, and the like.

Figure 2A:
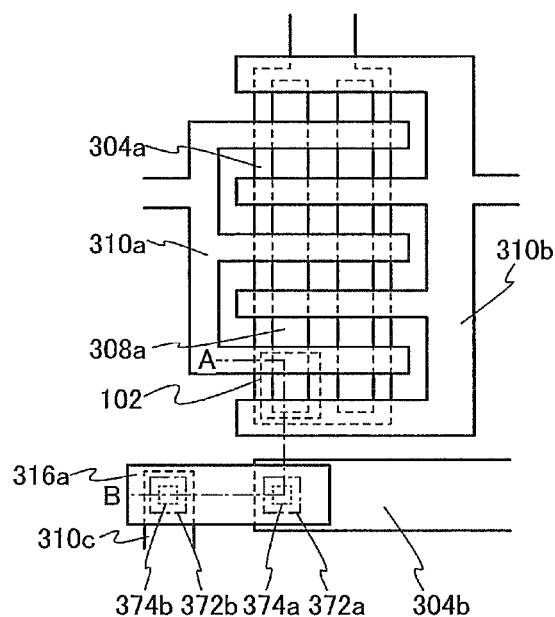
FIGS. 2A and 2B are top views illustrating one embodiment of a semiconductor device.
Figure 2B:
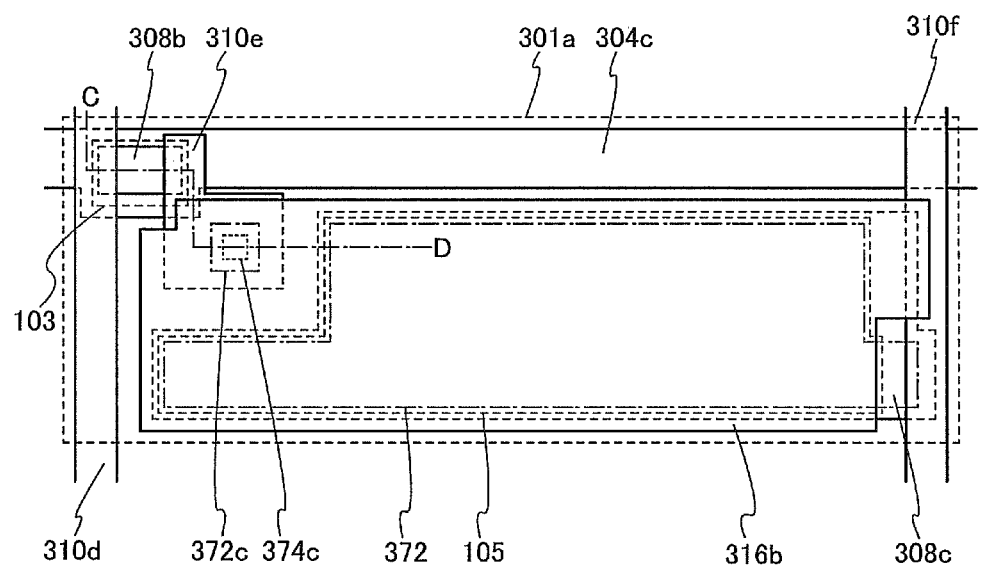

Next, a specific example of the pixel 301 of the liquid crystal display device is described. FIG. 2A is a top view of part of the driver circuit portion, here, the scan line driver circuit 104, and FIG. 2B is a top view of the pixel 301a. Note that in FIG. 2B, the counter electrode and the liquid crystal element are not illustrated.

In FIG. 2A, a transistor 102 includes a conductive film 304a serving as a gate, a gate insulating film (not illustrated in FIG. 2A), an oxide semiconductor film 308a where a channel region is formed, and conductive films 310a and 310b serving as a source and a drain. The oxide semiconductor film 308a is formed over the gate insulating film. In addition, a conductive film 304b formed at the same time as the conductive film 304a, a conductive film 310c formed at the same time as the conductive films 310a and 310b, a light-transmitting conductive film 316a that connects the conductive film 304b to the conductive film 310c are provided. The light-transmitting conductive film 316a is connected to the conductive film 304b in openings 372a and 374a and is connected to the conductive film 310c in openings 372b and 374b.

In FIG. 2B, a conductive film 304c serving as a scan line extends substantially perpendicularly to the signal line (in the horizontal direction in the drawing). A conductive film 310d serving as a signal line extends substantially perpendicularly to the scan line (in the vertical direction in the drawing). A conductive film 310f serving as a capacitor line extends in parallel to the signal line. Note that the conductive film 304c serving as a scan line is electrically connected to the scan line driver circuit 104 (see FIG. 1A), and the conductive film 310d serving as a signal line and the conductive film 310f serving as a capacitor line are electrically connected to the signal line driver circuit 106 (see FIG. 1A).

The transistor 103 is provided at a region where the scan line and the signal line cross each other. The transistor 103 includes the conductive film 304c serving as a gate; the gate insulating film (not illustrated in FIG. 2B); an oxide semiconductor film 308b where a channel region is formed, over the gate insulating film; and the conductive films 310d and 310e serving as a source and a drain. The conductive film 304c also serves as a scan line, and a region of the conductive film 304c that overlaps with the oxide semiconductor film 308b serves as the gate of the transistor 103. In addition, the conductive film 310d also serves as a signal line, and a region of the conductive film 310d that overlaps with the oxide semiconductor film 308b serves as the source or drain of the transistor 103. Further, in the top view of FIG. 2B, an end portion of the scan line is located on the outer side than an end portion of the oxide semiconductor film 308b. Thus, the scan line functions as a light-blocking film for blocking light from a light source such as a backlight. For this reason, the oxide semiconductor film 308b included in the transistor is not irradiated with light, so that a variation in the electrical characteristics of the transistor can be suppressed.

The conductive film 310e is electrically connected to the light-transmitting conductive film 316b that serves as a pixel electrode, through the opening 374c which is provided on an inner side than the opening 372c.

The capacitor 105 is connected to the conductive film 310f serving as a capacitor line through the opening 372. The capacitor 105 includes the light-transmitting conductive film 308c formed over the gate insulating film, a dielectric film formed of a nitride insulating film formed over the transistor 103, and a light-transmitting conductive film 316b that serves as a pixel electrode. That is, the capacitor 105 has a light-transmitting property.

Thanks to the light-transmitting property of the capacitor 105, the capacitor 105 can be formed large (covers a large area) in the pixel 301a. Thus, a semiconductor device having charge capacity increased while improving the aperture ratio, to typically 50% or more, preferably 55% or more, more preferably 60% or more can be obtained. For example, in a semiconductor device with a high resolution such as a liquid crystal display device, the area of a pixel is small and thus the area of a capacitor is also small. For this reason, the charge capacity of the capacitor is small. However, since the capacitor 105 of this embodiment has a light-transmitting property, when it is provided in a pixel, enough charge capacity can be obtained in the pixel and the aperture ratio can be improved. Typically, the capacitor 105 can be favorably used in a high-resolution semiconductor device with a pixel density of 200 ppi or more, or furthermore, 300 ppi or more.

In addition, the pixel 301a in FIG. 2B has a shape in which a side parallel to the conductive film 310d serving as a signal line is shorter than a side parallel to the conductive film 304c serving as a scan line, and the conductive film 310f serving as a capacitor line extends in parallel to the conductive film 310d serving as a signal line. As a result, the area where the conductive film 310f occupies the pixel 301a can be decreased, thereby increasing the aperture ratio. In addition, the conductive film 310f serving as a capacitor line does not use a connection electrode, and is in a direct contact with the light-transmitting conductive film 308c and thus the aperture ratio can be further increased.

Further, according to one embodiment of the present invention, the aperture ratio can be improved even in a display device with a high resolution, which makes it possible to use light from a light source such as a backlight efficiently, so that power consumption of the display device can be reduced.

Next, FIG. 3A is a cross-sectional view taken along dashed-dotted lines A-B and C-D in FIGS. 2A and 2B. Further, FIG. 3B is an enlarged view of a portion surrounded by a dashed line E in FIG. 3A, and FIG. 3C is an enlarged view of a portion surrounded by a dashed line F in FIG. 3A.

In the liquid crystal display device described in this embodiment, a liquid crystal element 322 is provided between a pair of substrates (a substrate 302 and a substrate 342).

The liquid crystal element 322 includes the light-transmitting conductive film 316b over the substrate 302, films controlling alignment (hereinafter referred to as alignment films 318 and 352), a liquid crystal layer 320, and a conductive film 350. Note that the light-transmitting conductive film 316b functions as one electrode of the liquid crystal element 322, and the conductive film 350 functions as the other electrode of the liquid crystal element 322.

As a driving method of the liquid crystal display device including the liquid crystal element, any of the following modes can be used, for example: a TN mode, an STN mode, a VA mode, an ASM (axially symmetric aligned micro-cell) mode, an OCB (optically compensated birefringence) mode, an FLC (ferroelectric liquid crystal) mode, an AFLC (anti-ferroelectric liquid crystal) mode, an MVA (multi-domain vertical alignment) mode, a PVA (patterned vertical alignment) mode, an IPS mode, an FFS mode, a TBA (transverse bend alignment) mode, and the like. Other examples of the driving method of the liquid crystal display device including the liquid crystal element include an ECB (electrically controlled birefringence) mode, a PDLC (polymer dispersed liquid crystal) mode, a PNLC (polymer network liquid crystal) mode, and a guest-host mode. Note that the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In this embodiment, a liquid crystal display device of a vertical electric field mode is described.

Thus, a "liquid crystal display device" refers to a device including a liquid crystal element. Note that the liquid crystal display device includes a driver circuit for driving a plurality of pixels and the like. The liquid crystal display device may also be referred to as a liquid crystal module including a control circuit, a power supply circuit, a signal generation circuit, a backlight module, and the like provided over another substrate.

In the driver circuit portion, the transistor 102 includes the conductive film 304a functioning as a gate, insulating films 305 and 306 collectively functioning as a gate insulating film, the oxide semiconductor film 308a in which a channel region is formed, and the conductive films 310a and 310b each functioning as a source or a drain. The oxide semiconductor film 308a is provided over the insulating film 306. Further, insulating films 312 and 314 are provided as protective films over the conductive films 310a and 310b.

In the pixel portion, the transistor 103 includes the conductive film 304c functioning as a gate, the insulating films 305 and 306 collectively functioning as a gate insulating film, the oxide semiconductor film 308b in which a channel region is formed, and the conductive films 310d and 310e each functioning as a source or a drain. The oxide semiconductor film 308b is provided over the insulating film 306. Further, insulating films 312 and 314 are provided as protective films over the conductive films 310d and 310e.

The light-transmitting conductive film 316b functioning as a pixel electrode is connected to the conductive film 310e through an opening provided in the insulating films 312 and 314.

Further, the capacitor 105 includes the light-transmitting conductive film 308c functioning as one electrode of the capacitor 105, the insulating film 314 functioning as a dielectric film, and the light-transmitting conductive film 316b functioning as the other electrode of the capacitor 105. The light-transmitting conductive film 308c is provided over the insulating film 306.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 316a formed at the same time as the light-transmitting conductive film 316b.

As illustrated in FIG. 3B, the opening 372a formed in the insulating films 306 and 312, and the opening 374a formed in the insulating films 305 and 314 are provided over the conductive film 304b. The opening 374a is positioned on an inner side than the opening 372a. Through the opening 374a, the conductive film 304b is connected to the light-transmitting conductive film 316a.

Further, the opening 372b formed in the insulating film 312 and the opening 374b formed in the insulating film 314 are provided over the conductive film 310c. The opening 374b is positioned on an inner side than the opening 372b. Through the opening 374b, the conductive film 310c is connected to the light-transmitting conductive film 316a.

As illustrated in FIG. 3C, the opening 372c formed in the insulating film 312 and the opening 374c formed in the insulating film 314 are provided over the conductive film 310e. The opening 374c is positioned on an inner side than the opening 372c. Through the opening 374c, the conductive film 310e is connected to the light-transmitting conductive film 316b.

Further, the opening 372 formed in the insulating film 312 is provided over the light-transmitting conductive film 308c. In the opening 372, the light-transmitting conductive film 308c is in contact with the insulating film 314.

In this embodiment, the insulating films 305 and 314 are preferably formed using a material which prevents diffusion of impurities from the outside, such as water, an alkali metal, and an alkaline earth metal, into the oxide semiconductor film, more preferably formed using the material including hydrogen, and typically an inorganic insulating material containing nitrogen, such as a nitride insulating film, can be used. The insulating films 305 and 314 are formed using, for example, silicon nitride, silicon nitride oxide, aluminum nitride, aluminum nitride oxide, or the like.

For the insulating films 306 and 312, a material which can improve characteristics of the interface with the oxide semiconductor film is preferably used. Typically, an inorganic insulating material containing oxygen, such as an oxide insulating film, for example, silicon oxide, silicon oxynitride, aluminum oxide, aluminum oxynitride, or the like can be used.

A connection portion between the conductive film 304b and the light-transmitting conductive film 316a, a connection portion between the conductive film 310c and the light-transmitting conductive film 316a, and a connection portion between the conductive film 310e and the light-transmitting conductive film 316b are each surrounded by the insulating film 305 and/or the insulating film 314. The insulating films 305 and 314 are formed using a material which prevents diffusion of impurities from the outside, such as water, an alkali metal, and an alkaline earth metal, into the oxide semiconductor film. Further, the side surfaces of the openings 372a, 372b, 372c, and 372 are each covered with the insulating film 305 and/or the insulating film 314. The oxide semiconductor films are provided on an inner side than the insulating films 305 and 314. Thus, it is possible to prevent diffusion of impurities from the outside, such as water, an alkali metal, and an alkaline earth metal, through the connection portions between the conductive film 304b and the light-transmitting conductive film 316a, between the conductive film 310c and the light-transmitting conductive film 316a, and between the conductive film 310e and the light-transmitting conductive film 316b into the oxide semiconductor films included in the transistors. As a result, fluctuation in the electrical characteristics of the transistors can be prevented and reliability of the semiconductor device can be improved.

The light-transmitting conductive film 308c is an oxide semiconductor film formed at the same time as the oxide semiconductor films 308a and 308b. The oxide semiconductor films 308a and 308b are in contact with the films each formed using a material which can improve characteristics of the interface with the oxide semiconductor film, such as the insulating film 306 and the insulating film 312. Thus, the oxide semiconductor films 308a and 308b function as semiconductors, so that the transistors including the oxide semiconductor films 308a and 308b have excellent electrical characteristics.

Note that one embodiment of the present invention is not limited thereto, and the light-transmitting conductive film 308c may be formed by a different process from that of the oxide semiconductor film 308a or the oxide semiconductor film 308b depending on circumstances or conditions. In that case, the light-transmitting conductive film 308c may include a different material from that of the oxide semiconductor film 308a or the oxide semiconductor film 308b. For example, the light-transmitting conductive film 308c may include indium tin oxide (hereinafter referred to as ITO), indium zinc oxide, or the like.

The light-transmitting conductive film 308c is in contact with the insulating film 314 in the opening 372. The insulating film 314 is formed using a material which prevents diffusion of impurities from the outside, such as water, an alkali metal, and an alkaline earth metal, into the oxide semiconductor film, and the material further includes hydrogen. Thus, when hydrogen in the insulating film 314 is diffused into the oxide semiconductor film formed at the same time as the oxide semiconductor films 308a and 308b, hydrogen is bonded to oxygen and electrons serving as carriers are generated in the oxide semiconductor film. As a result, the oxide semiconductor film has higher conductivity and functions as a conductor; in other words, the oxide semiconductor film can be an oxide semiconductor film with high conductivity. Here, a metal oxide which contains a material similar to those of the oxide semiconductor films 308a and 308b as a main component and has higher conductivity because hydrogen concentration of the metal oxide is higher than those of the oxide semiconductor films 308a and 308b is referred to as the "light-transmitting conductive film 308c".

Note that one embodiment of the present invention is not limited thereto, and it is possible that the light-transmitting conductive film 308c be not in contact with the insulating film 314 depending on circumstances or conditions.

In the semiconductor device illustrated in this embodiment, one electrode of the capacitor is formed at the same time as the oxide semiconductor film of the transistor. In addition, the light-transmitting conductive film that serves as a pixel electrode is used as the other electrode of the capacitor. Thus, a step of forming another conductive film is not needed to form the capacitor, and the number of steps of manufacturing the semiconductor device can be reduced.

Further, since the capacitor has a pair of electrodes formed with the light-transmitting conductive film, it can have a light-transmitting property. As a result, the area occupied by the capacitor can be increased while the aperture ratio in a pixel is increased.

Here, the characteristics of a transistor including an oxide semiconductor are described. The transistor including an oxide semiconductor is an n-channel transistor. Further, carriers might be generated due to oxygen vacancies in the oxide semiconductor, which might degrade the electrical characteristics and reliability of the transistor. For example, in some cases, the threshold voltage of the transistor is shifted in the negative direction, and drain current flows when the gate voltage is 0 V. A transistor in which drain current flows when the gate voltage is 0 V is referred to as a normally-on transistor, and a transistor having such characteristics is referred to as a depletion-type transistor. The characteristics of a transistor in which substantially no drain current flows when the gate voltage is 0 V are referred to as normally-off characteristics, and a transistor having such characteristics is referred to as an enhancement-type transistor.

In view of the above, it is preferable that defects, typically oxygen vacancies, in the oxide semiconductor film 308b of a transistor, in which a channel region is formed, be reduced as much as possible. For example, it is preferable that the spin density of the oxide semiconductor film (the density of defects in the oxide semiconductor film) at a g-value of 1.93 in electron spin resonance spectroscopy in which a magnetic field is applied in parallel with the film surface be reduced to lower than or equal to the lower detection limit of measurement equipment. When the defects typified by oxygen vacancies in the oxide semiconductor film are reduced as much as possible, the transistor 103 can be prevented from being normally on, leading to improvements in the electrical characteristics and reliability of a semiconductor device. Further, power consumption of the semiconductor device can be reduced.

The shift of the threshold voltage of a transistor in the negative direction is caused by hydrogen (including a hydrogen compound such as water) contained in an oxide semiconductor in some cases as well as by oxygen vacancies. Hydrogen contained in the oxide semiconductor is reacted with oxygen bonded to a metal atom to be water, and in addition, vacancies (also referred to as oxygen vacancies) are formed in a lattice from which oxygen is released (or a portion from which oxygen is removed). In addition, the reaction of part of hydrogen and oxygen causes generation of electrons serving as carriers. Thus, a transistor including an oxide semiconductor which contains hydrogen is likely to have normally-on characteristics.

In view of the above, it is preferable that hydrogen in the oxide semiconductor film 308b of the transistor 103, in which a channel region is formed, be reduced as much as possible. Specifically, the concentration of hydrogen in the oxide semiconductor film 308b, which is measured by secondary ion mass spectrometry, is set to lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$.

The concentration of alkali metals or alkaline earth metals in the oxide semiconductor film 308b of the transistor 103, in which a channel region is formed, which is measured by secondary ion mass spectrometry, is set to lower than or equal to $1 \times 10^{18}$ atoms/cm$^3$, preferably lower than or equal to $2 \times 10^{16}$ atoms/cm$^3$. This is because an alkali metal and an alkaline earth metal might generate carriers when bonded to an oxide semiconductor, in which case the off-state current of the transistor 103 might be increased.

When the oxide semiconductor film of the transistor 103, in which a channel region is formed, is highly purified in this manner by reducing impurities (such as hydrogen, nitrogen, an alkali metal, and an alkaline earth metal) as much as possible, the transistor 103 becomes an enhancement-type transistor and can be prevented from having normally-on characteristics, so that the off-state current of the transistor 103 can be significantly reduced. Therefore, a semiconductor device having favorable electrical characteristics can be fabricated. Further, a highly reliable semiconductor device can be fabricated.

Various experiments can prove the low off-state current of a transistor including a highly-purified oxide semiconductor film. For example, even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. In this case, it can be seen that a value obtained by dividing the off-state current by the channel width of the transistor is 100 zA/μm or lower. Further, the off-state current was measured with the use of a circuit in which a capacitor and a transistor are connected to each other and charge that flows in or out from the capacitor is controlled by the transistor. In the measurement, a purified oxide semiconductor film is used for a channel formation region of the transistor, and the off-state current of the transistor is measured from a change in the amount of charge of the capacitor per unit time. As a result, in the case where the voltage between a source electrode and a drain electrode of the transistor is 3 V, a lower off-state current of several tens of yoctoamperes per micrometer (yA/μm) can be achieved. Thus, the transistor including the highly purified oxide semiconductor film has a significantly low off-state current.

Here, other components of the liquid crystal display device illustrated in FIGS. 3A to 3C are described below.

The conductive films 304a, 304b, and 304c are formed over the substrate 302. The conductive film 304a is formed in the scan line driver circuit 104 and functions as a gate of the transistor in the driver circuit portion. The conductive film 304c is formed in the pixel portion 100 and functions as a gate of the transistor in the pixel portion. The conductive film 304b is formed in the scan line driver circuit 104 and connected to the conductive film 310c.

For the substrate 302, a glass material such as aluminosilicate glass, aluminoborosilicate glass, or barium borosilicate glass is used. In the mass production, for the substrate 302, a mother glass with any of the following sizes is preferably used: the eighth generation (2160 mm×2460 mm), the ninth generation (2400 mm×2800 mm, or 2450 mm×3050 mm), the tenth generation (2950 mm×3400 mm), and the like. High process temperature and a long period of process time drastically might shrink such mother glass. Thus, in the case where mass production is performed with the use of the mother glass, the heating temperature in the manufacturing process is preferably lower than or equal to 600° C., more preferably lower than or equal to 450° C., still more preferably lower than or equal to 350° C.

For the conductive films 304a, 304b, and 304c, a metal element selected from aluminum, chromium, copper, tantalum, titanium, molybdenum, and tungsten, an alloy containing any of these metal elements as a component, an alloy containing these metal elements in combination, or the like can be used. The conductive films 304a, 304b, and 304c may have a single-layer structure or a layered structure including two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The insulating films 305 and 306 are formed over the substrate 302 and the conductive films 304a, 304b, and 304c. The insulating films 305 and 306 function as a gate insulating film of the transistor in the scan line driver circuit 104 and a gate insulating film of the transistor in the pixel portion 100.

The insulating film 305 is preferably formed using a nitride insulating film, for example, is formed to have a single-layer structure or a layered structure using any of a silicon nitride film, a silicon nitride oxide film, an aluminum nitride film, an aluminum nitride oxide film, and the like. In the case where the insulating film 305 has a layered structure, it is preferable that a silicon nitride film with fewer defects be provided as a first silicon nitride film, and a silicon nitride film from which hydrogen is less likely to be released be provided over the first silicon nitride film, as a second silicon nitride film. As a result, transfer or diffusion of hydrogen and nitrogen contained in the insulating film 305 to the oxide semiconductor films 308a and 308b can be inhibited.

Note that silicon oxynitride refers to an insulating material that contains more oxygen than nitrogen. Further, silicon nitride oxide refers to an insulating material that contains more nitrogen than oxygen.

The insulating film 306 is preferably formed using an oxide insulating film, for example, is formed to have a single-layer structure or a layered structure using any of a silicon oxide film, a silicon oxynitride film, an aluminum oxide film, an aluminum oxynitride film, and the like.

The insulating film 306 may be formed using a high-k material such as hafnium silicate (HfSiO$_x$), hafnium silicate containing nitrogen (HfSi$_x$O$_y$N$_z$), hafnium aluminate containing nitrogen (HfAl$_x$O$_y$N$_z$), hafnium oxide, or yttrium oxide, so that gate leakage current of the transistor 103 can be reduced.

A silicon nitride film has a higher dielectric constant than a silicon oxide film and needs a larger thickness for equivalent capacitance. Thus, the physical thickness of the gate insulating film can be increased. Thus, the electrostatic breakdown of a transistor can be prevented by inhibiting a reduction in the withstand voltage of the transistor and improving the withstand voltage of the transistor.

The oxide semiconductor films 308a and 308b and the light-transmitting conductive film 308c are formed over the insulating film 306. The oxide semiconductor film 308a is formed in a position overlapping with the conductive film 304a and functions as a channel region of the transistor in the driver circuit portion. The oxide semiconductor film 308b is formed in a position overlapping with the conductive film 304c and functions as a channel region of the transistor in the pixel portion. The light-transmitting conductive film 308c functions as one electrode of the capacitor 105.

The oxide semiconductor films 308a and 308b are each an oxide semiconductor film containing In or Ga and typically includes an In—Ga oxide, an In—Zn oxide, and an In-M-Zn oxide (M is any of Al, Ti, Ga, Y, Zr, La, Ce, Nd, and Hf).

In the case of using an In-M-Zn oxide as the oxide semiconductor films 308a and 308b, when summation of In and M is assumed to be 100 atomic %, the proportions of In and M are preferably less than 50 atomic % and greater than or equal to 50 atomic %, respectively, and more preferably less than 25 atomic % and greater than or equal to 75 atomic %, respectively.

The indium and gallium contents in the oxide semiconductor films 308a and 308b can be compared with each other by time-of-flight secondary ion mass spectrometry (also referred to as TOF-SIMS) or X-ray photoelectron spectrometry (also referred to as XPS).

Since the oxide semiconductor films 308a and 308b each have an energy gap that is 2 eV or more, preferably 2.5 eV or more, further preferably 3 eV or more, the off-state current of the transistor that is formed later can be low.

The light-transmitting conductive film 308c is an oxide semiconductor film containing In or Ga and contains impurities in a manner similar to those of the oxide semiconductor films 308a and 308b. An example of the impurities is hydrogen. Instead of hydrogen, as the impurity, boron, phosphorus, tin, antimony, a rare gas element, an alkali metal, an alkaline earth metal, or the like may be included.

Both the oxide semiconductor films 308a and 308b and the light-transmitting conductive film 308c are formed over a gate insulating film and are oxide semiconductor films containing In or Ga, but differ in impurity concentration. Specifically, the light-transmitting conductive film 308c has a higher impurity concentration than the oxide semiconductor films 308a and 308b. For example, the concentration of hydrogen contained in each of the oxide semiconductor films 308a and 308b is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. The concentration of hydrogen contained in the light-transmitting conductive film 308c is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the light-transmitting conductive film 308c is greater than or equal to 2 times, preferably greater than or equal to 10 times those in the oxide semiconductor films 308a and 308b.

The light-transmitting conductive film 308c has lower resistivity than the oxide semiconductor films 308a and 308b. The resistivity of the light-transmitting conductive film 308c is preferably greater than or equal to $1 \times 10^{-8}$ times and less than or equal to $1 \times 10^{-1}$ times the resistivity of the oxide semiconductor films 308a and 308b. The resistivity of the light-transmitting conductive film 308c is typically greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm.

The oxide semiconductor films 308a and 308b and the light-transmitting conductive film 308c may have a non-single crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

The oxide semiconductor films 308a and 308b and the light-transmitting conductive film 308c may have an amorphous structure, for example. The oxide semiconductor films having the amorphous structure each have disordered atomic arrangement and no crystalline component, for example. Alternatively, the oxide semiconductor films having the amorphous structure have, for example, an absolutely amorphous structure and no crystal part.

Note that the oxide semiconductor films 308a and 308b and the light-transmitting conductive film 308c each may be a mixed film including regions having two or more of the following structures: a CAAC-OS, a microcrystalline structure, and an amorphous structure. The mixed film, for example, includes a region having an amorphous structure, a region having a microcrystalline structure, and a region of a CAAC-OS. Further, the mixed film may have a stacked-layer structure including a region having an amorphous structure, a region having a microcrystalline structure, and a region of a CAAC-OS, for example.

The oxide semiconductor film may be in a single-crystal state, for example.

Conductive films (hereinafter referred to as conductive films 310a, 310b, 310c, 310d, and 310e) are formed over the insulating film 306, the oxide semiconductor films 308a and 308b, and the light-transmitting conductive film 308c. The conductive film 310a is electrically connected to the oxide semiconductor film 308a and functions as one of a source and a drain of the transistor in the driver circuit portion. The conductive film 310b is electrically connected to the oxide semiconductor film 308a and functions as the other of the source and the drain of the transistor in the driver circuit portion. The conductive film 310c is electrically connected to the light-transmitting conductive film 316a through an opening formed in the insulating films 312 and 314. The conductive film 310d is electrically connected to the oxide semiconductor film 308b and functions as one of a source and a drain of the transistor in the pixel portion. The conductive film 310e is electrically connected to the oxide semiconductor film 308b and the light-transmitting conductive film 316b and functions as the other of the source and the drain of the transistor in the pixel portion.

The conductive films 310a, 310b, 310c, 310d, and 310e are formed to have a single-layer structure or a layered structure using, as a conductive material, any of metals such as aluminum, titanium, chromium, nickel, copper, yttrium, zirconium, molybdenum, silver, tantalum, and tungsten or an alloy containing any of these metals as its main component. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The insulating films 312 and 314 are formed over the insulating film 306, the oxide semiconductor films 308a and 308b, the light-transmitting conductive film 308c, and the conductive films 310a, 310b, 310c, 310d, and 310e. For the insulating film 312, in a manner similar to that of the insulating film 306, a material which can improve characteristics of the interface with the oxide semiconductor film is preferably used. For the insulating film 314, in a manner similar to that of the insulating film 305, a material which prevents diffusion of impurities from the outside, such as water, an alkali metal, and an alkaline earth metal, into the oxide semiconductor film is preferably used.

Further, the insulating film 312 may be formed using an oxide insulating film in which the oxygen content is higher than that in the stoichiometric composition. In that case, oxygen can be prevented from being released from the oxide semiconductor film, and the oxygen contained in an oxygen-excess oxide insulating film can enter the oxide semiconductor film to reduce oxygen vacancies. For example, when an oxide insulating film having the following feature is used, oxygen vacancies in the oxide semiconductor films 308a and 308b can be reduced. The feature of the oxide insulating film is that the number of oxygen molecules released from the oxide insulating film is greater than or equal to $1.0 \times 10^{18}$ molecules/cm$^3$ when measured by thermal desorption spectroscopy.

Further, it is possible that the insulating film 312 has a layered structure in which an oxide insulating film which reduces interface levels with the oxide semiconductor films 308a and 308b is provided as a first oxide insulating film on the side in contact with the oxide semiconductor films 308a and 308b, and an oxide insulating film in which the oxygen content is higher than that in the stoichiometric composition is provided as a second oxide insulating film over the first oxide insulating film.

For example, the spin density of the first oxide insulating film at a g-value of 2.001 (E'-center) obtained by electron spin resonance is $3.0 \times 10^{17}$ spins/cm$^3$ or lower, preferably $5.0 \times 10^{16}$ spins/cm$^3$ or lower, whereby the interface levels between the first oxide insulating film and each of the oxide semiconductor films 308a and 308b can be reduced. Note that the spin density at a g-value of 2.001 obtained by electron spin resonance corresponds to the number of dangling bonds contained in the first oxide insulating film.

Further, the light-transmitting conductive films 316a and 316b are provided over the insulating film 314. The light-transmitting conductive film 316a is electrically connected to the conductive film 304b through the opening 374a and electrically connected to the conductive film 310c through the opening 374b. That is, the light-transmitting conductive film 316a functions as a connection electrode which connects the conductive film 304b and the conductive film 310c. The light-transmitting conductive film 316b is electrically connected to the conductive film 310e through the opening 374c and functions as the pixel electrode of a pixel. Further, the light-transmitting conductive film 316b can function as one of the pair of electrodes of the capacitor.

For the light-transmitting conductive films 316a and 316b, a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added can be used.

A film having a colored property (hereinafter referred to as a colored film 346) is formed in contact with the substrate 342. The colored film 346 functions as a color filter. Further, a light-blocking film 344 adjacent to the colored film 346 is formed in contact with the substrate 342. The light-blocking film 344 functions as a black matrix. The colored film 346 is not necessarily provided in the case where the liquid crystal display device is a monochrome display device, for example.

The colored film 346 is a colored film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 344 preferably has a function of blocking light in a particular wavelength region, and can be a metal film or an organic insulating film including a black pigment.

An insulating film 348 is formed in contact with the colored film 346. The insulating film 348 functions as a planarization layer or suppresses diffusion of impurities in the colored film 346 to the liquid crystal element side.

The conductive film 350 is formed in contact with the insulating film 348. The conductive film 350 functions as the other of the pair of electrodes of the liquid crystal element in the pixel portion. Note that an insulating film that functions as an alignment film may be additionally formed over the light-transmitting conductive films 316a and 316b and the conductive film 350.

The liquid crystal layer 320 is formed between the light-transmitting conductive film 316a and the conductive film 350, and the light-transmitting conductive film 316b and the conductive film 350. The liquid crystal layer 320 is sealed between the substrate 302 and the substrate 342 with the use of a sealant (not illustrated). The sealant is preferably in contact with an inorganic material to prevent entry of moisture and the like from the outside.

A spacer may be provided between the light-transmitting conductive film 316a and the conductive film 350, and the light-transmitting conductive film 316b and the conductive film 350 to maintain the thickness of the liquid crystal layer 320 (also referred to as a cell gap).

<Method for Manufacturing Semiconductor Device>

A formation method of the element portion over the substrate 302 in the semiconductor device illustrated in FIGS. 3A to 3C is described with reference to FIGS. 4A to 4C, FIGS. 5A to 5C, FIGS. 6A to 6C, and FIGS. 7A and 7B.

First, the substrate 302 is prepared. Here, a glass substrate is used as the substrate 302.

Then, a conductive film is formed over the substrate 302 and processed into desired regions, so that the conductive films 304a, 304b, and 304c are formed. The conductive films 304a, 304b, and 304c can be formed in such a manner that a mask is formed in the desired regions by first patterning and regions not covered with the mask are etched.

The conductive films 304a, 304b, and 304c can be typically formed by an evaporation method, a CVD method, a sputtering method, a spin coating method, or the like.

Here, a 100 nm-thick tungsten film is formed as a conductive film by a sputtering method. Then, a mask is formed by a photolithography process and the tungsten film is dry-etched using the mask to form the conductive films 304a, 304b, and 304c.

Next, the insulating film 305 is formed over the substrate 302 and the conductive films 304a, 304b, and 304c, and then the insulating film 306 is formed over the insulating film 305 (see FIG. 4A).

The insulating films 305 and 306 can be formed by a sputtering method, a CVD method, or the like. Note that it is preferable that the insulating films 305 and 306 be formed in succession in a vacuum, in which case entry of impurities is suppressed.

Here, a 400-nm-thick silicon nitride film is formed as the insulating film 305 by a plasma CVD method. Further, a 50-nm-thick silicon oxynitride film is formed as the insulating film 306 by a plasma CVD method.

Next, the oxide semiconductor film 307 is formed over the insulating film 306 (see FIG. 4B).

The oxide semiconductor film 307 can be formed by a sputtering method, a coating method, a pulsed laser deposition method, a laser ablation method, or the like.

In the case where the oxide semiconductor film 307 is formed by a sputtering method, an RF power supply device, an AC power supply device, a DC power supply device, or the like can be used as appropriate as a power supply device for generating plasma.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of the rare gas.

Further, a target may be appropriately selected in accordance with the composition of the oxide semiconductor film 307 which is to be formed.

In the case where the oxide semiconductor film 307 is formed by, for example, a sputtering method, the oxide semiconductor film 307 may be formed while the substrate is heated at the substrate temperature higher than or equal to room temperature (e.g., 20° C.) and lower than 100° C., preferably higher than or equal to 100° C. and lower than or equal to 450° C., more preferably higher than or equal to 170° C. and lower than or equal to 350° C.

In the case where the oxide semiconductor film 307 is formed by a sputtering method, in order to reduce concentration of hydrogen contained in the oxide semiconductor film 307, each chamber in the sputtering apparatus is preferably evacuated to be a high vacuum state (to the degree of about $1\times10^{-4}$ Pa to $5\times10^{-7}$ Pa) with an adsorption vacuum evacuation pump such as a cryopump which can remove water, hydrogen, or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

In order to reduce concentration of hydrogen contained in the oxide semiconductor film 307, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, further preferably −120° C. or lower is used, whereby entry of moisture or the like into the oxide semiconductor film can be prevented as much as possible.

Here, a 35-nm-thick In—Ga—Zn oxide film (using a metal oxide target of In:Ga:Zn=1:1:1) is formed by a sputtering method as the oxide semiconductor film 307.

Next, the oxide semiconductor film 307 is processed into desired regions, so that the island-shaped oxide semiconductor films 308a, 308b, and 308d are formed. Thus, the oxide semiconductor films 308a, 308b, and 308d are formed using the same metal element. The oxide semiconductor films 308a, 308b, and 308d can be formed in such a manner that a mask is formed in the desired regions by second patterning and regions not covered with the mask are etched. For the etching, dry etching, wet etching, or a combination of both can be employed (see FIG. 4C).

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor that is used for the oxide semiconductor films 308a, 308b, and 308d can be improved, and in addition, impurities such as hydrogen and water can be removed from the insulating film 306 and the oxide semiconductor films 308a, 308b, and 308d. The first heat treatment may be performed before the oxide semiconductor is etched.

Here, the oxide semiconductor films are heated at 350° C. in a nitrogen atmosphere for one hour and then is heated at 350° C. in an oxygen atmosphere.

Figure 5A:
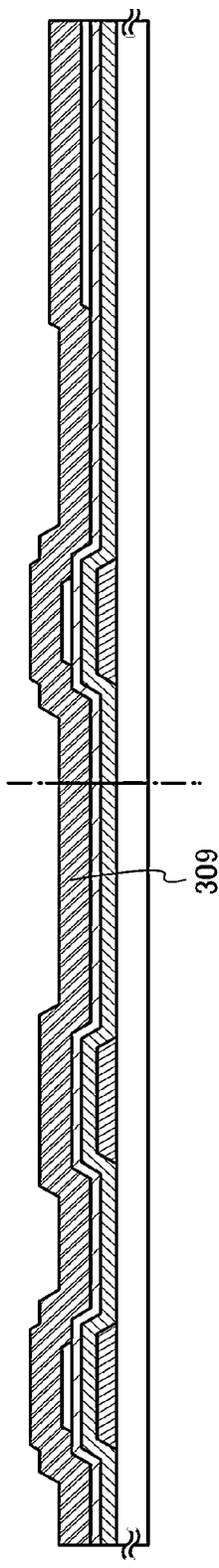
FIGS. 5A to 5C are cross-sectional views illustrating one embodiment of a method for manufacturing a semiconductor device.
Figure 5B:
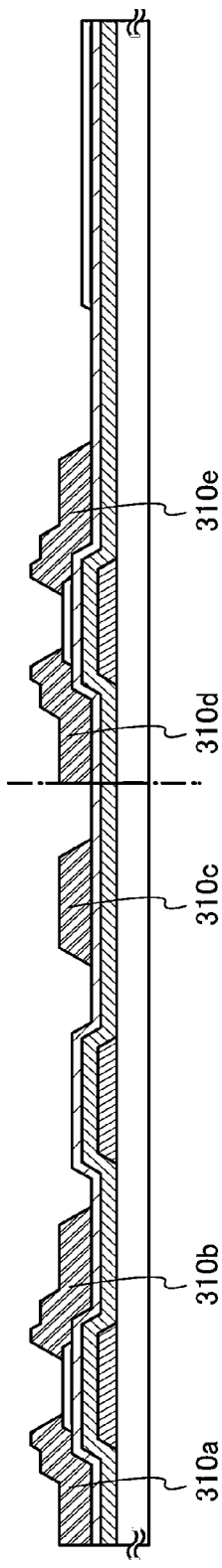

Next, the conductive film 309 is formed over the insulating film 306 and the oxide semiconductor films 308a, 308b, and 308d (see FIG. 5A).

The conductive film 309 can be formed by a sputtering method, for example.

Here, a 50 nm-thick titanium film, a 400 nm-thick aluminum film, and a 100 nm-thick titanium film are sequentially stacked by a sputtering method.

Then, the conductive film 309 is processed into desired regions, so that the conductive films 310a, 310b, 310c, 310d, and 310e are formed. The conductive films 310a, 310b, 310c, 310d, and 310e can be formed in such a manner that a mask is formed in the desired regions by third patterning and regions not covered with the mask are etched (see FIG. 5B).

Figure 5C:
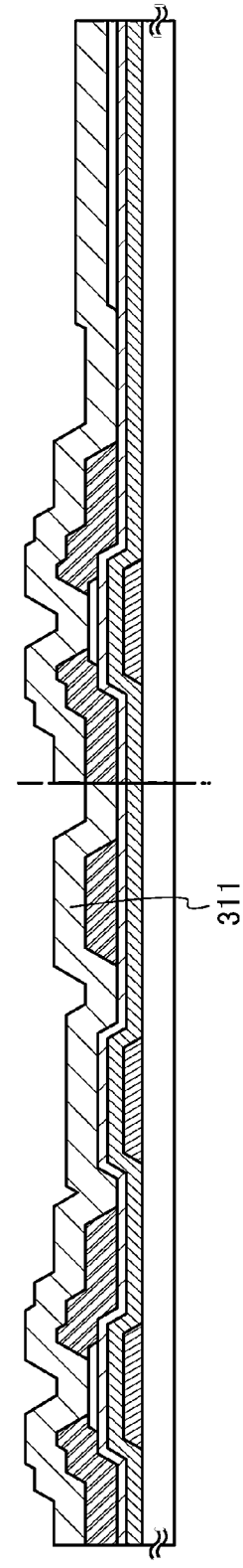

Next, the insulating film 311 is formed to cover the insulating film 306, the oxide semiconductor films 308a, 308b, and 308d, and the conductive films 310a, 310b, 310c, 310d, and 310e (see FIG. 5C).

For the insulating film 311, a material which can improve characteristics of the interface with the oxide semiconductor films 308a, 308b, and 308d is preferably used, typically, an inorganic insulating material containing oxygen, such as an oxide insulating film, can be used. The insulating film 311 can be formed by a CVD method, a sputtering method, or the like.

In the case where the insulating film 311 is formed using an oxide insulating film in which the oxygen content is higher than that in the stoichiometric composition, the insulating film 311 can be formed under the following formation conditions. Here, as the insulating film 311, a silicon oxide film or a silicon oxynitride film is formed. As for the formation conditions, the substrate placed in a deposition chamber of a plasma CVD apparatus, which is vacuum-evacuated, is held at a temperature higher than or equal to 180° C. and lower than or equal to 260° C., preferably higher than or equal to 180° C. and lower than or equal to 230° C., a source gas is introduced into the deposition chamber, the pressure in the deposition chamber is greater than or equal to 100 Pa and less than or equal to 250 Pa, preferably greater than or equal to 100 Pa and less than or equal to 200 Pa, and high-frequency power higher than or equal to 0.17 W/cm$^2$ and lower than or equal to 0.5 W/cm$^2$, preferably, higher than or equal to 0.25 W/cm$^2$ and lower than or equal to 0.35 W/cm$^2$ is supplied to an electrode provided in the deposition chamber.

Typical examples of the deposition gas containing silicon, which is used as a source gas of the insulating film 311, include silane, disilane, trisilane, silane fluoride, and the like. Examples of the oxidizing gas include oxygen, ozone, dinitrogen monoxide, and nitrogen dioxide.

As for the formation conditions of the insulating film 311, the high-frequency power having the above power density is supplied to the deposition chamber having the above pressure, whereby the decomposition efficiency of the source gas in plasma is increased, oxygen radicals are increased, and oxidation of the source gas proceeds; therefore, the oxygen content in the insulating film 311 is higher than that in the stoichiometric composition. However, when a substrate temperature is within the above temperature range, the bond between silicon and oxygen is weak, and accordingly, part of oxygen is released by heat treatment. Thus, it is possible to form an oxide insulating film in which the oxygen content is higher than that in the stoichiometric composition and from which part of oxygen is released by heating.

Further, it is possible that the insulating film 311 has a layered structure in which an oxide insulating film reducing interface levels at least with the oxide semiconductor films 308a and 308b is provided as a first oxide insulating film, and an oxide insulating film in which the oxygen content is higher than that in the stoichiometric composition is provided as a second oxide insulating film over the first oxide insulating film.

The oxide insulating film which reduces interface levels at least with the oxide semiconductor films 308a and 308b can be formed under the following formation conditions. Here, as the oxide insulating film, a silicon oxide film or a silicon oxynitride film is formed. As for the formation conditions, the substrate placed in a deposition chamber of a plasma CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the deposition chamber, the pressure in the deposition chamber is greater than or equal to 20 Pa and less than or equal to 250 Pa, preferably greater than or equal to 40 Pa and less than or equal to 200 Pa, and high-frequency power is supplied to an electrode provided in the deposition chamber.

The source gas of the first oxide insulating film can be a source gas which can be used for an oxide insulating film in which the oxygen content is higher than that in the stoichiometric composition. In the process for forming the second oxide insulating film, the first oxide insulating film serves as a protective film for at least the oxide semiconductor films 308a and 308b. Thus, even when the second oxide insulating film is formed using the high-frequency power having a high power density, damage to the oxide semiconductor films 308a and 308b can be inhibited.

Here, the insulating film 311 has a layered structure of the first oxide insulating film and the second oxide insulating film, and as the first oxide insulating film, a 50-nm-thick silicon oxynitride film is formed by a plasma CVD method in which silane with a flow rate of 30 sccm and dinitrogen monoxide with a flow rate of 4000 sccm are used as source gases, the pressure in the deposition chamber is 200 Pa, the substrate temperature is 220° C., and a high-frequency power of 150 W is supplied to parallel plate electrodes with the use of a 27.12 MHz high-frequency power source. As the second oxide insulating film, a 400-nm-thick silicon oxynitride film is formed by a plasma CVD method in which silane with a flow rate of 200 sccm and dinitrogen monoxide with a flow rate of 4000 sccm are used as the source gases, the pressure in the deposition chamber is 200 Pa, the substrate temperature is 220° C., and the high-frequency power of 1500 W is supplied to the parallel plate electrodes with the use of a 27.12 MHz high-frequency power source. Note that a plasma CVD apparatus used here is a parallel plate plasma CVD apparatus in which the electrode area is 6000 cm², and the power per unit area (power density) into which the supplied power is converted is 0.25 W/cm².

Then, the insulating film 311 is processed into desired regions so that the insulating film 312 and the openings 372, 372b, and 372c are formed. Further, the insulating film 306, which is part of the gate insulating film, is processed into desired regions so that the opening 372a is formed. The insulating film 306, the insulating film 312, and the openings 372, 372a, 372b, and 372c can be formed in such a manner that a mask is formed in the desired regions by fourth patterning and regions not covered by the mask are etched (see FIG. 6A).

The opening 372 is formed so as to expose the surface of the oxide semiconductor film 308d. The opening 372a is formed so as to expose the surface of the insulating film 305. The opening 372b is formed so as to expose the surface of the conductive film 310c. The opening 372c is formed so as to expose the surface of the conductive film 310e. An example of a formation method of the openings 372, 372a, 372b, and 372c includes, but not limited to, a dry etching method. Alternatively, a wet etching method or a combination of a dry etching method and a wet etching method can be employed for the formation method of the opening 372. In the case where the openings 372, 372a, 372b, and 372c are formed by dry etching, the oxide semiconductor film 308d is exposed to plasma and is damaged, so that defects, typically, oxygen vacancies are formed in the oxide semiconductor film 308d. Accordingly, the light-transmitting conductive film 308c having low resistance is formed.

By forming at least the opening 372a in the etching step, the etching amount can be reduced in an etching step with a mask formed by fifth patterning.

Figure 6A:
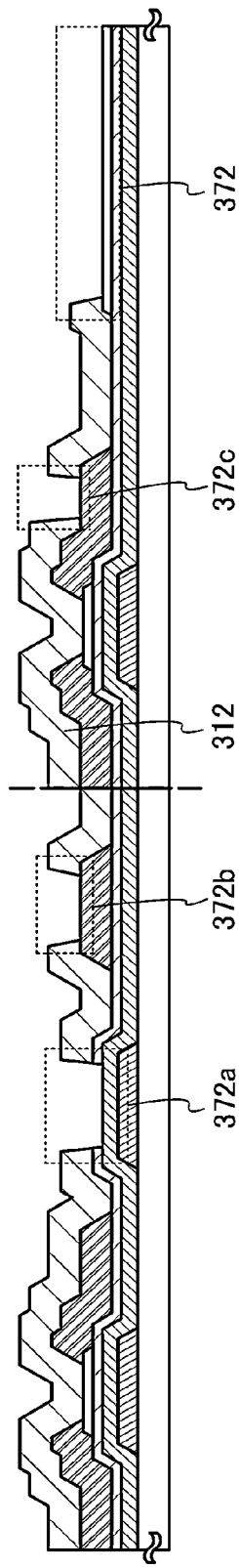
FIGS. 6A to 6C are cross-sectional views illustrating one embodiment of a method for manufacturing a semiconductor device.
Figure 6B:
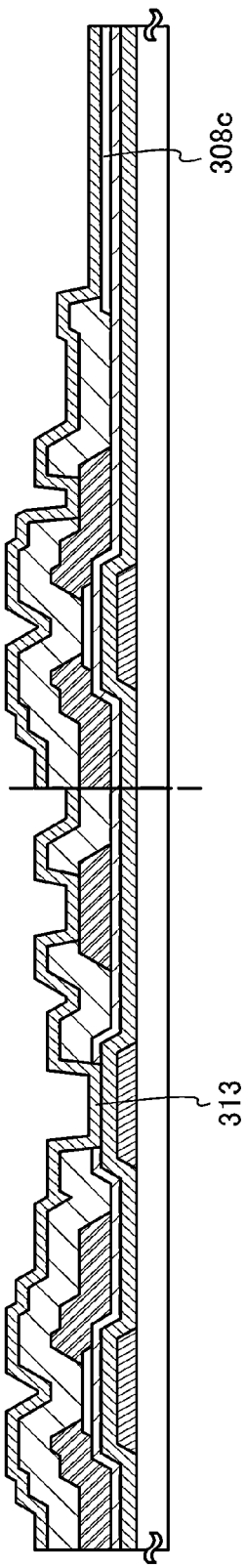

Next, an insulating film 313 is formed over the insulating film 305, the conductive films 310c, and 310e, the insulating film 312, and the oxide semiconductor film 308d (see FIG. 6B).

For the insulating film 313, a material that can prevent an external impurity such as water, alkali metal, or alkaline earth metal, from diffusing into the oxide semiconductor film, is preferably used, more preferably, the material includes hydrogen, and typically, an inorganic insulating material containing nitrogen, such as a nitride insulating film, can be used. The insulating film 313 can be formed by a CVD method, for example.

When the insulating film 313 contains hydrogen and the hydrogen diffuses into the oxide semiconductor film 308d, hydrogen is bonded to oxygen in the oxide semiconductor film 308d, thereby producing an electron serving as a carrier. As a result, the conductivity of the oxide semiconductor film 308d is increased, so that the oxide semiconductor film 308d becomes a light-transmitting conductive film 308c.

When the insulating film 313 is formed using a silicon nitride film, the silicon nitride film is preferably formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor used for the oxide semiconductor films 308a and 308b and the carrier density is increased is caused in some cases; therefore, the upper limit of the temperature is a temperature at which the phenomenon is not caused.

Here, as the insulating film 313, the 50-nm-thick silicon nitride film is formed by a plasma CVD method under the following conditions: silane with a flow rate of 50 sccm, nitrogen with a flow rate of 5000 sccm, and ammonia with a flow rate of 100 sccm are used as a source gas; the pressure in the deposition chamber is 200 Pa; the substrate temperature is 220° C.; and high-frequency power of 1000 W (the power density is $1.6 \times 10^{-1}$ W/cm²) is supplied to parallel-plate electrodes with a high-frequency power supply of 27.12 MHz.

Then, the insulating film 313 is processed into desired regions so that the insulating film 314 and the openings 374a, 374b, and 374c are formed. The insulating film 314 and the openings 374a, 374b, and 374c can be formed in such a manner that a mask is formed in the desired regions by fifth patterning and regions not covered by the mask are etched (see FIG. 6C).

The opening 374a is formed so as to expose the surface of the conductive film 304b. The opening 374b is formed so as to expose the surface of the conductive film 310c. The opening 374c is formed so as to expose the surface of the conductive film 310e.

An example of a formation method of the openings 374a, 374b, and 374c includes, but not limited to, a dry etching method. Alternatively, a wet etching method or a combination of a dry etching method and a wet etching method can be employed for the formation method of the openings 374a, 374b, and 374c.

Figure 6C:
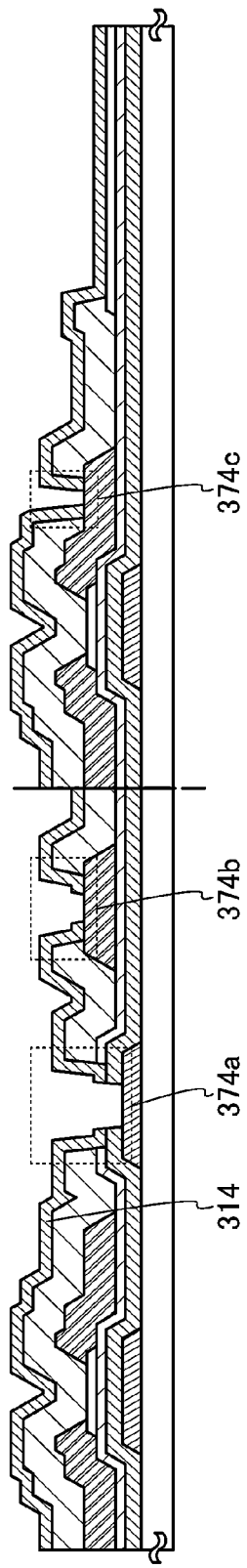

When the opening 372a is not formed in the process of FIG. 6A, the insulating films 305, 306, 312, and 314 are required to be etched in the etching step in FIG. 6C, so that the etching amount is increased. Thus, the etching step cannot be performed uniformly and the opening 374a is not formed in some regions, so that a contact defect between the light-transmitting conductive film 316a formed later and the conductive film 304b is generated. However, in this embodiment, the openings 372a and 374a are formed in two etching steps; thus, an etching defect is not easily generated in the forming process of the openings. Consequently, yield of a semiconductor device can be improved. The opening 374a is described here, but the same effect can also obtained in the case of the openings 374b and 374c.

Then, a conductive film 315 is formed over the insulating film 314 to cover the openings 374a, 374b, and 374c (see FIG. 7A).

The conductive film 315 can be formed by a sputtering method, for example.

Here, a 100-nm-thick indium tin oxide film to which silicon oxide is added is formed as the conductive film 315 by a sputtering method.

Then, the conductive film 315 is processed into desired regions so that the light-transmitting conductive films 316a and 316b are formed. The light-transmitting conductive films 316a and 316b can be formed in such a manner that a mask is formed in the desired regions by sixth patterning and regions not covered by the mask are etched (see FIG. 7B).

Through the above process, the pixel portion and the driver circuit portion including transistors can be formed over the substrate 302. In the fabrication process described in this embodiment, the transistors and the capacitor can be formed at the same time by the first to sixth patterning, that is, with the six masks.

In this embodiment, the conductivity of the oxide semiconductor film 308d is increased by diffusing hydrogen contained in the insulating film 314 into the oxide semiconductor film 308d; however, the conductivity of the oxide semiconductor film 308d may be increased by covering the oxide semiconductor films 308a and 308b with a mask and adding impurities, typically, hydrogen, boron, phosphorus, tin, antimony, a rare gas element, an alkali metal, an alkaline earth metal, or the like to the oxide semiconductor film 308d. Hydrogen, boron, phosphorus, tin, antimony, a rare gas element, or the like is added to the oxide semiconductor film 308d by an ion doping method, an ion implantation method, or the like. Further, an alkali metal, an alkaline earth metal, or the like may be added to the oxide semiconductor film 308d by a method in which the oxide semiconductor film 308d is exposed to a solution that contains the impurity.

Next, a structure that is formed over the substrate 342 provided so as to face the substrate 302 is described below.

First, the substrate 342 is prepared. For materials of the substrate 342, the materials that can be used for the substrate 302 can be referred to. Then, the light-blocking film 344 and the colored film 346 are formed over the substrate 342 (see FIG. 8A).

The light-blocking film 344 and the colored film 346 each are formed in a desired position with any of various materials by a printing method, an inkjet method, an etching method using a photolithography technique, or the like.

Then, the insulating film 348 is formed over the light-blocking film 344 and the colored film 346 (see FIG. 8B).

For the insulating film 348, an organic insulating film of an acrylic resin or the like can be used. With the insulating film 348, an impurity or the like contained in the colored film 346 can be prevented from diffusing into the liquid crystal layer 320, for example. Note that the insulating film 348 is not necessarily formed.

Then, the conductive film 350 is formed over the insulating film 348 (see FIG. 8C). As the conductive film 350, a material that can be used for the conductive film 315 can be used.

Through the above process, the structure formed over the substrate 342 can be formed.

Next, the alignment film 318 and the alignment film 352 are formed over the substrate 302 and the substrate 342 respectively, specifically, over the insulating film 314 and the light-transmitting conductive films 316a and 316b formed over the substrate 302 and over the conductive film 350 formed over the substrate 342. The alignment films 318 and 352 are formed by a rubbing method, an optical alignment method, or the like. After that, the liquid crystal layer 320 is formed between the substrate 302 and the substrate 342. The liquid crystal layer 320 can be formed by a dispenser method (a dropping method), or an injecting method by which a liquid crystal is injected using a capillary phenomenon after the substrate 302 and the substrate 342 are bonded to each other.

Through the above process, the liquid crystal display device illustrated in FIGS. 3A to 3C can be fabricated.

This embodiment can be combined with another embodiment in this specification as appropriate.

Modification Example 1

Here, a modification example of the pixel 301a of the semiconductor device described in Embodiment 1 is described with reference to FIGS. 3A to 3C and FIG. 9.

Figure 9:
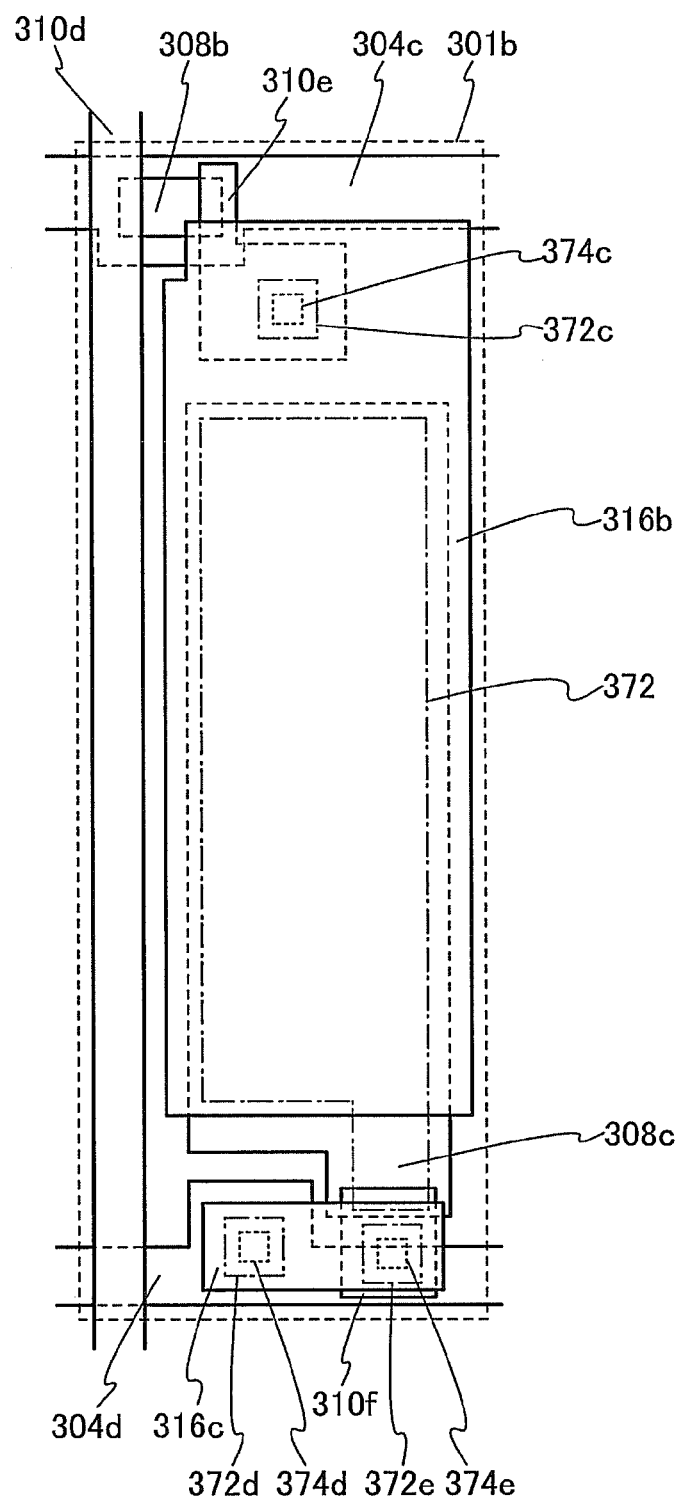
FIG. 9 is a top view illustrating one embodiment of a semiconductor device.

In FIG. 9, the conductive film 304c serving as a scan line is provided so as to extend perpendicularly or substantially perpendicularly to the signal line (in the horizontal direction in the drawing). The conductive film 310d serving as a signal line extends substantially perpendicularly to the scan line (in the vertical direction in the drawing). The conductive film 304d serving as a capacitor line is provided so as to extend in parallel with the scan line. The pixel 301b illustrated in FIG. 9 is different from the pixel 301a illustrated in FIG. 2B in that a side parallel to the conductive film 304c serving as a scan line is shorter than a side parallel to the conductive film 310d serving as a signal line, the conductive film 304d serving as a capacitor line extends in parallel to the scan line, and the conductive film 304d serving as a capacitor line is formed at the same time as the conductive film 304c serving as a scan line.

In addition, the light-transmitting conductive film 308c is connected to the conductive film 310f. Note that the light-transmitting conductive film 316c is formed at the same time as the light-transmitting conductive film 316b. The conductive film 310f is formed at the same time as the conductive films 310d and 310e.

Further, an opening 372d formed at the same time as the opening 372c and an opening 374d formed at the same time as the opening 374c are formed over the conductive film 304d. In addition, an opening 372e formed at the same time as the opening 372c and an opening 374e formed at the same time as the opening 374c are formed over the conductive film 310f. The openings 374d and 374e are located on an inner side than the openings 372d and 372e, respectively.

Through the opening 374d, the conductive film 304d is connected to the light-transmitting conductive film 316c. Through the opening 374e, the conductive film 310f is connected to the light-transmitting conductive film 316c. That is, the conductive film 304d and the conductive film 310f are connected to each other through the light-transmitting conductive film 316c, such that the conductive film 304b and the conductive film 310c are connected to each other through the light-transmitting conductive film 316a in the cross-sectional view taken along line A-B in FIG. 3A. In other words, through the conductive film 310f and the light-transmitting conductive film 316c, the light-transmitting conductive film 308c is connected to the conductive film 304d serving as a capacitor line.

The pixel 301b illustrated in FIG. 9 has a shape in which a side parallel to the conductive film 304c serving as a scan line is shorter than a side parallel to the conductive film 310d serving as a signal line and the conductive film 304d serving as a capacitor line extends in parallel to the conductive film 304c serving as a scan line. As a result, the area where the conductive film 304d occupies the pixel can be decreased, thereby increasing the aperture ratio.

Modification Example 2

Here, a modification example of the semiconductor device described in Embodiment 1 is described with reference to FIGS. 6A to 6C and FIG. 10.

Figure 10:
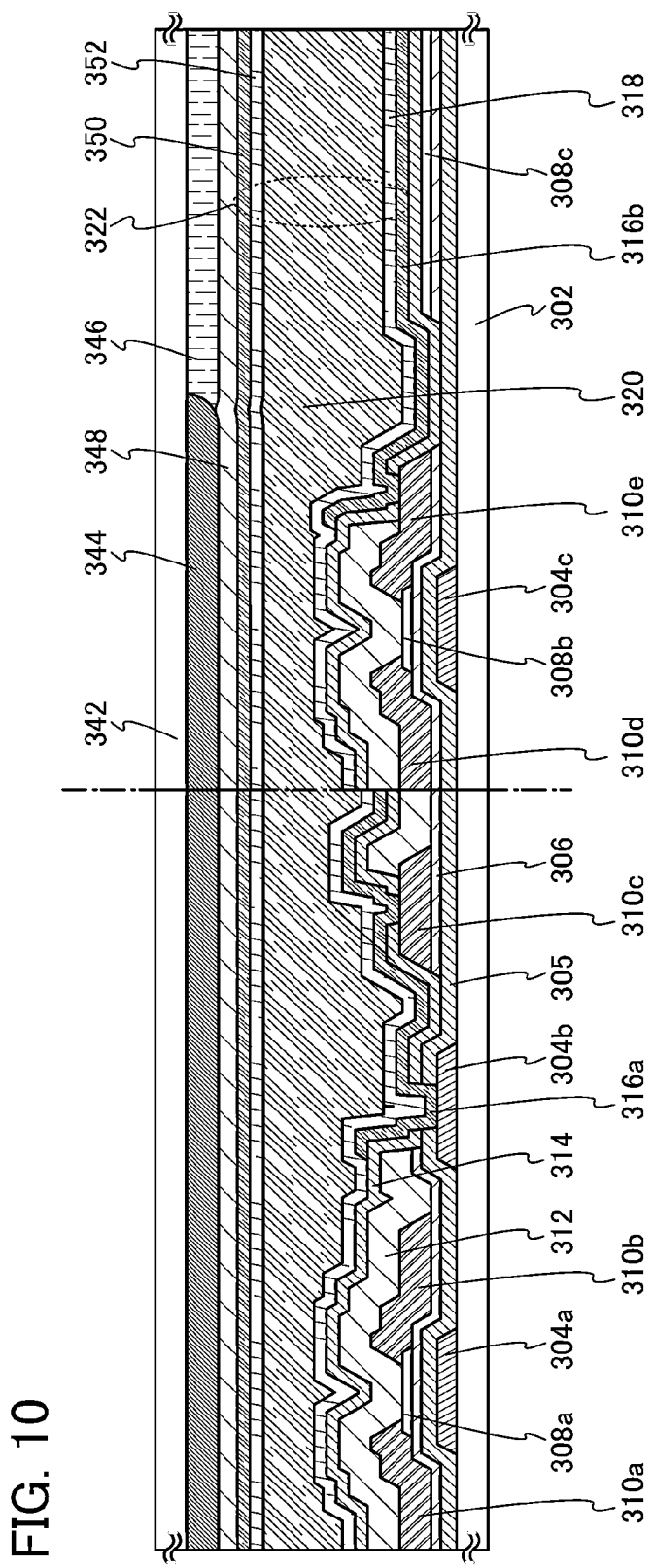
FIG. 10 is a cross-sectional view illustrating one embodiment of a semiconductor device.

A semiconductor device illustrated in FIG. 10 is different from the semiconductor device described in Embodiment 1 in that the insulating film 305, which is part of the gate insulating film, is in contact with the insulating film 314, which is part of the protective film, in a region between the conductive film 304b and the conductive film 310c. In other words, the insulating films 306 and 312 are not provided between the insulating film 305 and the insulating film 314 in the region between the conductive film 304b and the conductive film 310c.

Further, the insulating film 305, which is part of the gate insulating film, is in contact with the insulating film 314, which is part of the protective film, in a region between the conductive film 310e and the light-transmitting conductive film 308c. In other words, the insulating films 306 and 312 are not provided between the insulating film 305 and the insulating film 314 in the region between the conductive film 310e and the light-transmitting conductive film 308c.

The semiconductor device in FIG. 10 is fabricated by removing the insulating films 306 and 311, which are provided between the opening 372a and the opening 372b, in the forming step of the openings 372, 372a, 372b, and 372c in FIG. 6A. That is, parts of the insulating films 306 and 311 which are provided between the opening 372a and the opening 372b can be removed in such a manner that a mask exposing the region between the conductive film 304b and the conductive film 310c is formed by the fourth patterning and the regions not covered with the mask are etched.

Further, the insulating films 306 and 311, which are provided between the opening 372c and the opening 372, may be removed in the forming step of the openings 372, 372a, 372b, and 372c in FIG. 6A. That is, parts of the insulating films 306 and 311 which are provided between the opening 372c and the opening 372 can be removed in such a manner that a mask exposing the region between the conductive film 310e and the light-transmitting conductive film 308c is formed by the fourth patterning and the regions not covered with the mask are etched.

As a result, in the semiconductor device in FIG. 10, unevenness of the surfaces of the light-transmitting conductive films 316a and 316b can be reduced. Thus, alignment disorder of the liquid crystal materials contained in the liquid crystal layer 320 can be reduced. Further, a high-contrast semiconductor device can be fabricated.

Modification Example 3

Here, a modification example of the semiconductor device described in Embodiment 1 is described with reference to FIGS. 4A to 4C, FIGS. 5A to 5C, FIG. 11, FIGS. 12A to 12C, and FIGS. 13A and 13B.

Figure 11:
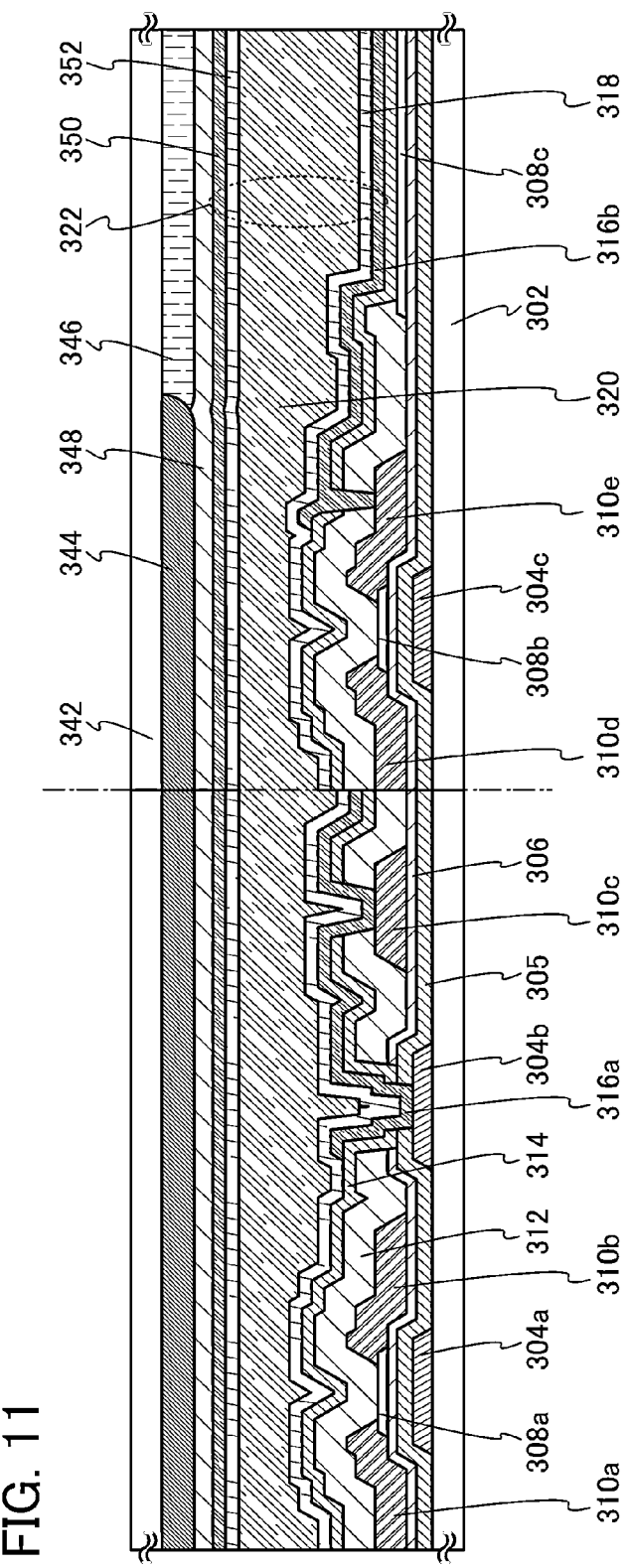
FIG. 11 is a cross-sectional view illustrating one embodiment of a semiconductor device.

A semiconductor device illustrated in FIG. 11 is different from the semiconductor device described in Embodiment 1 in that the opening formed over the conductive film 304b is formed by two etching steps and the openings formed over the conductive films 310c and 310e are formed by one etching step.

A method for fabricating the semiconductor device in FIG. 11 is described below.

As in Embodiment 1, through the steps in FIGS. 4A to 4C and FIGS. 5A to 5C, the conductive films 304a, 304b, and 304c, each of which functions as a gate, the insulating films 305 and 306, each of which functions as a gate insulating film, the oxide semiconductor films 308a, 308b, and 308d, the conductive films 310a, 310b, 310c, 310d, and 310e, the insulating film 311, and the insulating film 313 are formed over the substrate 302.

Next, the insulating film 311 is processed into desired regions to form the insulating film 312 and the opening 372. Further, the insulating film 306, which is part of the gate insulating film, is processed into desired regions to form the opening 372a. That is, here, the openings 372b and 372c are not formed. The insulating film 305, the insulating film 312, and the openings 372 and 372a can be formed in such a manner that a mask is formed over the desired regions by the fourth patterning and regions not covered with the mask are etched (see FIG. 12A).

Figure 12A:
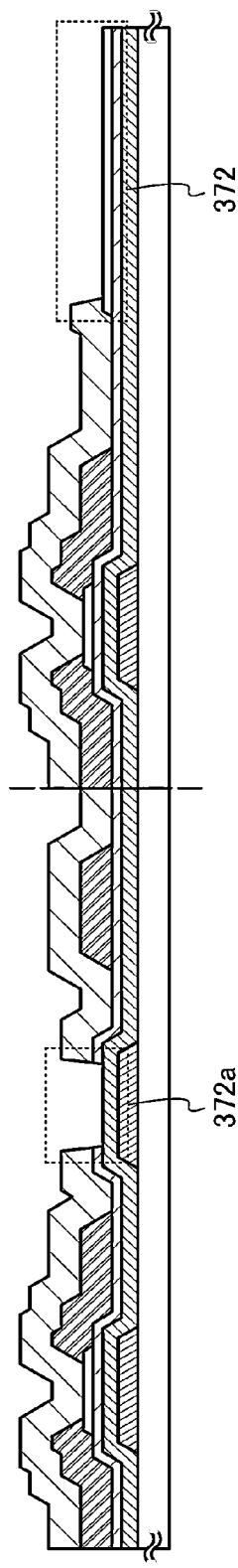
FIGS. 12A to 12C are cross-sectional views illustrating one embodiment of a method for manufacturing a semiconductor device.
Figure 12B:
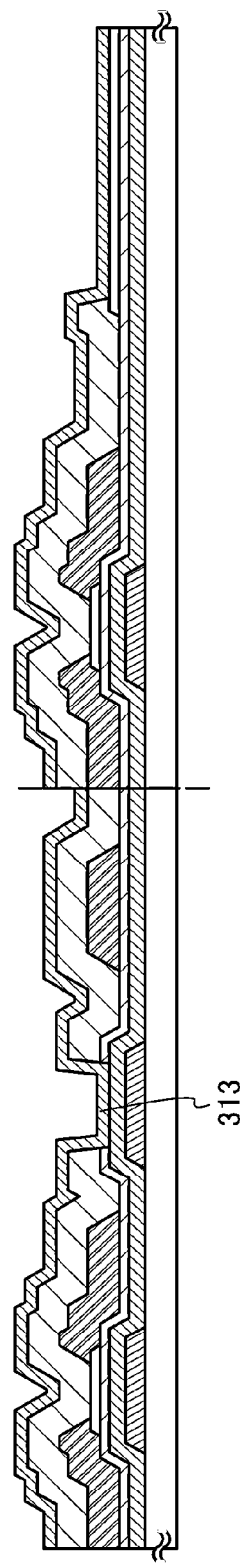
Figure 12C:
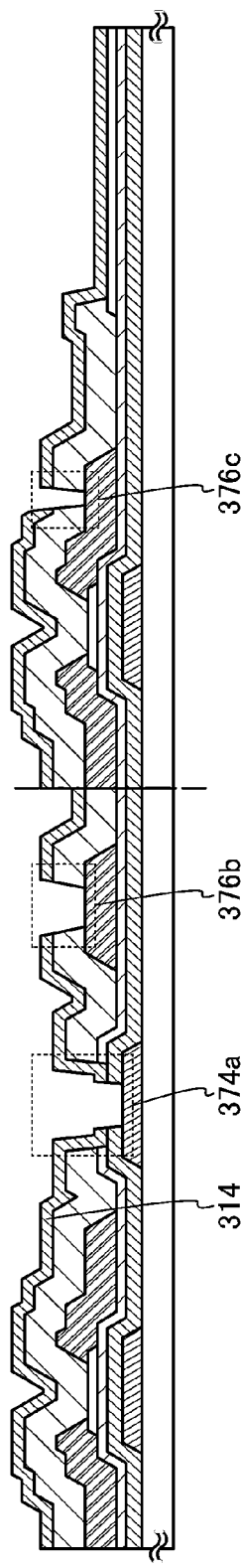

Next, the insulating film 313 is formed over the conductive film 304b and the oxide semiconductor film 308d (see FIG. 12B).

Then, the insulating film 313 is processed into desired regions to form the insulating film 314, the opening 374a, an opening 376b, and an opening 376c. The insulating film 314 and the openings 374a, 376b, and 376c can be formed in such a manner that a mask is formed over the desired regions by the fifth patterning and regions not covered with the mask are etched (see FIG. 12C).

The opening 374a is formed so as to expose the surface of the conductive film 304b, the opening 376b is formed so as to expose the surface of the conductive film 310c, and the opening 376c is formed so as to expose the surface of the conductive film 310e.

Through the etching step, the insulating films 305 and 313 are etched in the opening 374a. In the openings 376b and 376c, the insulating films 312 and 313 are etched. Thus, when the thicknesses of the insulating film 305 and the insulating film 312 are the same, etching amounts of the openings are the same; thus, variations in etching amounts in the etching step can be reduced. As a result, yield in the manufacturing process of the semiconductor device can be increased.

Figure 13A:
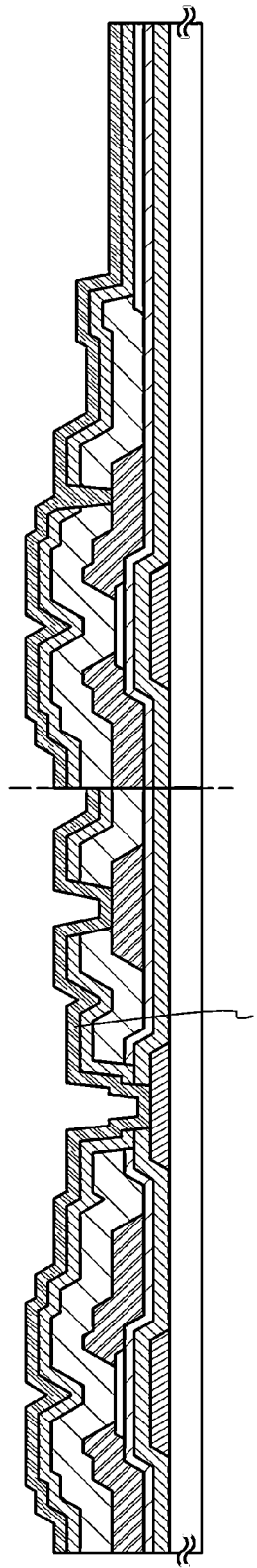
FIGS. 13A and 13B are cross-sectional views illustrating one embodiment of a method for manufacturing a semiconductor device.
Figure 13B:
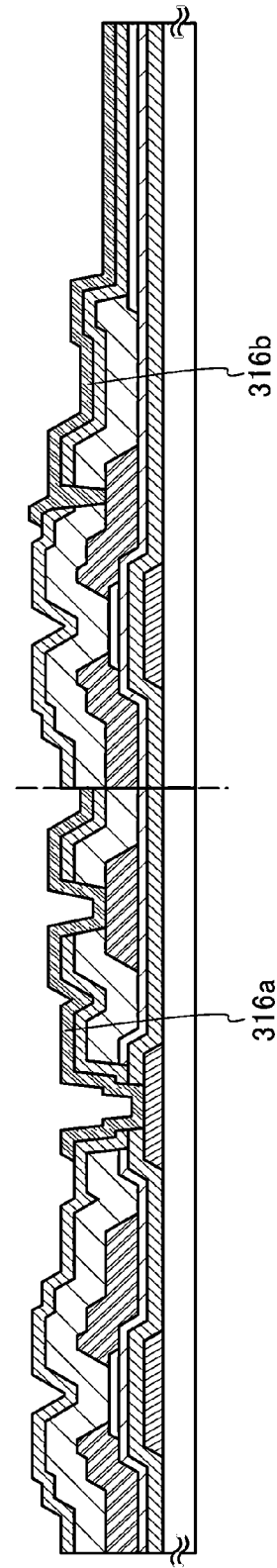

Next, the conductive film 315 is formed over the insulating film 314 so as to cover the openings 374a, 376b, and 376c (see FIG. 13A).

Then, the conductive film 315 is processed into desired regions to form the light-transmitting conductive films 316a and 316b. The light-transmitting conductive films 316a and 316b can be formed in such a manner that a mask is formed over the desired regions by sixth patterning and regions not covered with the mask are etched (see FIG. 13B).

Through these steps, a semiconductor device can be fabricated with high yield.

Modification Example 4

Here, a modification example of the semiconductor device described in Embodiment 1 is described with reference to FIGS. 6A to 6C and FIG. 14.

Figure 14:
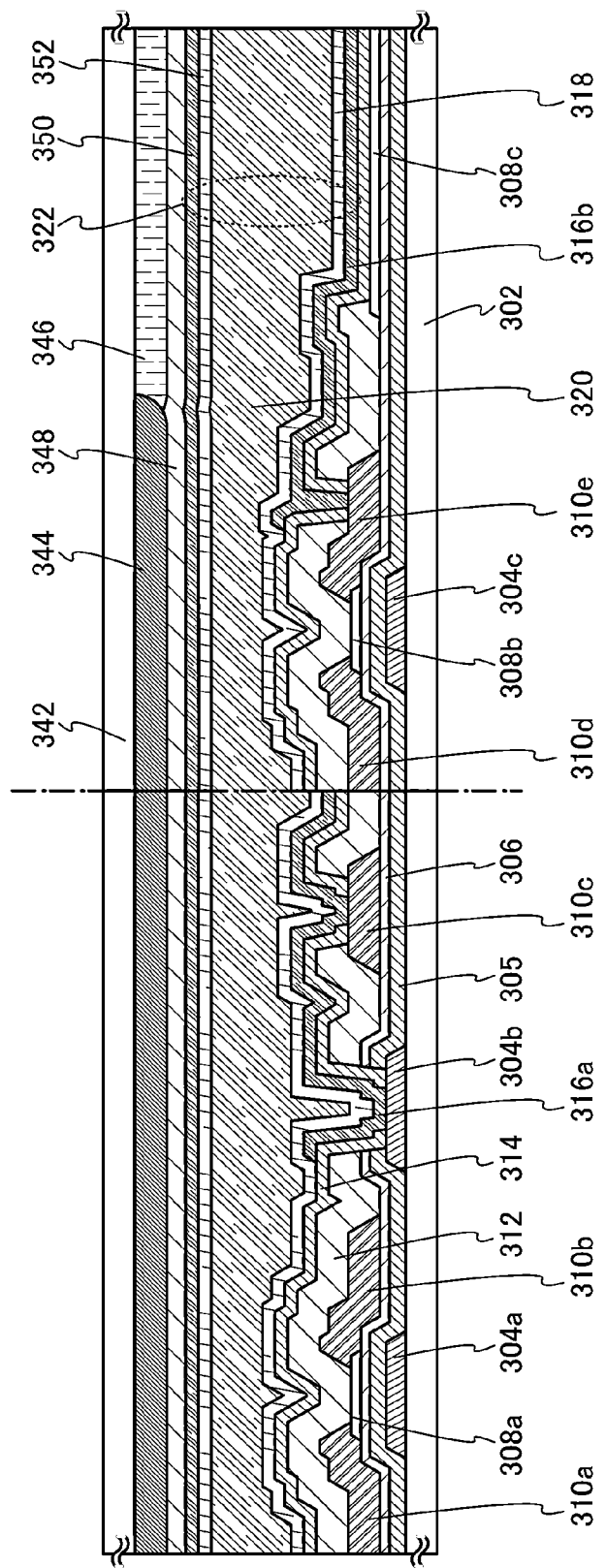
FIG. 14 is a cross-sectional view illustrating one embodiment of a semiconductor device.

A semiconductor device described in FIG. 14 is different from the semiconductor device described in Embodiment 1 in that a first opening formed in the insulating film 305, the insulating film 306, and the insulating film 312 and a second opening formed in the insulating film 314 are formed over the conductive film 304b, and the second opening is positioned on an inner side than the first opening.

The insulating film 305 over the conductive film 304b of the semiconductor device in FIG. 14 may be removed in the formation step of the openings 372, 372a, 372b, and 372c in FIG. 6A. As a result, the first opening can be formed in the insulating film 305, the insulating film 306, and the insulating film 312.

As illustrated in FIG. 6C, when a mask is formed over the desired regions by the fifth patterning and regions not covered with the mask are etched, the insulating film 313 is etched in each of the openings; thus, variations in etching amounts in the etching step can be reduced. As a result, yield in the manufacturing process of the semiconductor device can be increased.

Modification Example 5

In the semiconductor device in this embodiment and modification examples, in the transistors provided in the driver circuit portion and the pixel portion, the conductive films 310a, 310b, 310d, and 310e are provided over the oxide semiconductor films 308a and 308b; however, the conductive films 310a, 310b, 310d, and 310e may be provided between the insulating film 306 and the oxide semiconductor film 308a and between the insulating film 306 and the oxide semiconductor film 308b.

Modification Example 6

In the semiconductor device in this embodiment and modification examples, the shapes of the transistors provided in the driver circuit portion and the pixel portion are not limited to the shapes of the transistors illustrated in FIGS. 2A and 2B and can be changed as appropriate. For example, in the transistor, a top surface of the conductive film 310d which faces the conductive film 310e has a U shape (or a C shape, a square-bracket-like shape, or a horseshoe shape) in a region overlapping with the oxide semiconductor film 308b and may have a shape surrounding the conductive film 310e. With such a shape, a sufficient channel width can be ensured even when the area of the transistor is small, and accordingly, the amount of drain current flowing at the time of conduction of the transistor (also referred to as an on-state current) can be increased.

Modification Example 7

In the semiconductor device in this embodiment and modification examples, although a channel-etched transistor is described as the transistor provided in the driver circuit portion and the pixel portion, a channel-protective transistor can be used instead of the channel-etched transistor. When the channel protective film is provided, surfaces of the oxide semiconductor films 308a and 308b are not exposed to an etchant or an etching gas used in a formation process of the conductive film, so that impurities between the oxide semiconductor film 308a and the channel protective film and between the oxide semiconductor film 308b and the channel protective film can be reduced. Accordingly, a leakage current flowing between the source electrode and the drain electrode of the transistor can be reduced.

Modification Example 8

In the semiconductor device in this embodiment and modification examples, although the transistor including one gate electrode is described as the transistors provided in the driver circuit portion and the pixel portion, a transistor which includes two gate electrodes that face each other with the oxide semiconductor film 308a positioned therebetween and a transistor which includes two gate electrodes that face each other with the oxide semiconductor film 308b positioned therebetween can be used alternatively.

For example, a conductive film serving as a gate electrode is provided over the insulating film 314, whereby a transistor which includes two gate electrodes that face each other with the oxide semiconductor film 308a positioned therebetween and a transistor which includes two gate electrodes that face each other with the oxide semiconductor film 308b positioned therebetween can be fabricated. The conductive film may be formed at the same time as the light-transmitting conductive films 316a and 316b. Further, the conductive film overlaps with at least channel regions of the oxide semiconductor films 308a and 308b. Same potentials or different potentials may be applied to the two gate electrodes that face each other with the oxide semiconductor film 308a positioned therebetween and to the two gate electrodes that face each other with the oxide semiconductor film 308b positioned therebetween. Alternatively, it is possible that a given potential is applied to one gate electrode and a fixed potential or a ground potential is applied to the other gate electrode.

In addition, the provision of the conductive film serving as a gate electrode over the insulating film 314 leads to a reduction in effect of a change in ambient electric field on the oxide semiconductor films 308a and 308b; therefore, the reliability of the transistor can be improved. Further, the threshold voltage of the transistor can be controlled.

Embodiment 2

In this embodiment, a semiconductor device of one embodiment of the present invention is described with reference to drawings. In this embodiment, a semiconductor device of one embodiment of the present invention is described taking a liquid crystal display device as an example. Note that the same structures as those in Embodiment 1 are not described.

FIGS. 15A to 15C are cross-sectional views of a semiconductor device described in this embodiment. A cross section taken along line A-B is a cross-sectional view of a driver circuit and a cross section taken along line C-D is a cross-sectional view of a pixel circuit. Further, FIG. 15B is an enlarged view of a portion surrounded by a dashed line E in FIG. 15A and FIG. 15C is an enlarged view of a portion surrounded by a dashed line F in FIG. 15A.

In the driver circuit portion and the pixel portion of the semiconductor device in this embodiment, the shapes of openings are different from those of Embodiment 1. Specifically, in a formation step of openings, the openings are formed by etching part of a gate insulating film; and then, a light-transmitting conductive film is formed over the opening.

As illustrated in FIG. 15B, the opening 382a formed in the insulating film 306 and the opening 384a formed in the insulating films 305, 312, and 314 are provided over the conductive film 304b. The opening 384a is positioned on an inner side than the opening 382a. Through the opening 384a, the conductive film 304b is connected to the light-transmitting conductive film 316a.

Further, the opening 384b formed in the insulating films 312 and 314 is provided over the conductive film 310c. Through the opening 384b, the conductive film 310c is connected to the light-transmitting conductive film 316a.

As illustrated in FIG. 15C, the opening 384c formed in the insulating films 312 and 314 is provided over the conductive film 310e. Through the opening 384c, the conductive film 310e is connected to the light-transmitting conductive film 316b.

Further, the opening 382 is formed in the insulating film 306. The light-transmitting conductive film 308c is provided over the opening 382. In other words, in the opening 382, the light-transmitting conductive film 308c is in contact with the insulating film 305.

In this embodiment, the insulating film 305 which is in contact with the light-transmitting conductive film 308c is preferably formed using a material which prevents diffusion of impurities from the outside, such as water, an alkali metal, and an alkaline earth metal, into the oxide semiconductor film, more preferably formed using the material including hydrogen, and typically an inorganic insulating material containing nitrogen, such as a nitride insulating film, can be used.

The light-transmitting conductive film 308c is an oxide semiconductor film formed at the same time as the oxide semiconductor films 308a and 308b. The light-transmitting conductive film 308c is in contact with the insulating film 305 in the opening 382. The insulating film 305 is formed using a material which prevents diffusion of impurities from the outside, such as water, an alkali metal, and an alkaline earth metal, into the oxide semiconductor film, and the material further includes hydrogen. When hydrogen in the insulating film 305 is diffused into the oxide semiconductor film formed at the same time as the oxide semiconductor films 308a and 308b, hydrogen is bonded to oxygen and electrons serving as carriers are generated in the oxide semiconductor film. As a result, the oxide semiconductor film has higher conductivity and functions as a conductor. Here, a metal oxide which contains a material similar to those of the oxide semiconductor films 308a and 308b as a main component and has high conductivity because hydrogen concentration of the metal oxide is higher than those of the oxide semiconductor films 308a and 308b is referred to as the "light-transmitting conductive film 308c".

In the semiconductor device illustrated in this embodiment, one electrode of the capacitor is formed at the same time as the oxide semiconductor film of the transistor. In addition, the light-transmitting conductive film that serves as a pixel electrode is used as the other electrode of the capacitor. Thus, a step of forming another conductive film is not needed to form the capacitor, and the number of steps of manufacturing the semiconductor device can be reduced. Further, since the capacitor has a pair of electrodes formed with the light-transmitting conductive film, it can have a light-transmitting property. As a result, the area occupied by the capacitor can be increased and the aperture ratio in a pixel can be increased. The thickness of the insulating film 306 is small, whereby unevenness of the surfaces of the light-transmitting conductive films 316a and 316b can be reduced. Thus, alignment disorder of the liquid crystal materials contained in the liquid crystal layer 320 can be reduced. Further, a high-contrast semiconductor device can be fabricated.

<Method for Manufacturing Semiconductor Device>

A formation method of the element portion over the substrate 302 in the semiconductor device illustrated in FIGS. 15A to 15C is described with reference to FIGS. 4A to 4C, FIGS. 16A to 16C, and FIGS. 17A and 17B.

As in Embodiment 1, through the steps in FIGS. 4A to 4C, the conductive films 304a, 304b, and 304c, each of which functions as a gate, and the insulating films 305 and 306, each of which functions as a gate insulating film, are formed over the substrate 302. The conductive films 304a, 304b, and 304c, each of which functions as a gate can be formed in such a manner that a mask is formed by first patterning and regions not covered with the mask are etched.

Next, the insulating film 306 is processed into desired regions to form the openings 382a and 382. The openings 382a and 382 can be formed in such a manner that a mask is formed over the desired regions by second patterning and regions not covered with the mask are etched (see FIG. 16A).

As in Embodiment 1, after an oxide semiconductor film is formed, the oxide semiconductor film is processed into desired regions to form the island-shaped oxide semiconductor films 308a, 308b, and 308d. The oxide semiconductor films 308a, 308b, and 308d can be formed in such a manner that a mask is formed over the desired regions by third patterning and regions not covered with the mask are etched (see FIG. 16B).

Next, as in Embodiment 1, first heat treatment is preferably performed.

After a conductive film is formed over the insulating film 306 and the oxide semiconductor films 308a, 308b, and 308d, the conductive film is processed into desired regions to form the conductive films 310a, 310b, 310c, 310d, and 310e. The conductive films 310a, 310b, 310c, 310d, and 310e can be formed in such a manner that a mask is formed over the desired regions by fourth patterning and regions not covered with the mask are etched.

Figures 16A, 16B, 16C:
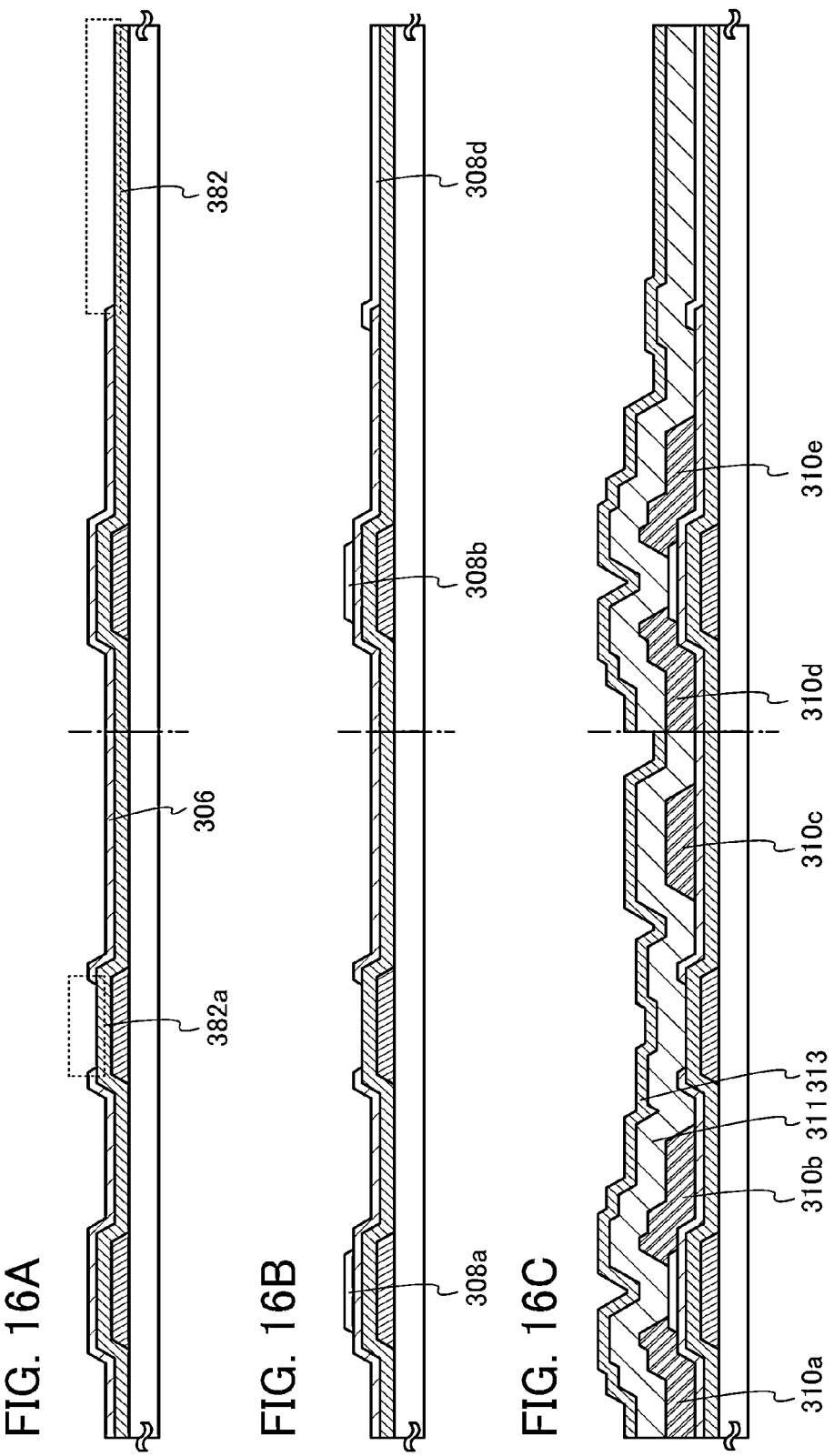
FIGS. 16A to 16C are cross-sectional views illustrating one embodiment of a method for manufacturing a semiconductor device.

Next, the insulating films 311 and 313 are formed so as to cover the insulating film 306, the oxide semiconductor films 308a, 308b, and 308d, and the conductive films 310a, 310b, 310c, 310d, and 310e (see FIG. 16C).

Next, the insulating films 311 and 313 are processed into desired regions to form the insulating films 312 and 314 and the openings 384a, 384b, and 384c. The insulating films 312 and 314 and the openings 384a, 384b, and 384c can be formed in such a manner that a mask is formed over the desired regions by fifth patterning and regions not covered with the mask are etched (see FIG. 17A).

After a conductive film is formed over the conductive film 304b, the conductive films 310c, 310d, and 310e, and the insulating film 314, the conductive film is processed into desired regions to form the light-transmitting conductive films 316a and 316b. The light-transmitting conductive films 316a and 316b can be formed in such a manner that a mask is formed over the desired regions by sixth patterning and regions not covered with the mask are etched (see FIG. 17B).

Through the above process, the pixel portion and the driver circuit portion that include the transistors can be formed over the substrate 302. In the manufacturing process described in this embodiment, the transistors and the capacitor can be formed at the same time by the first to sixth patterning, that is, with the six masks.

Embodiment 3

In this embodiment, a semiconductor device of one embodiment of the present invention is described with reference to drawings. Note that in this embodiment, a semiconductor device of one embodiment of the present invention will be described taking a liquid crystal display device as an example. In this embodiment, description is made using Embodiment 1; however, this embodiment can also be applied to Embodiment 2. Note that the description about the same structures as those in Embodiment 1 will be omitted.

Figure 18:
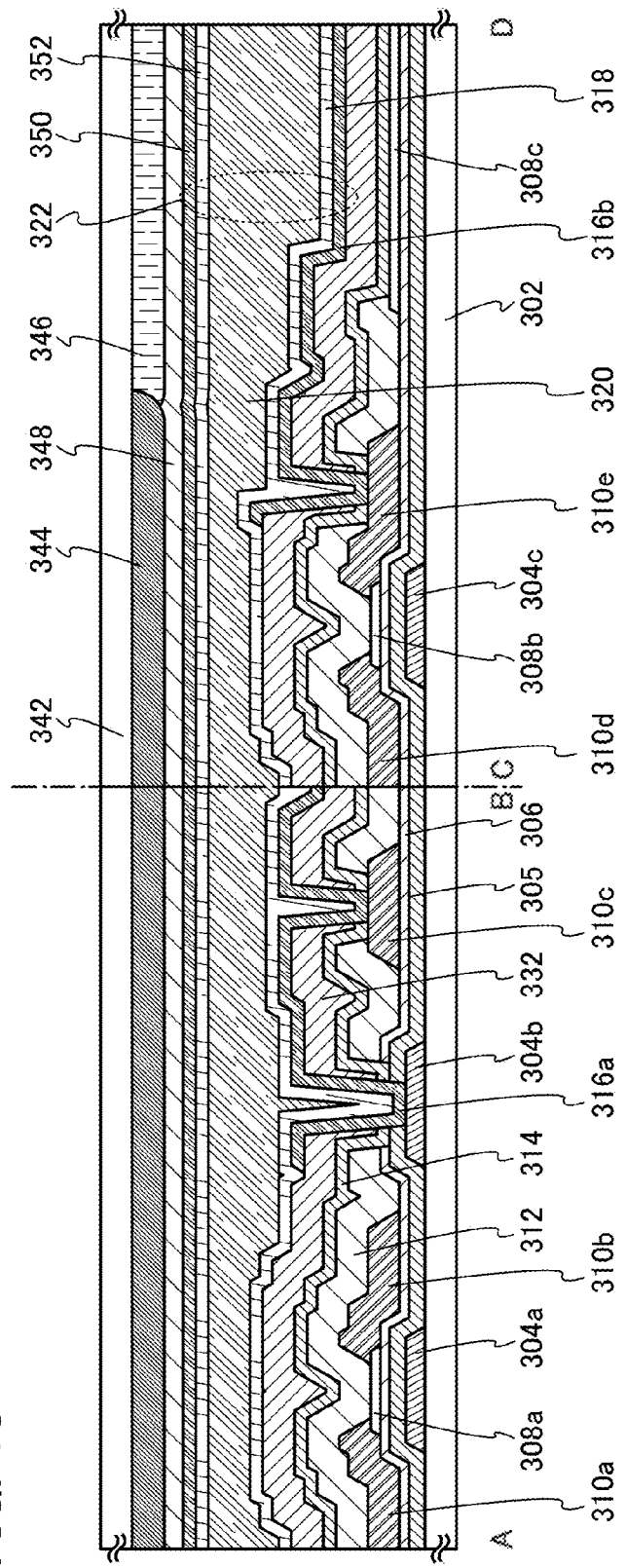
FIG. 18 is a cross-sectional view illustrating one embodiment of a semiconductor device.

FIG. 18 is a cross-sectional view of a semiconductor device described in this embodiment. A cross section taken along line A-B is a cross-sectional view of a driver circuit and a cross section taken along line C-D is a cross-sectional view of a pixel circuit.

In the semiconductor device in this embodiment, an insulating film 332 is formed over the insulating film 314, which serves as a protective film of the transistor. The insulating film 332 functions as a film that reduces unevenness, preferably a planarization layer. The provided insulating film 332 can suppress generation of parasitic capacitance between the conductive film below the insulating film 332 and the conductive film above the insulating film 332.

As the insulating film 332, a silicon oxide film formed using an organosilane gas by a CVD method can be used. The silicon oxide film has excellent step coverage. The silicon oxide film can be formed to a thickness of from 300 nm to 600 nm.

As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane (SiH$(OC_2H_5)_3$); trisdimethylaminosilane (SiH(N(CH$_3$)$_2$)$_3$); or the like.

The insulating film 332 is formed using an organosilane gas and oxygen by a CVD method at a substrate temperature of from 200° C. to 550° C., preferably from 220° C. to 500° C., further preferably from 300° C. to 450° C.

For the insulating film 332, a photosensitive organic resin or a non-photosensitive organic resin can be used; for example, an acrylic resin, a benzocyclobutene resin, an epoxy resin, a siloxane resin, or the like can be used. Because a photosensitive organic resin is used, the side surface of the opening can be curved and the step in the opening can be gentle.

When the insulating film 332 is provided over the insulating film 314, the insulating films 314 and 332 each serve as a dielectric film of the capacitor 105. The insulating film 314 is formed of a nitride insulating film, and a nitride insulating film tends to have a higher dielectric constant and a larger internal stress than those of an oxide insulating film such as a silicon oxide film. Thus, when the insulating film 314 is used alone as the dielectric film of the capacitor 105 without the insulating film 332 and the thickness of the insulating film 314 is small, the charge capacity of the capacitor 105 becomes too large to increase the speed of writing an image signal to a pixel with low power consumption. In reverse, when the thickness of the insulating film 314 is large, internal stress is too large, and degradation of electrical characteristics, such as a change in threshold voltage of a transistor, might occur. Further, when the internal stress of the insulating film 314 is too large, the insulating film 314 tends to be peeled off from the substrate 302, so that the yield is reduced. However, the insulating film 332 that has a relative dielectric constant lower than the insulating film 314 is used together with the insulating film 314 as the dielectric film of the capacitor included in the pixel, whereby the dielectric constant of the dielectric film can be adjusted to a desirable value without increasing the thickness of the insulating film 314.

Here, the insulating film 332 having planarity is provided between the insulating film 314 and each of the light-transmitting conductive films 316a and 316b; however, the insulating film 332 may be provided between the alignment film 318 and each of the light-transmitting conductive films 316a and 316b.

The above silicon oxide film is provided between the insulating film 314 and each of the light-transmitting conductive films 316a and 316b or between the alignment film 318 and each of the light-transmitting conductive films 316a and 316b, whereby the planarity of the surfaces of the light-transmitting conductive films 316a and 316b can be improved.

Embodiment 4

In this embodiment, a semiconductor device of one embodiment of the present invention is described with reference to drawings. Note that in this embodiment, a semiconductor device of one embodiment of the present invention is described taking a liquid crystal display device as an example. In this embodiment, the description is made using a fringe field switching (FFS) mode liquid crystal display device in which liquid crystal molecules are oriented with a lateral electric field. Note that the description about the same structures as those in Embodiment 1 is omitted.

Figure 19:
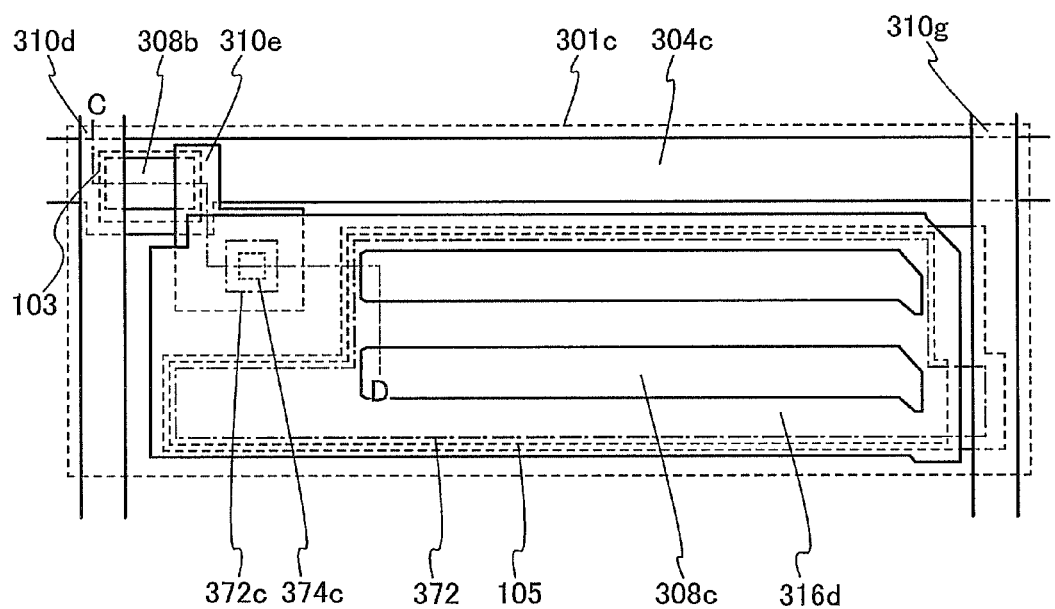
FIG. 19 is a top view illustrating one embodiment of a semiconductor device.

FIG. 19 is a top view of a pixel 301c in an FFS mode liquid crystal display device.

A conductive film 304c serving as a scan line extends substantially perpendicularly to the signal line (in the horizontal direction in the drawing). A conductive film 310d serving as a signal line extends substantially perpendicularly to the scan line (in the vertical direction in the drawing). A conductive film 310g, which is connected to a common electrode and serves as a common wiring, extends in parallel to the signal line.

The transistor 103 is provided at a region where the scan line and the signal line cross each other. The transistor 103 is a transistor including the conductive film 304c serving as a gate; the gate insulating film (not illustrated in FIG. 19); an oxide semiconductor film 308b where a channel region is formed, over the gate insulating film; and the conductive films 310d and 310e serving as a source and a drain. The conductive film 304c also serves as a scan line, and a region of the conductive film 304c that overlaps with the oxide semiconductor film 308b serves as the gate of the transistor 103. In addition, the conductive film 310d also serves as a signal line, and a region of the conductive film 310d that overlaps with the oxide semiconductor film 308b serves as the source or drain of the transistor 103.

The conductive film 310e is electrically connected to the light-transmitting conductive film 316d that serves as a pixel electrode through the openings 372c and 374c.

The light-transmitting conductive film 316d functioning as a pixel electrode has an opening (a slit).

Further, the light-transmitting conductive film 308c formed at the same time as the oxide semiconductor film 308b is provided over the gate insulating film. In this embodiment, the light-transmitting conductive film 308c functions as a common electrode. The light-transmitting conductive film 308c is connected to the conductive film 310g functioning as a common wiring through the opening 372.

In this embodiment, a liquid crystal element includes the light-transmitting conductive film 308c serving as a common electrode, the light-transmitting conductive film 316d serving as a pixel electrode, and a liquid crystal layer. That is, the liquid crystal element has a light-transmitting property.

The light-transmitting conductive film 316d serving as a pixel electrode has an opening (a slit). By application of an electric field between the light-transmitting conductive film 316d serving as the pixel electrode and the light-transmitting conductive film 308c serving as the common electrode, a region where the light-transmitting conductive film 308c serving as the common electrode, the insulating film, and the light-transmitting conductive film 316d serving as the pixel electrode overlap one another functions as a capacitor and also as the liquid crystal element. Thus, orientation of the liquid crystals can be controlled in the direction parallel with the substrate.

Figure 20:
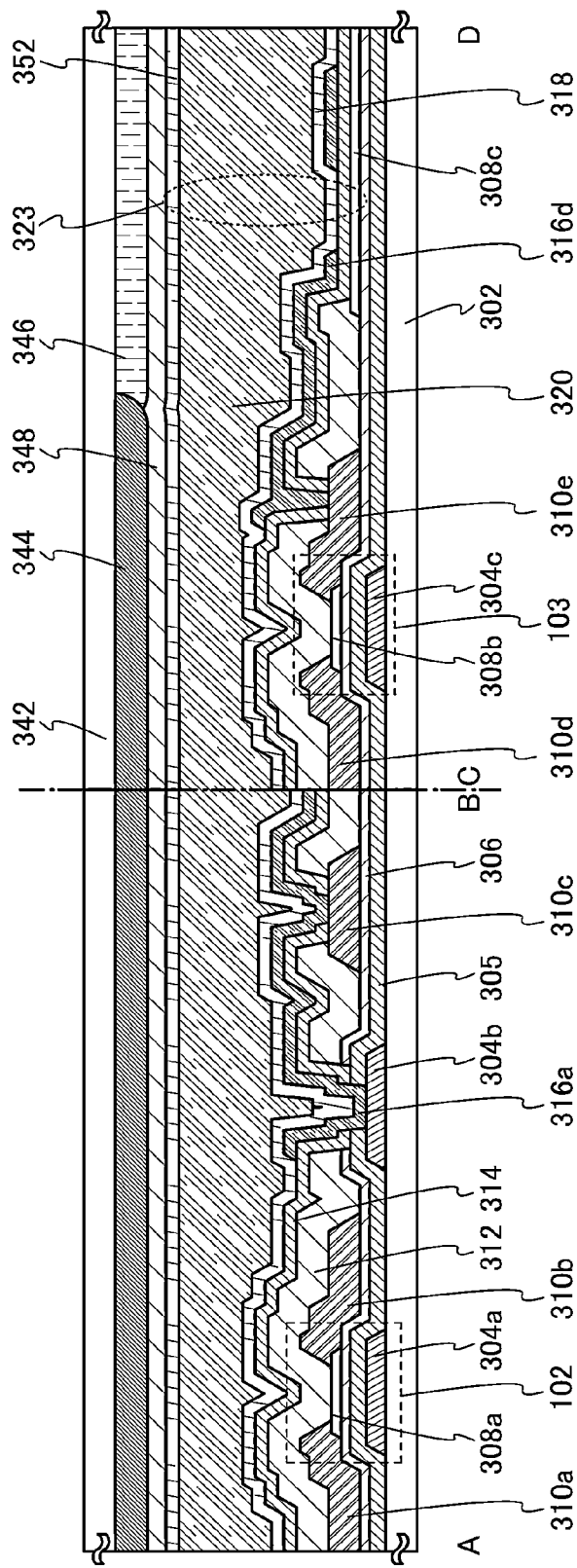
FIG. 20 is a cross-sectional view illustrating one embodiment of a semiconductor device.

Next, FIG. 20 is a cross-sectional view taken along dashed-dotted line C-D in FIG. 19. A cross section A-B in FIG. 20 is a cross-sectional view of a driver circuit.

In the liquid crystal display device described in this embodiment, a liquid crystal element 323 is provided between a pair of substrates (the substrate 302 and the substrate 342).

The liquid crystal element 323 includes the light-transmitting conductive film 308c over the substrate 302, the insulating film 314, the light-transmitting conductive film 316d, the alignment film 318, and the liquid crystal layer 320. Note that the light-transmitting conductive film 308c functions as one electrode of the liquid crystal element 323, and the light-transmitting conductive film 316d functions as the other electrode of the liquid crystal element 323. Further, this embodiment is different from Embodiment 1 in that a light-transmitting conductive film is not provided over the substrate 342 and the alignment film 352 is provided over the insulating film 348.

Further, the insulating film 314 is provided over the light-transmitting conductive film 308c serving as the common electrode and the light-transmitting conductive film 316d serving as the pixel electrode is formed over the insulating film 314. That is, a pair of electrodes included in the liquid crystal element is provided over the substrate 302.

By application of a voltage between the light-transmitting conductive film 316d serving as the pixel electrode and the light-transmitting conductive film 308c serving as the common electrode, an electric field is generated between the light-transmitting conductive film 308c serving as the common electrode, the insulating film, and the light-transmitting conductive film 316d serving as the pixel electrode and orientation of the liquid crystal molecules can be controlled in the direction parallel with the substrate. Thus, an FFS mode liquid crystal display device achieves a wide viewing angle and high image quality.

Embodiment 5

In this embodiment, a structure of a transistor that can be used in the driver circuit portions and the pixel portions described in Embodiments 1 to 3 is described with reference to FIGS. 21A to 21D.

Figure 21A:
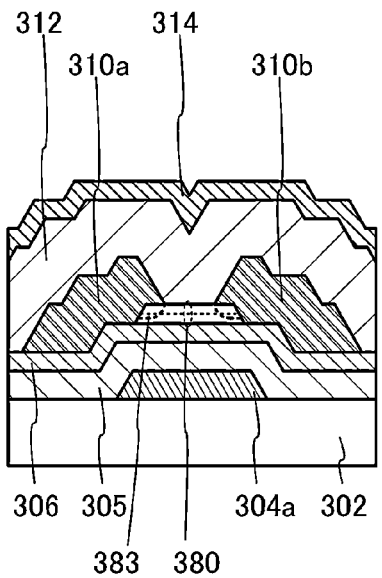
FIGS. 21A to 21D are a cross-sectional view of a transistor and diagrams illustrating a multilayer film.

The transistor illustrated in FIG. 21A includes the conductive film 304a over the substrate 302, the insulating films 305 and 306 over the substrate 302 and the conductive film 304a, a multilayer film 380 over the insulating film 306, and the conductive films 310a and 310b over the insulating film 306 and the multilayer film 380. The transistor illustrated in FIG. 21A can further be provided with the insulating films 312 and 314 over the transistor, specifically, over the multilayer film 380 and the conductive films 310a and 310b.

Note that depending on the kind of conductive films used for the conductive films 310a and 310b, oxygen is removed from part of the multilayer film 380 or a mixed layer is formed so that a pair of n-type regions 383 is formed in the multilayer film 380 in some cases. In FIG. 21A, the n-type regions 383 can be formed in regions of the multilayer film 380 which are in the vicinity of the interface with the conductive films 310a and 310b. The n-type regions 383 can function as source and drain regions.

In the transistor illustrated in FIG. 21A, the conductive film 304a functions as a gate, the conductive film 310a functions as one of a source and a drain, and the conductive film 310b functions as the other of the source and the drain.

In the transistor illustrated in FIG. 21A, the distance in a region of the multilayer film 380 that overlaps with the conductive film 304a and that is between the conductive film 310a and the conductive film 310b is referred to as a channel length. A channel region refers to a region of the multilayer film 380 that overlaps with the conductive film 304a and that is sandwiched between the conductive film 310a and the conductive film 310b. A channel refers to a region through which current mainly flows in the channel region. In addition, the channel formation region includes a channel region and corresponds to the multilayer film 380 here.

Here, the multilayer film 380 is described in detail with reference to FIG. 21B.

Figure 21B:
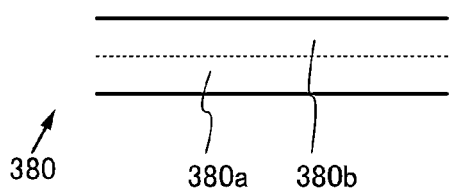

FIG. 21B is an enlarged view of a region of the multilayer film 380 which is surrounded by the broken line in FIG. 21A. The multilayer film 380 includes an oxide semiconductor film 380a and an oxide film 380b.

The oxide semiconductor film 380a preferably includes a film represented by an In-M-Zn oxide that contains at least indium (In), zinc (Zn), and M (M is a metal such as Al, Ga, Y, Zr, Sn, La, Ce, or Hf). The oxide semiconductor materials, the formation method, and the like that can be used for the oxide semiconductor films 308a and 308b described in the above embodiments can be referred to for those of the oxide semiconductor film 380a.

The oxide film 380b contains one or more kinds of elements contained in the oxide semiconductor film 380a. The energy at the bottom of the conduction band of the oxide film 380b is located closer to the vacuum level than that of the oxide semiconductor film 380a by 0.05 eV or more, 0.07 eV or more, 0.1 eV or more, or 0.15 eV or more and 2 eV or less, 1 eV or less, 0.5 eV or less, or 0.4 eV or less. In this case, when an electric field is applied to the conductive film 304a functioning as a gate, a channel is formed in the oxide semiconductor film 380a having the lowest energy at the bottom of the conduction band in the multilayer film 380. In other words, the oxide film 380b is placed between the oxide semiconductor film 380a and the insulating film 312, whereby the channel of the transistor can be formed in the oxide semiconductor film 380a not in contact with the insulating film 312.

Since the oxide film 380b contains one or more elements contained in the oxide semiconductor film 380a, interface scattering is unlikely to occur at the interface between the oxide semiconductor film 380a and the oxide film 380b. Thus, transfer of carriers is not inhibited between the oxide semiconductor film 380a and the oxide film 380b, resulting in an increase in the field-effect mobility of the transistor. Moreover, an interface state is unlikely to be formed between the oxide semiconductor film 380a and the oxide film 380b. If an interface state is formed at an interface between the oxide film 380b and the oxide semiconductor film 380a, a second transistor in which the interface serves as a channel and which has a different threshold voltage might be formed and the apparent threshold voltage of the transistor might vary. Thus, with the oxide film 380b, variations in the electrical characteristics of the transistors, such as threshold voltage, can be reduced.

As the oxide film 380b, an oxide film that is represented by an In-M-Zn oxide (M is a metal such as Al, Ti, Ga, Y, Zr, Sn, La, Ce, or Hf) and contains a larger amount of M in an atomic ratio than that in the oxide semiconductor film 380a is used. Specifically, the amount of any of the above elements in the oxide film 380b in an atomic ratio is one and a half times or more, preferably two times or more, more preferably three times or more as large as that in the oxide semiconductor film 380a in an atomic ratio. Any of the above elements is more strongly bonded to oxygen than indium is, and thus can suppress generation of an oxygen vacancy in the oxide film. In other words, the oxide film 380b is an oxide film in which oxygen vacancies are less likely to be generated than in the oxide semiconductor film 380a.

That is to say, when each of the oxide semiconductor film 380a and the oxide film 380b is an In-M-Zn oxide containing at least indium, zinc, and M (M is a metal such as Al, Ti, Ga, Y, Zr, Sn, La, Ce, or Hf), the atomic ratio of In to M and Zn in the oxide film 380b is $x_1:y_1:z_1$, and the atomic ratio of In to M and Zn in the oxide semiconductor film 380a is $x_2:y_2:z_2$, $y_1/x_1$ is preferably larger than $y_2/x_2$. $y_1/x_1$ is one and a half times or more, preferably two times or more, more preferably three times or more as large as $y_2/x_2$. At this time, when $y_1$ is greater than or equal to $x_1$ in the oxide film 380b, a transistor can have stable electrical characteristics. However, when $y_1$ is three times or more as large as $x_1$, the field-effect mobility of the transistor is reduced; accordingly, $y_1$ is preferably smaller than 3 times $x_1$.

When the oxide semiconductor film 380a is an In-M-Zn oxide, the atomic ratio of In to M is preferably as follows: the proportion of In is 25 atomic % or higher and the proportion of M is lower than 75 atomic %; more preferably, the proportion of In is 34 atomic % or higher and the proportion of M is lower than 66 atomic %. When the oxide film 380b is an In-M-Zn oxide, it is preferable that, in the atomic ratio of In and m, the proportion of In be lower than 50 atomic % and the proportion of M be 50 atomic % or higher, and it is more preferable that, in the atomic ratio of In and m, the proportion of In be lower than 25 atomic % and the proportion of M be 75 atomic % or higher.

For the oxide semiconductor film 380a and the oxide film 380b, oxide semiconductors containing indium, zinc, and gallium can be used. Specifically, the oxide semiconductor film 380a can be formed using an In—Ga—Zn oxide whose atomic ratio of In to Ga and Zn is 1:1:1, an In—Ga—Zn oxide whose atomic ratio of In to Ga and Zn is 3:1:2, or a metal oxide target having a composition in the neighborhood of any of the above atomic ratios. The oxide film 380b can be formed using an In—Ga—Zn oxide whose atomic ratio of In to Ga and Zn is 1:3:2, an In—Ga—Zn oxide whose atomic ratio of In to Ga and Zn is 1:3:4, an In—Ga—Zn oxide whose atomic ratio of In to Ga and Zn is 1:6:2, an In—Ga—Zn oxide whose atomic ratio of In to Ga and Zn is 1:6:4, an In—Ga—Zn oxide whose atomic ratio of In to Ga and Zn is 1:6:10, an In—Ga—Zn oxide whose atomic ratio of In to Ga and Zn is 1:9:6, or a metal oxide target having a composition in the neighborhood of any of the above atomic ratios.

The thickness of the oxide semiconductor film 380a is from 3 nm to 200 nm, preferably from 3 nm to 100 nm, more preferably from 3 nm to 50 nm. The thickness of the oxide film 380b is from 3 nm to 100 nm, preferably from 3 nm to 50 nm.

Next, the band structure of the multilayer film 380 is described with reference to FIGS. 21C and 21D.

For example, the oxide semiconductor film 380a is formed using an In—Ga—Zn oxide having an energy gap of 3.15 eV, and the oxide film 380b is formed using an In—Ga—Zn oxide having an energy gap of 3.5 eV. Note that the energy gap can be measured using a spectroscopic ellipsometer (UT-300 manufactured by HORIBA JOBIN YVON S.A.S.).

The energy gaps between the vacuum levels and the tops of the valence bands (also called ionization potential) of the oxide semiconductor film 380a and the oxide film 380b are 8 eV and 8.2 eV, respectively. Note that the energy difference between the vacuum level and the top of the valence band can be measured using an ultraviolet photoelectron spectroscopy (UPS) device (VersaProbe manufactured by ULVAC-PHI, Inc.).

Thus, the energy gaps between the vacuum levels and the bottoms of the conduction bands (also called electron affinity) of the oxide semiconductor film 380a and the oxide film 380b are 4.85 eV and 4.7 eV, respectively.

Figure 21C:
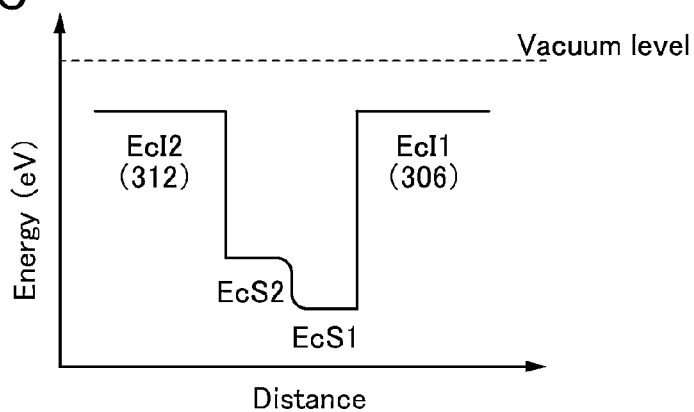

FIG. 21C schematically illustrates a part of the band structure of the multilayer film 380. Here, a structure where silicon oxide films are provided in contact with the multilayer film 380 is described. In FIG. 21C, EcI1 denotes the energy of the bottom of the conduction band in the silicon oxide film; EcS1 denotes the energy of the bottom of the conduction band in the oxide semiconductor film 380a; EcS2 denotes the energy of the bottom of the conduction band in the oxide film 380b; and EcI2 denotes the energy of the bottom of the conduction band in the silicon oxide film. Further, EcI1 corresponds to the insulating film 306 in FIG. 21A, and EcI2 corresponds to the insulating film 312 in FIG. 21A.

As shown in FIG. 21C, there is no barrier at the interface between the oxide semiconductor film 380a and the oxide film 380b, and the energy of the bottom of the conduction band is changed smoothly. In other words, the energy level of the bottom of the conduction band is continuously changed. This is because the multilayer film 380 contains an element contained in the oxide semiconductor film 380a and oxygen is transferred between the oxide semiconductor film 380a and the oxide film 380b, so that a mixed layer is formed.

As shown in FIG. 21C, the oxide semiconductor film 380a in the multilayer film 380 serves as a well and a channel region of the transistor including the multilayer film 380 is formed in the oxide semiconductor film 380a. Note that since the energy of the bottom of the conduction band of the multilayer film 380 is continuously changed, it can be said that the oxide semiconductor film 380a and the oxide film 380b make a continuous junction.

Although trap levels due to impurities or defects might be formed in the vicinity of the interface between the oxide film 380b and the insulating film 312, the oxide semiconductor film 380a can be distanced from the trap levels owing to existence of the oxide film 380b as shown in FIG. 21C. However, when the energy difference between EcS1 and EcS2 is small, an electron in the oxide semiconductor film 380a might reach the trap level by passing over the energy difference. Since an electron is captured by the trap level to produce a negative charge at interface with the insulating film, the threshold voltage of the transistor is shifted to the positive side. Therefore, it is preferable that the energy difference between EcS1 and EcS2 be 0.1 eV or more, more preferably 0.15 eV or more, because a change in the threshold voltage of the transistor is prevented and stable electrical characteristics are obtained.

Figure 21D:
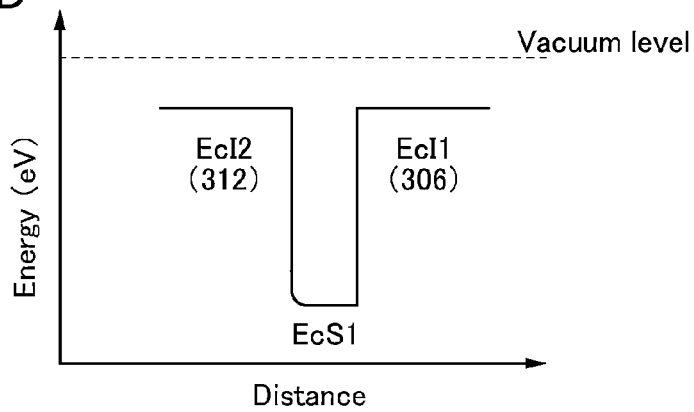

FIG. 21D schematically illustrates a part of the band structure of the multilayer film 380, which is a variation of the band structure shown in FIG. 21C. Here, a structure where silicon oxide films are provided in contact with the multilayer film 380 is described. In FIG. 21D, EcI1 denotes the energy of the bottom of the conduction band in the silicon oxide film; EcS1 denotes the energy of the bottom of the conduction band in the oxide semiconductor film 380a; and EcI2 denotes the energy of the bottom of the conduction band in the silicon oxide film. Further, EcI1 corresponds to the insulating film 306 in FIG. 21A, and EcI2 corresponds to the insulating film 312 in FIG. 21A.

In the transistor illustrated in FIG. 21A, an upper portion of the multilayer film 380, that is, the oxide film 380b might be etched in formation of the conductive films 310a and 310b. However, a mixed layer of the oxide semiconductor film 380a and the oxide film 380b is likely to be formed on the top surface of the oxide semiconductor film 380a in formation of the oxide film 380b.

For example, when the oxide semiconductor film 380a is an In—Ga—Zn oxide formed with use of a metal oxide target whose atomic ratio of In to Ga and Zn is 1:1:1 or an In—Ga—Zn oxide whose atomic ratio of In to Ga and Zn is 3:1:2, and the oxide film 380b is an In—Ga—Zn oxide formed with a metal oxide target whose atomic ratio of In to Ga and Zn is 1:3:2 or an In—Ga—Zn oxide whose atomic ratio of In to Ga and Zn is 1:6:4, the Ga content in the oxide film 380b is higher than that in the oxide semiconductor film 380a. Thus, a GaOx layer or a mixed layer whose Ga content is higher than that in the oxide semiconductor film 380a can be formed on the top surface of the oxide semiconductor film 380a.

For that reason, even if the oxide film 380b is etched, the energy of the bottom of the conduction band of EcS1 on the EcI2 side is increased and thus the band structure shown in FIG. 21D can be obtained.

As in the band structure shown in FIG. 21D, in observation of a cross section of a channel region, only the oxide semiconductor film 380a in the multilayer film 380 is apparently observed in some cases. However, a mixed layer that contains Ga more than the oxide semiconductor film 380a does is formed over the oxide semiconductor film 380a in fact, and thus the mixed layer can be regarded as a 1.5-th layer. Note that the mixed layer can be confirmed by analyzing a composition in the upper portion of the oxide semiconductor film 380a, when the elements contained in the multilayer film 380 are measured by an EDX analysis, for example. The mixed layer can be confirmed, for example, in such a manner that the Ga content in the composition in the upper portion of the oxide semiconductor film 380a is larger than the Ga content in the oxide semiconductor film 380a.

In this embodiment, the multilayer film 380 has a two-layer structure where the oxide semiconductor film 380a and the oxide film 380b are stacked as an example, but this example does not limit the present invention and a stacked structure of three or more layers can be employed. For example, as a three-layer structure, another layer may be provided under the multilayer film 380, i.e., under the oxide semiconductor film 380a. As a film under the oxide semiconductor film 380a, a film similar to the oxide film 380b can be applied for example.

The structure described in this embodiment can be used in appropriate combination with any structure in the other embodiments.

Embodiment 6

In this embodiment, the oxide semiconductor film and the light-transmitting conductive film included in the semiconductor device described in the above embodiments are described. The light-transmitting conductive film is a film formed at the same time as the oxide semiconductor film and having high conductivity by being contact with a nitride insulating film, such as the light-transmitting conductive film 308c in FIGS. 3A to 3C.

The oxide semiconductor film and the light-transmitting conductive film can be formed using any of an amorphous oxide semiconductor, a single crystal oxide semiconductor, and a polycrystalline oxide semiconductor. Alternatively, the oxide semiconductor film and the light-transmitting conductive film may be formed using an oxide semiconductor including a crystal part (CAAC-OS).

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In this specification, a simple term "perpendicular" includes a range from 85° to 95°. In addition, a simple term "parallel" includes a range from −5° to 5°.

In the CAAC-OS, distribution of crystal parts is not necessarily uniform. For example, in the formation process of the CAAC-OS, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS, the crystal part in a region to which the impurity is added becomes amorphous in some cases. Accordingly, when the concentration of impurities (silicon or carbon as a typical example) in the CAAC-OS is less than or equal to $2.5 \times 10^{21}$ atoms/cm$^3$, a CAAC-OS having high crystallinity can be formed.

<Localized Level of CAAC-OS Film>

A localized level of a CAAC-OS film as an oxide semiconductor film is described. Here, measurement results of a CAAC-OS film by a constant photocurrent method (CPM) are described.

First, a structure of a sample subjected to CPM measurement is described.

The measurement sample includes a CAAC-OS film provided over a glass substrate, a pair of electrodes in contact with the CAAC-OS film, and an insulating film covering the CAAC-OS film and the pair of electrodes.

Next, a method for forming the CAAC-OS film included in the measurement sample is described.

The CAAC-OS film was formed by a sputtering method under the following conditions: a metal oxide target which is an In—Ga—Zn-oxide target (In:Ga:Zn=1:1:1 [atomic ratio]) was used; an argon gas with a flow rate of 30 sccm and an oxygen gas with a flow rate of 15 sccm were used as a deposition gas; the pressure was 0.4 Pa; the substrate temperature was 400° C.; and a DC power of 0.5 kW was supplied. Then, heat treatment at 450° C. in a nitrogen atmosphere for one hour was performed and then heat treatment at 450° C. in an oxygen atmosphere for one hour was performed to release hydrogen contained in the CAAC-OS film and supply oxygen to the CAAC-OS film.

Next, the measurement sample including the CAAC-OS film was subjected to CPM measurement. Specifically, the amount of light with which a surface of the measurement sample between terminals is irradiated is adjusted so that a photocurrent value is kept constant in the state where voltage is applied between a first electrode and a second electrode provided in contact with the CAAC-OS film, and then an absorption coefficient is calculated from the amount of the irradiation light in an intended wavelength range.

Figure 31:
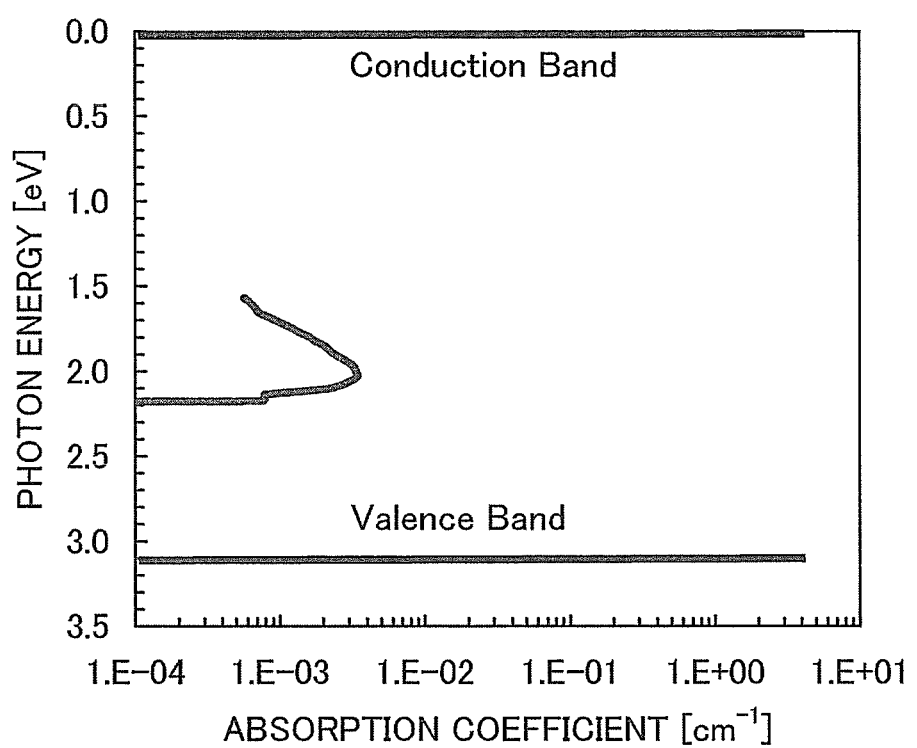
FIG. 31 is a graph showing results of CPM measurement of an oxide semiconductor film.

An absorption coefficient shown in FIG. 31 was obtained by removing an absorption coefficient due to the band tail from an absorption coefficient obtained by CPM measurement of the measurement sample. That is, an absorption coefficient due to defects is shown in FIG. 31. In FIG. 31, the horizontal axis indicates the absorption coefficient, and the vertical axis indicates the photon energy. The bottom of the conduction band and the top of the valence band of the CAAC-OS film are set to 0 eV and 3.15 eV, respectively, on the vertical axis in FIG. 31. A curve in FIG. 31 represents a relation between the absorption coefficient and photon energy, which corresponds to defect levels.

In the curve in FIG. 31, an absorption coefficient due to defect levels is $5.86 \times 10^{-4}$ cm$^{-1}$. That is, in the CAAC-OS film, the absorption coefficient due to defect levels is less than $1 \times 10^{-3}$/cm, preferably less than $1 \times 10^{-4}$/cm; thus the CAAC-OS film is a film having a low density of defect levels.

The film density of the CAAC-OS film was measured by X-ray reflectometry (XRR). The film density of the CAAC-OS film was 6.3 g/cm$^3$. That is, the CAAC-OS film is a film having a high film density.

<Observation Results of Electron Diffraction Pattern of CAAC-OS Film>

Next, observation results of electron diffraction patterns of a CAAC-OS film are described.

The CAAC-OS film used in this embodiment is an In—Ga—Zn oxide film which is formed by a sputtering method using a deposition gas containing oxygen and a metal oxide target of an In—Ga—Zn oxide (having an atomic ratio of In:Ga:Zn=1:1:1).

Figure 38:
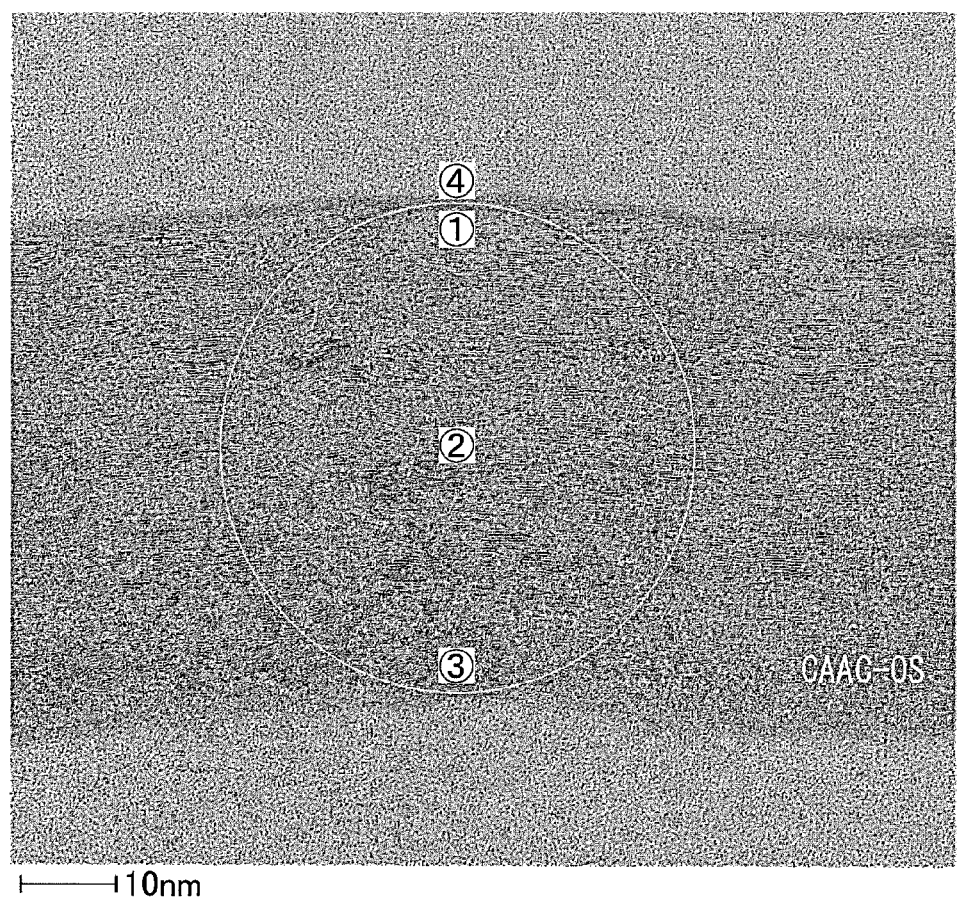
FIG. 38 is a cross-sectional TEM image of a CAAC-OS film.

FIG. 38 is a cross-sectional transmission electron microscopy (TEM) image of the CAAC-OS film. FIGS. 39A to 39D show electron diffraction patterns which were obtained by measurement of Points 1 to 4 in FIG. 38 using electron diffraction.

The cross-sectional TEM image shown in FIG. 38 was taken with a transmission electron microscope ("H-9000NAR" manufactured by Hitachi High-Technologies Corporation) at an acceleration voltage of 300 kV and a magnification of 2,000,000 times. The electron diffraction patterns shown in FIGS. 39A to 39D were obtained with a transmission electron microscope ("HF-2000" manufactured by Hitachi High-Technologies Corporation) at an acceleration voltage of 200 kV and beam diameters of about 1 nmφ and about 50 nmφ. Note that electron diffraction with a beam diameter of 10 nmφ or less is particularly referred to as nanobeam electron diffraction in some cases. Further, a measurement area of the electron diffraction with a beam diameter of about 1 nmφ is greater than or equal to 5 nmφ and less than or equal to 10 nmφ.

Figure 39A:
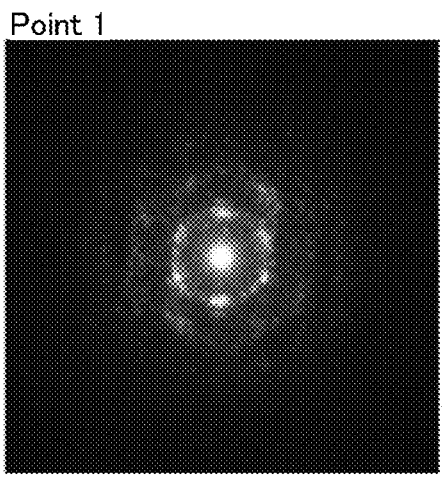
FIGS. 39A to 39D are electron diffraction patterns of a CAAC-OS film.
Figure 39B:
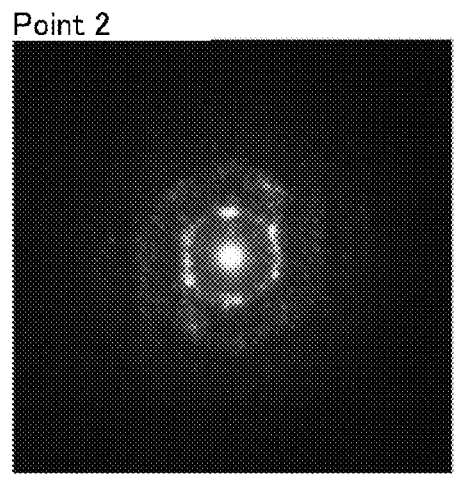
Figure 39C:
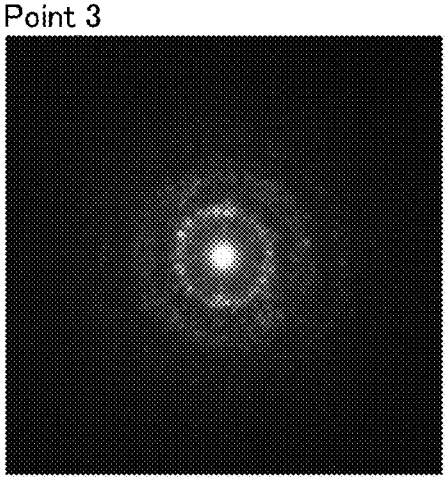
Figure 39D:
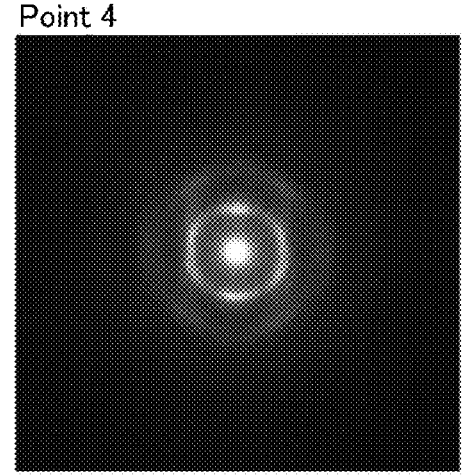

Electron diffraction patterns of Point 1 (the surface side of the film), Point 2 (the center of the film), and Point 3 (the base side of the film) shown in FIG. 38 correspond to FIGS. 39A, 39B, and 39C, respectively and are obtained with an electron-beam diameter of about 1 nmφ. An electron diffraction pattern in Point 4 (the whole film) shown in FIG. 38 corresponds to FIG. 39D and is obtained with an electron-beam diameter of about 50 nmφ.

A pattern formed by spots (bright points) is observed in each of the electron diffraction patterns of Point 1 (on the surface side of the film) and Point 2 (the center of the film), and a slightly broken pattern is observed in Point 3 (on the base side of the film). This indicates that the crystal state varies in the thickness direction in the CAAC-OS film. Note that a pattern formed by spots (bright points) is observed in Point 4 (the whole film), which indicates that the whole film is a CAAC-OS film or a film including a CAAC-OS film.

Figure 40:
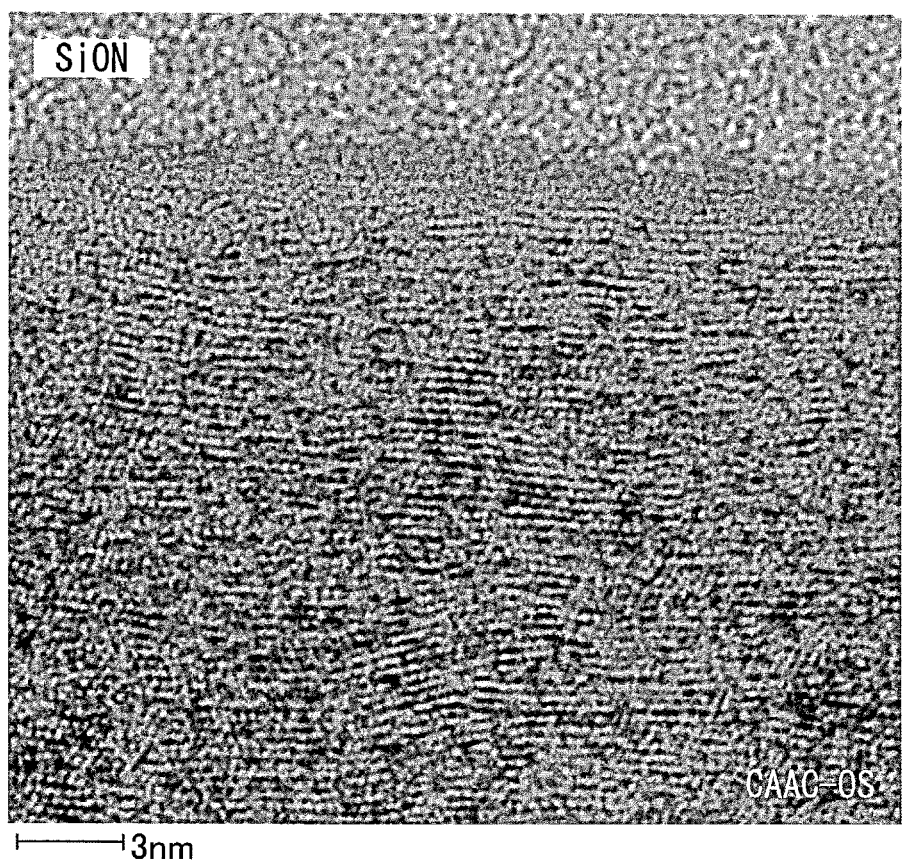
FIG. 40 is a cross-sectional TEM image of a CAAC-OS film.

FIG. 40 is an enlarged view of a portion in the vicinity of Point 1 (on the surface side of the film) in FIG. 38. In FIG. 40, a clear lattice image which shows alignment of the CAAC-OS film extends to the interface with an SiON film that is an interlayer insulating film.

Figure 41A:
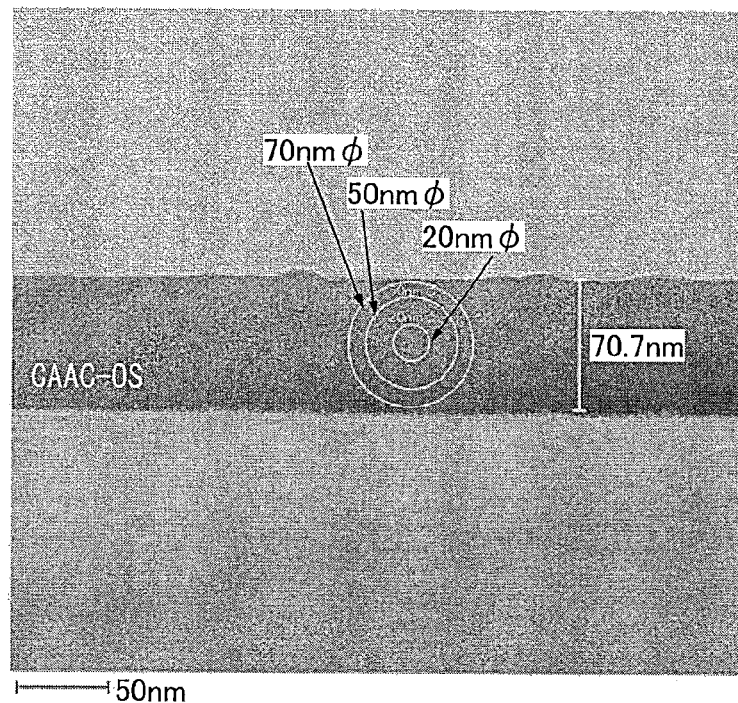
FIGS. 41A and 41B are a cross-sectional TEM image and an X-ray diffraction spectrum of a CAAC-OS film.
Figure 41B:
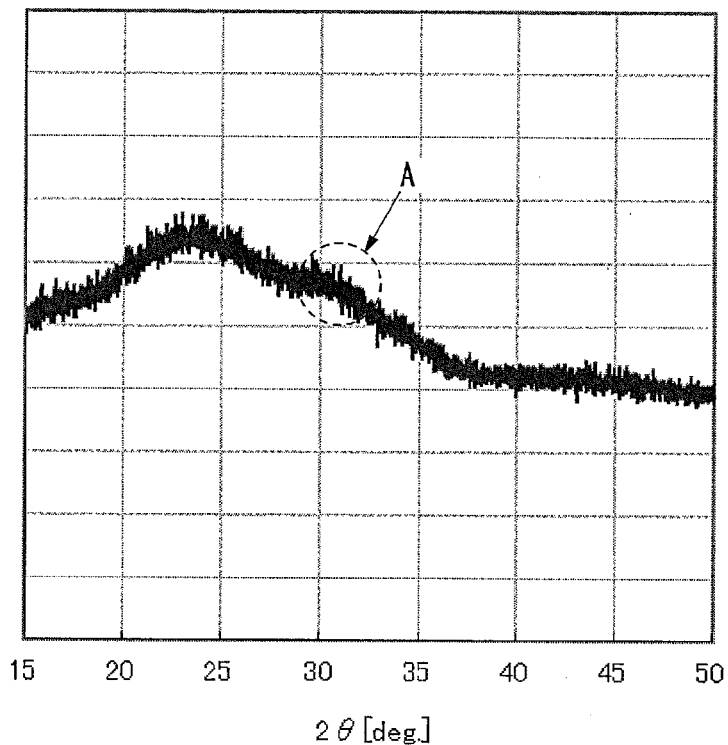
Figure 42A:
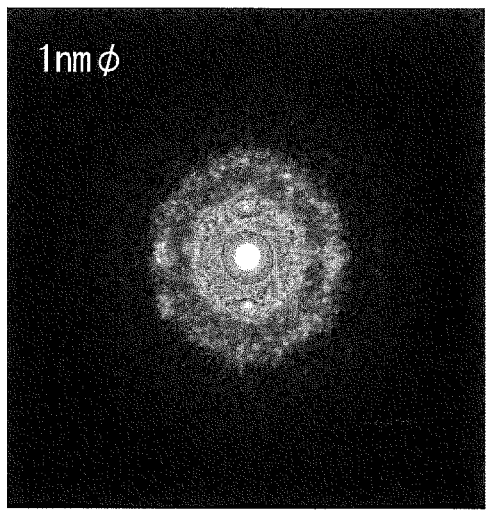
FIGS. 42A to 42D are electron diffraction patterns of a CAAC-OS film.
Figure 42B:
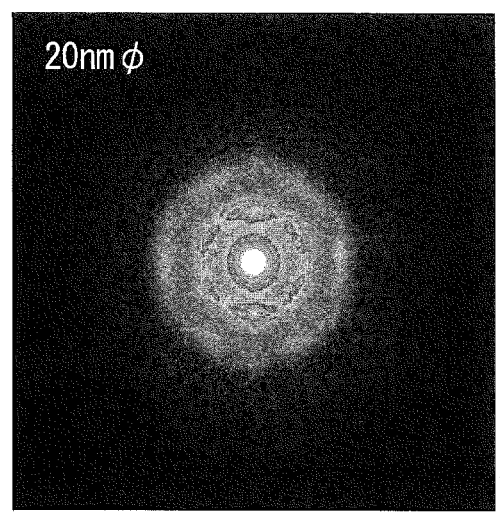
Figure 42C:
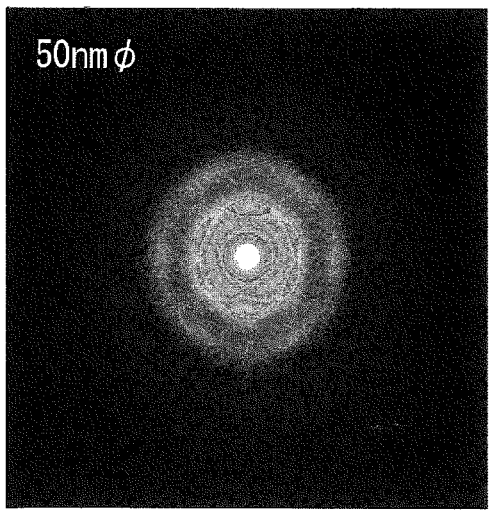
Figure 42D:
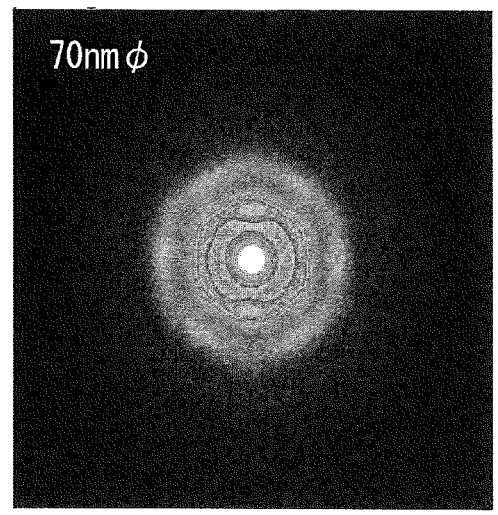

FIGS. 41A and 41B are a cross-sectional TEM photograph and an X-ray diffraction spectrum of a CAAC-OS film different from the CAAC-OS film used for the cross-sectional TEM image in FIG. 38. A CAAC-OS film may have variations, and Peak A which indicates a crystal component appears around 2θ=31° as shown in FIG. 41B, but the peak does not appear clearly in some cases.

FIGS. 42A to 42D show results of electron diffraction in regions in the CAAC-OS film with electron-beam diameters of 1 nmϕ, 20 nmϕ, 50 nmϕ, and 70 nmϕ. The regions are indicated by concentric circles in FIG. 41A. In the case of an electron-beam diameter of 1 nmϕ, a pattern formed by clear spots (bright points) can be observed as in FIGS. 39A and 39B. As the electron-beam diameter is increased, the spots (bright points) become unclear but a diffraction pattern can be observed; therefore, the whole film is a CAAC-OS film or a film including a CAAC-OS film.

Figure 43A:
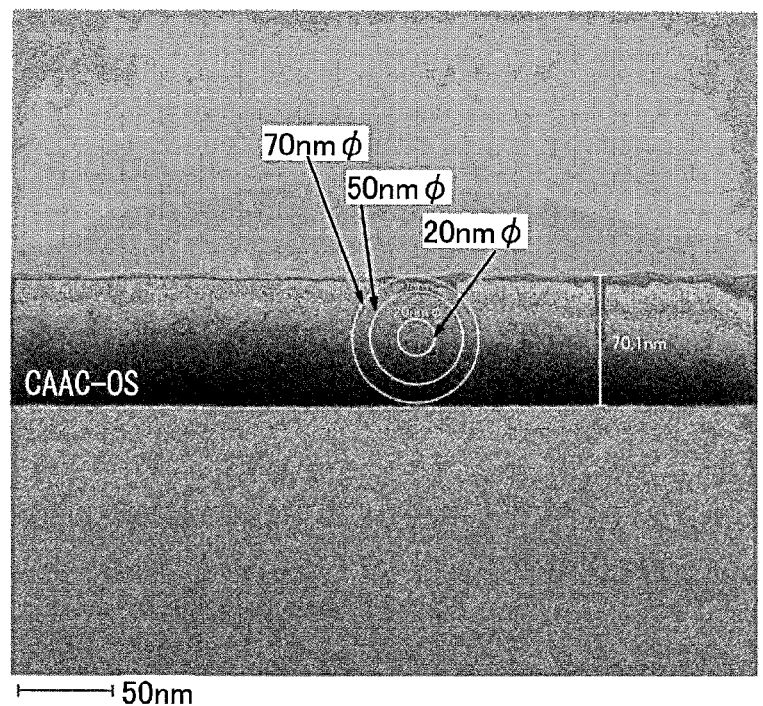
FIGS. 43A and 43B are a cross-sectional TEM image and an X-ray diffraction spectrum of a CAAC-OS film.
Figure 43B:
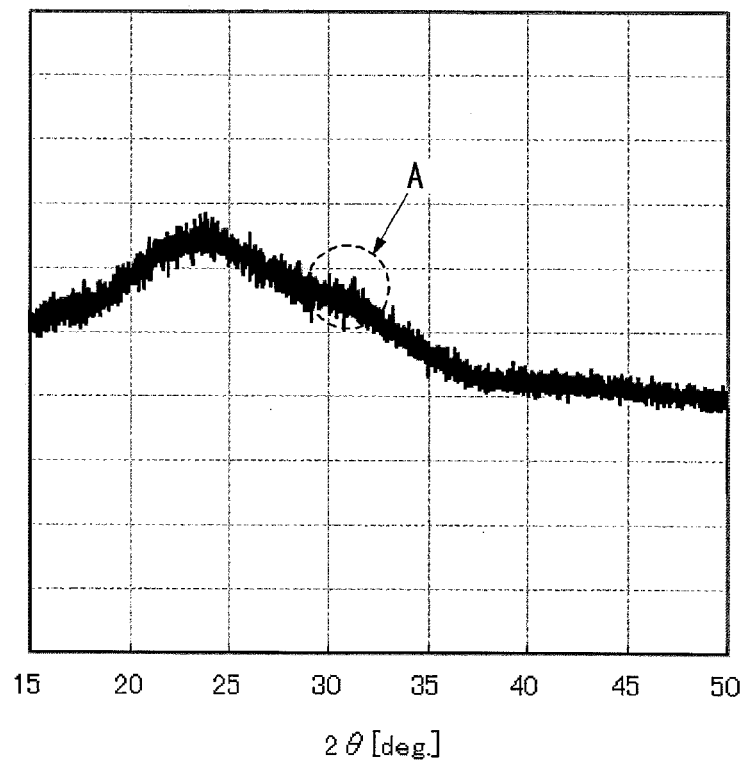
Figure 44A:
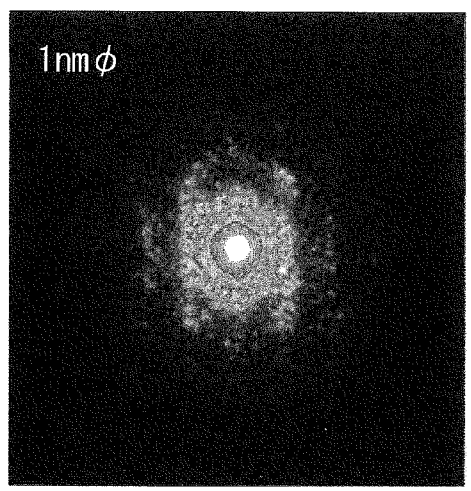
FIGS. 44A to 44D are electron diffraction patterns of a CAAC-OS film.
Figure 44B:
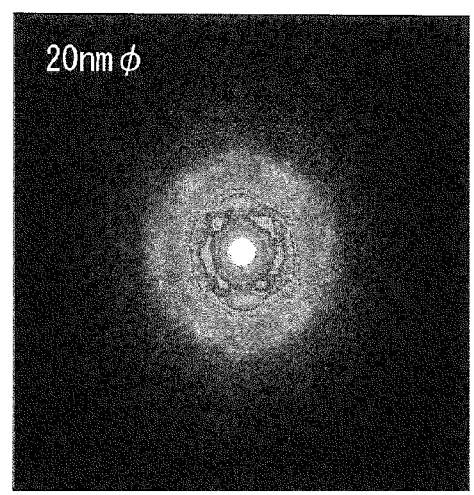
Figure 44C:
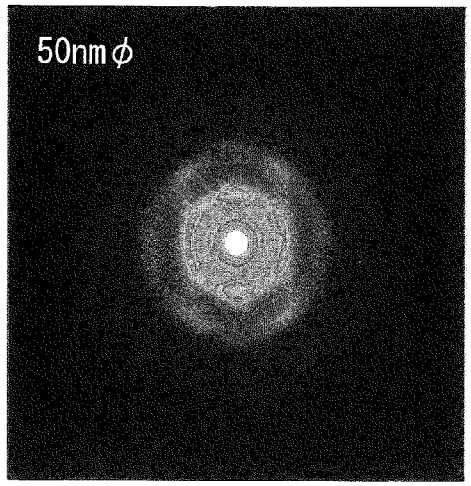
Figure 44D:
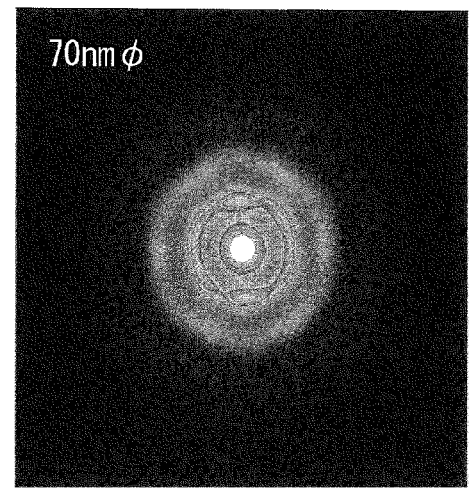

FIGS. 43A and 43B are a cross-sectional TEM image and an X-ray diffraction spectrum of the CAAC-OS film used for the cross-sectional TEM observation in FIG. 41A, which are obtained after annealing at 450° C.

FIGS. 44A to 44D show results of electron diffraction in regions in the CAAC-OS film with electron-beam diameters of 1 nmϕ, 20 nmϕ, 50 nmϕ, and 70 nmϕ. The regions are indicated by concentric circles in FIG. 43A. In the case of an electron-beam diameter of 1 nmϕ, a pattern formed by clear spots (bright points) can be observed as in the results shown in FIGS. 42A to 42D. As the electron-beam diameter is increased, the spots (bright points) become unclear but a diffraction pattern can be observed; therefore, the whole film is a CAAC-OS film or a film including a CAAC-OS film.

Figure 45A:
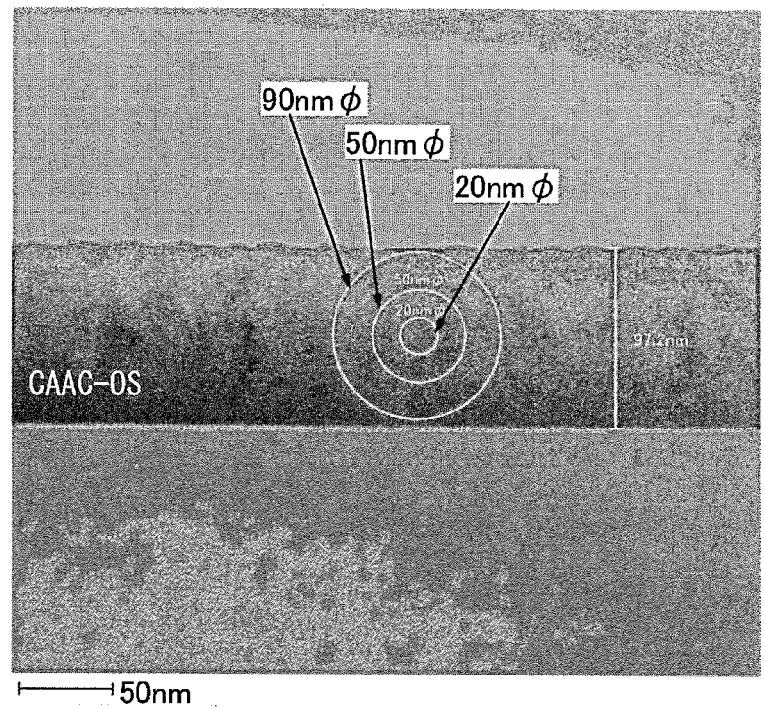
FIGS. 45A and 45B are a cross-sectional TEM image and an X-ray diffraction spectrum of a CAAC-OS film.
Figure 45B:
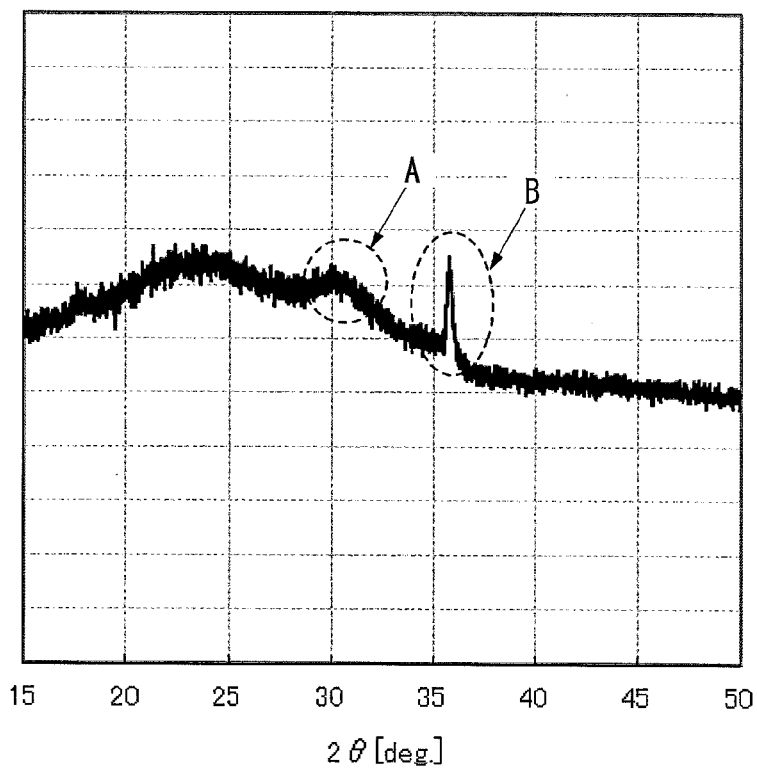
Figure 46A:
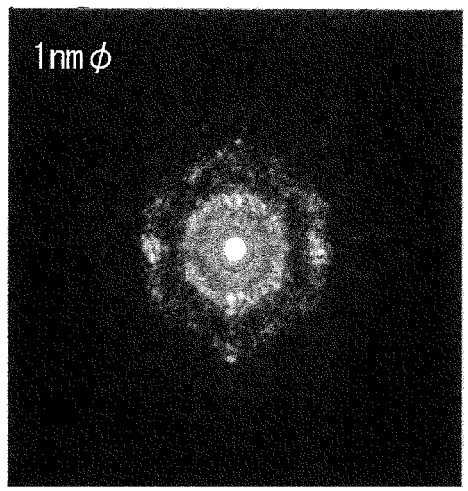
FIGS. 46A to 46D are electron diffraction patterns of a CAAC-OS film.
Figure 46B:
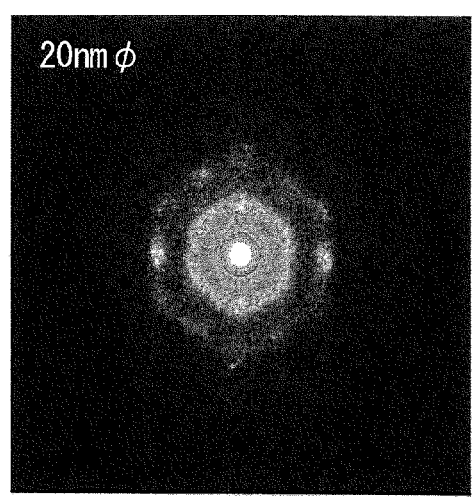
Figure 46C:
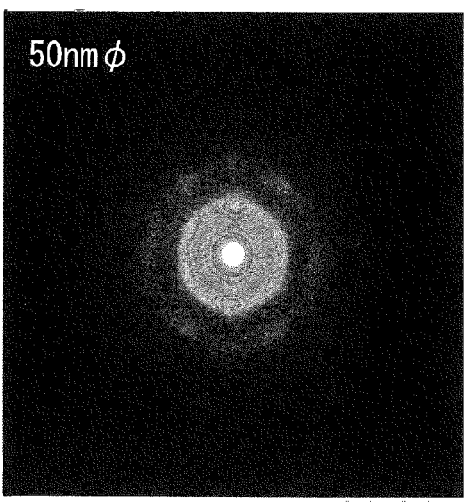
Figure 46D:
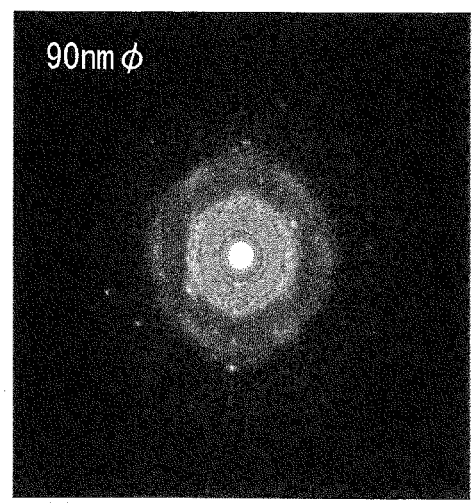

FIGS. 45A and 45B are a cross-sectional TEM image and an X-ray diffraction spectrum of a CAAC-OS film different from the CAAC-OS film used for the cross-sectional TEM image of FIG. 38 and the cross-sectional TEM observation of FIG. 41A. The CAAC-OS film has variations, and as shown in FIG. 45B, as well as Peak A indicating a crystal component around 2θ=31°, Peak B which is derived from a spinel crystal structure appears in some cases.

FIGS. 46A to 46D show results of electron diffraction in regions in the CAAC-OS film with electron-beam diameters of 1 nmϕ, 20 nmϕ, 50 nmϕ, and 90 nmϕ. The regions are indicated by concentric circles in FIG. 45A. In the case of an electron-beam diameter of 1 nmϕ, a pattern formed by clear spots (bright points) can be observed. As the electron-beam diameter is increased, the spots (bright points) become unclear but a diffraction pattern can be observed. Further, in the case of a beam diameter of 90 nmϕ, clearer spots (bright points) can be observed. Accordingly, the whole film is a CAAC-OS film or a film including a CAAC-OS film.

<Method for Forming CAAC-OS>

Since the c-axes of the crystal parts included in the CAAC-OS are aligned in the direction parallel with a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). The crystal part is formed by film formation or by performing treatment for crystallization such as heat treatment after film formation.

There are three methods for forming a CAAC-OS.

The first method is to form an oxide semiconductor film at a temperature in the range of 100° C. to 450° C. to form, in the oxide semiconductor film, crystal parts in which the c-axes are aligned in the direction parallel with a normal vector of a surface where the oxide semiconductor film is formed or a normal vector of a surface of the oxide semiconductor film.

The second method is to form an oxide semiconductor film with a small thickness and then heat it at a temperature in the range of 200° C. to 700° C., to form, in the oxide semiconductor film, crystal parts in which the c-axes are aligned in the direction parallel with a normal vector of a surface where the oxide semiconductor film is formed or a normal vector of a surface of the oxide semiconductor film.

The third method is to form a first oxide semiconductor film with a small thickness, then heat it at a temperature in the range of 200° C. to 700° C., and form a second oxide semiconductor film to form, in the second oxide semiconductor film, crystal parts in which the c-axes are aligned in the direction parallel with a normal vector of the surface where the second oxide semiconductor film is formed or to a normal vector of the top surface of the second oxide semiconductor film.

Note that the structures and the like described in this embodiment can be used as appropriate in combination with any of the structures and the like described in the other embodiments.

Embodiment 7

In this embodiment, the oxide semiconductor film and the light-transmitting conductive film included in the semiconductor device described in the above embodiments are described. The light-transmitting conductive film is a film formed at the same time as the oxide semiconductor film and having high conductivity by being contact with a nitride insulating film, such as the light-transmitting conductive film 308c in FIGS. 3A to 3C.

The oxide semiconductor film and the light-transmitting conductive film may be formed using an oxide semiconductor film having a microcrystalline structure. Here, the oxide semiconductor film having a microcrystalline structure is referred to as a microcrystalline oxide semiconductor film.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter (e.g., larger than or equal to 50 nm) larger than a diameter of a crystal part. Meanwhile, spots are shown in a nanobeam electron diffraction pattern of the nc-OS film obtained by using an electron beam having a probe diameter close to or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film having more regularity than that of the amorphous oxide semiconductor film; thus, the nc-OS film has a lower density of defect levels than that of the amorphous oxide semiconductor film. However, there is no regularity of crystal orientation between different crystal parts in the nc-OS film; hence, the nc-OS film has a higher density of defect states than that of the CAAC-OS film.

<Localized Level of Microcrystalline Oxide Semiconductor Film>

A localized level of a microcrystalline oxide semiconductor film is described. Here, measurement results of a microcrystalline oxide semiconductor film by a CPM are described.

First, a structure of a measurement sample is described.

The measurement sample includes a microcrystalline oxide semiconductor film provided over a glass substrate, a pair of electrodes in contact with the microcrystalline oxide semiconductor film, and an insulating film covering the microcrystalline oxide semiconductor film and the pair of electrodes.

Next, a method for forming the microcrystalline oxide semiconductor film included in the measurement sample is described.

A first microcrystalline oxide semiconductor film was formed by a sputtering method under the following conditions: a metal oxide target which is an In—Ga—Zn-oxide target (In:Ga:Zn=1:1:1 [atomic ratio]) was used; an argon gas with a flow rate of 30 sccm and an oxygen gas with a flow rate of 15 sccm were used as a deposition gas; the pressure was 0.4 Pa; the substrate temperature was a room temperature; and a DC power of 0.5 kW was supplied.

The first microcrystalline oxide semiconductor film was heated at 450° C. in a nitrogen atmosphere for one hour and then heated at 450° C. in an oxygen atmosphere for one hour to release hydrogen contained in the first microcrystalline oxide semiconductor film and supply oxygen to the first microcrystalline oxide semiconductor film, so that a second microcrystalline oxide semiconductor film was formed.

Next, the measurement sample including the first microcrystalline oxide semiconductor film and the measurement sample including the second microcrystalline oxide semiconductor film were subjected to CPM measurement. Specifically, the amount of light with which a surface of the measurement sample between terminals is irradiated is adjusted so that a photocurrent value is kept constant in the state where voltage is applied between a pair of electrodes provided in contact with the microcrystalline oxide semiconductor film, and then an absorption coefficient is calculated from the amount of the irradiation light in an intended wavelength range.

Figure 32A:
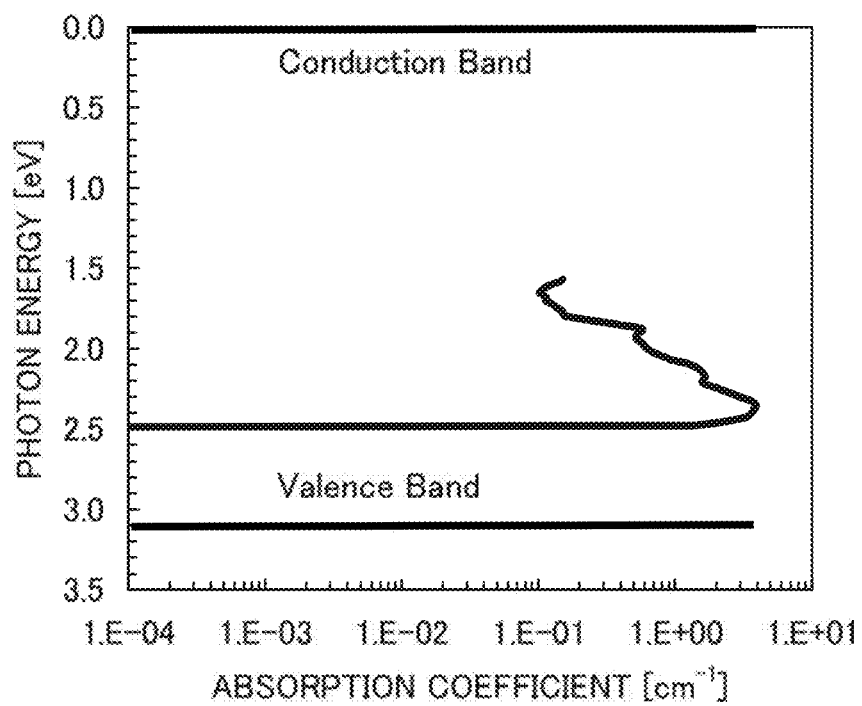
FIGS. 32A and 32B are graphs each showing results of CPM measurement of an oxide semiconductor film.
Figure 32B:
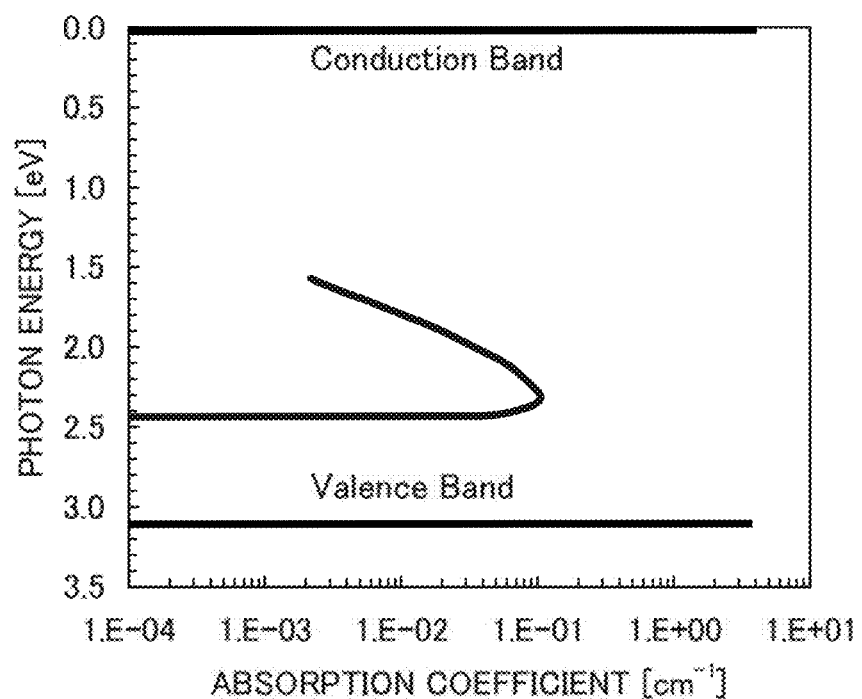

An absorption coefficient shown in each of FIGS. 32A and 32B was obtained by removing an absorption coefficient due to the band tail from an absorption coefficient obtained by CPM measurement of the measurement samples. That is, an absorption coefficient due to defects is shown in FIGS. 32A and 32B. In FIGS. 32A and 32B, the horizontal axis indicates the absorption coefficient, and the vertical axis indicates the photon energy. The bottom of the conduction band and the top of the valence band of the microcrystalline oxide semiconductor film are set to 0 eV and 3.15 eV, respectively, on the vertical axis in FIGS. 32A and 32B. Each curve in FIGS. 32A and 32B represents a relation between the absorption coefficient and photon energy, which corresponds to defect levels.

FIG. 32A shows measurement results of the measurement sample including the first microcrystalline oxide semiconductor film, and an absorption coefficient due to defect levels is $5.28 \times 10^{-1}$ cm$^{-1}$. FIG. 32B shows measurement results of the measurement sample including the second microcrystalline oxide semiconductor film, and an absorption coefficient due to defect levels is $1.75 \times 10^{-2}$ cm$^{-1}$.

Thus, by the heat treatment, the defects included in the microcrystalline oxide semiconductor film can be reduced.

The film densities of the first microcrystalline oxide semiconductor film and the second microcrystalline oxide semiconductor film were measured by X-ray reflectometry (XRR). The film density of the first microcrystalline oxide semiconductor film was 5.9 g/cm$^3$, and the film density of the second microcrystalline oxide semiconductor film was 6.1 g/cm$^3$.

Thus, by the heat treatment, the film density of the microcrystalline oxide semiconductor film can be increased. That is, in the microcrystalline oxide semiconductor film, as the film density is increased, the defects in the film are reduced.

Electron diffraction patterns of microcrystalline oxide semiconductor films are described with reference to FIGS. 47A to 47D, FIGS. 48A and 48B, FIGS. 49A to 49C, FIG. 50, FIG. 51, FIGS. 52A and 52B, and FIG. 53.

An electron diffraction pattern obtained by electron diffraction with a beam diameter of 10 nm$\phi$ or less (nanobeam electron diffraction) of a microcrystalline oxide semiconductor film is neither a halo pattern indicating an amorphous state nor a pattern with spots having regularity indicating a crystalline state in which crystals are aligned with a specific plane. That is, the microcrystalline oxide semiconductor film is an oxide semiconductor film whose electron diffraction pattern has spots not having directionality.

Figure 47A:
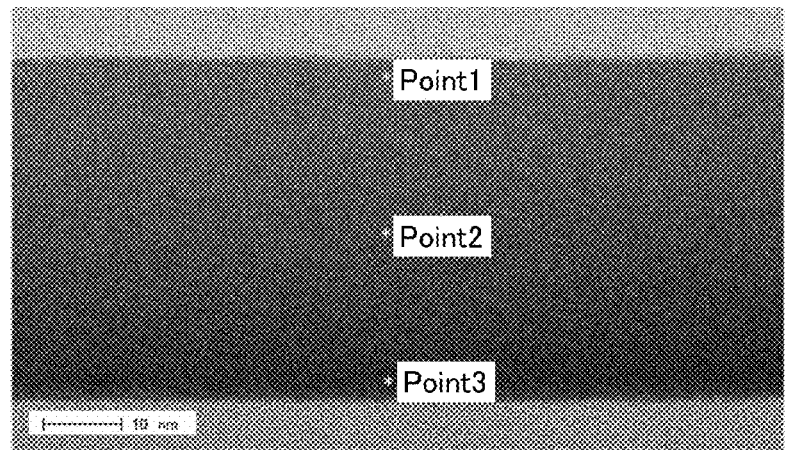
FIGS. 47A to 47D are a cross-sectional TEM image and nanobeam electron diffraction patterns of a microcrystalline oxide semiconductor film.
Figure 47B:
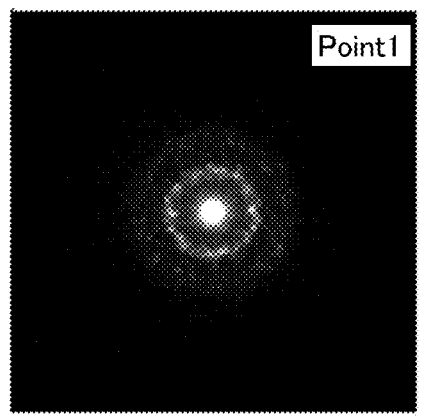
Figure 47C:
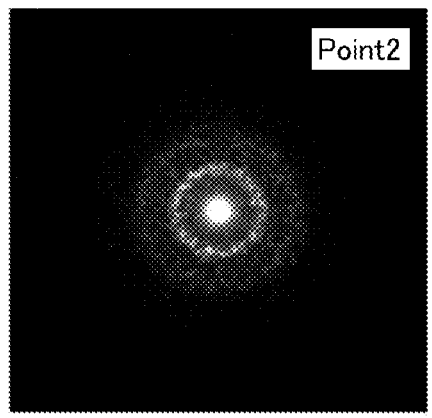
Figure 47D:
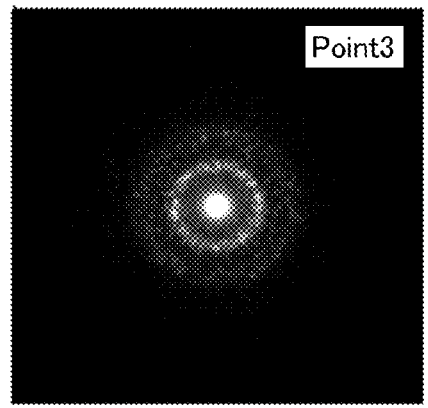

FIG. 47A is a cross-sectional transmission electron microscopy (TEM) image of a microcrystalline oxide semiconductor film. FIGS. 47B, 47C, and 47D show electron diffraction patterns obtained by nanobeam electron diffraction performed on Points 1, 2, 3 in FIG. 47A, respectively.

A sample in which an In—Ga—Zn oxide film was formed, as an example of the microcrystalline oxide semiconductor film in FIGS. 47A to 47D, over a quartz glass substrate to a thickness of 50 nm was used. The microcrystalline oxide semiconductor film shown in FIGS. 47A to 47D was formed under the following conditions: a metal oxide target containing In, Ga, and Zn at an atomic ratio of 1:1:1 was used, the atmosphere was an oxygen atmosphere (flow rate of 45 sccm), the pressure was 0.4 Pa, a direct current (DC) power of 0.5 kW was applied, and the substrate temperature was room temperature. Then, the width of the formed microcrystalline oxide semiconductor film was reduced to 100 nm or less (e.g., 40 nm±10 nm), and a cross-sectional TEM image and nanobeam electron diffraction patterns were obtained.

FIG. 47A is the cross-sectional TEM image of the microcrystalline oxide semiconductor film which was taken with a transmission electron microscope ("H-9000NAR" manufactured by Hitachi High-Technologies Corporation) at an acceleration voltage of 300 kV and at a magnification of 2,000,000 times. FIGS. 47B to 47D show the electron diffraction patterns obtained by nanobeam electron diffraction with a beam diameter of about 1 nmϕ, with a transmission electron microscope ("HF-2000" manufactured by Hitachi High-Technologies Corporation) at an acceleration voltage of 200 kV. Note that the measurement area of the nanobeam electron diffraction with a beam diameter of about 1 nmϕ is greater than or equal to 5 nmϕ and less than or equal to 10 nmϕ.

As shown in FIG. 47B, in the nanobeam electron diffraction pattern of the microcrystalline oxide semiconductor film, a plurality of circumferentially arranged spots (bright points) are observed. In other words, in the pattern of the microcrystalline oxide semiconductor film, a plurality of circumferentially (concentrically) distributed spots are observed, or a plurality of circumferentially distributed spots form a plurality of concentric circles.

In FIG. 47C showing the central portion of the microcrystalline oxide semiconductor film in the thickness direction and in FIG. 47D showing the vicinity of an interface between the microcrystalline oxide semiconductor film and the quartz glass substrate, a plurality of circumferentially distributed spots are observed as in FIG. 47B. In FIG. 47C, the distance from a main spot to each of the circumferentially distributed spots is in a range from 3.88 μm to 4.93 μm, or from 0.203 nm to 0.257 nm when converted into interplanar spacing.

The nanobeam electron diffraction patterns shown in FIGS. 47B to 47D indicate that the microcrystalline oxide semiconductor film includes a plurality of crystal parts whose surface orientations are random and whose sizes are different from each other.

Figure 48A:
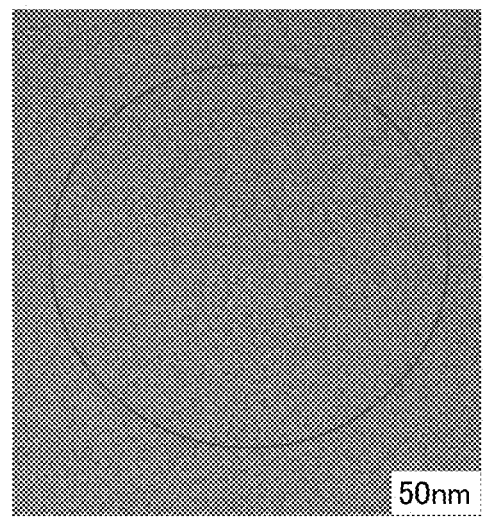
FIGS. 48A and 48B are a plane TEM image and a selected-area electron diffraction pattern of a microcrystalline oxide semiconductor film.
Figure 48B:
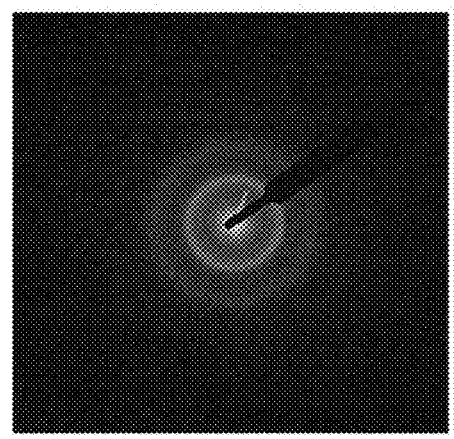

FIG. 48A is a plane TEM image of a microcrystalline oxide semiconductor film. FIG. 48B shows an electron diffraction pattern obtained by selected-area electron diffraction performed on a region surrounded by a circle in FIG. 48A.

A sample in which an In—Ga—Zn oxide film was formed, as an example of the microcrystalline oxide semiconductor film shown in FIGS. 48A and 48B, over a quartz glass substrate to a thickness of 30 nm was used. The microcrystalline oxide semiconductor film shown in FIGS. 48A and 48B was formed under the following conditions: a metal oxide target containing In, Ga, and Zn at an atomic ratio of 1:1:1 was used, the atmosphere was an oxygen atmosphere (flow rate of 45 sccm), the pressure was 0.4 Pa, a direct current (DC) power of 0.5 kW was applied, and the substrate temperature was room temperature. Then, the sample was thinned, and the plane TEM image and the selected-area electron diffraction pattern of the microcrystalline oxide semiconductor film were obtained.

FIG. 48A is the plane TEM image of the microcrystalline oxide semiconductor film which was taken with a transmission electron microscope ("H-9000NAR" manufactured by Hitachi High-Technologies Corporation) at an acceleration voltage of 300 kV and at a magnification of 500,000 times. FIG. 48B is the electron diffraction pattern obtained by electron diffraction with a selected area of 300 nmϕ. Note that the measurement area is greater than or equal to 300 nmϕ in consideration of electron beam expansion.

As shown in FIG. 48B, the electron diffraction pattern of the microcrystalline oxide semiconductor film which was obtained by selected-area electron diffraction the measurement area of which is wider than that of the nanobeam electron diffraction is a halo pattern, in which the plurality of spots observed by the nanobeam electron diffraction are not observed.

Figure 49A:
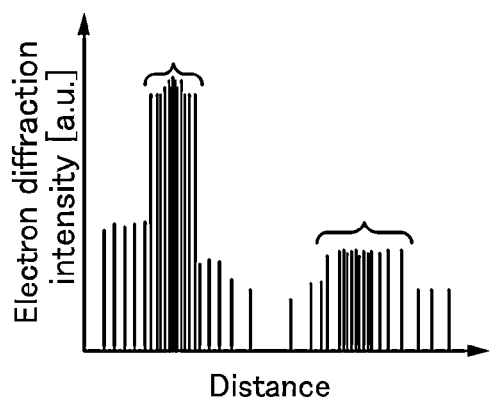
FIGS. 49A to 49C are conceptual diagrams of electron diffraction intensity distribution.
Figure 49B:
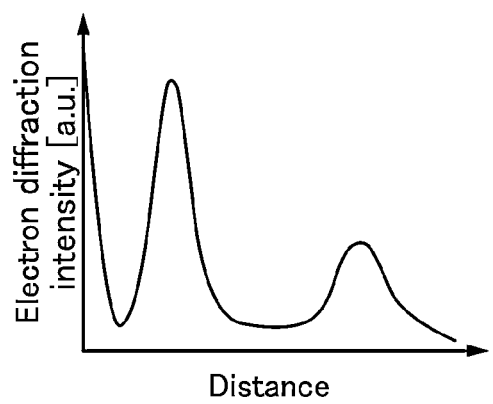
Figure 49C:
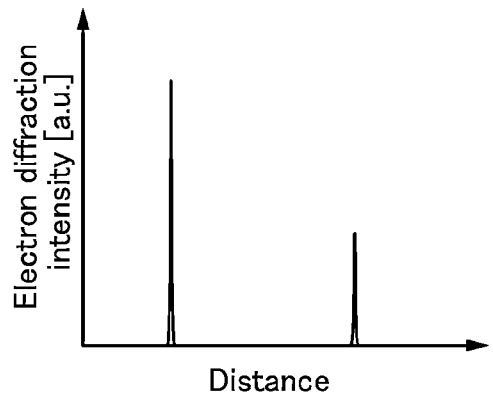

FIGS. 49A to 49C conceptually show diffraction intensity distribution in the electron diffraction patterns shown in FIGS. 47B to 47D and FIG. 48B. FIG. 49A is a conceptual diagram showing diffraction intensity distribution in the nanobeam electron diffraction patterns shown in FIGS. 47B to 47D. FIG. 49B is a conceptual diagram showing diffraction intensity distribution in the selected-area electron diffraction pattern shown in FIG. 48B. FIG. 49C is a conceptual diagram showing diffraction intensity distribution in an electron diffraction pattern of a single crystal structure or a polycrystalline structure.

In each of FIGS. 49A to 49C, the vertical axis represents the electron diffraction intensity (arbitrary unit) indicating distribution of spots or the like and the horizontal axis represents the distance from a main spot.

In FIG. 49C for the single crystal structure or the polycrystalline structure, spots are observed at a specific distance from the main spot, which is based on interplanar spacing (d value) between planes with which crystal parts are aligned.

As shown in each of FIGS. 47B to 47D, a circumferential region formed by the plurality of spots observed in the nanobeam electron diffraction pattern of the microcrystalline oxide semiconductor film has a relatively large width. Thus, FIG. 49A shows discrete distribution. Further, in the nanobeam electron diffraction pattern, a region with high luminance formed by spots which are not clear is observed in a region between concentric circles.

Further, the electron diffraction intensity distribution in the selected-area electron diffraction pattern of the microcrystalline oxide semiconductor film is continuous as shown in FIG. 49B. Since FIG. 49B can approximate a result obtained by widely observing the electron diffraction intensity distribution shown in FIG. 49A, the continuous intensity distribution can be considered to result from the overlapping and connection of the plurality of spots.

FIGS. 49A to 49C indicate that the microcrystalline oxide semiconductor film includes a plurality of crystal parts whose surface orientations are random and whose sizes are different from each other and that the crystal parts are so minute that spots are not observed in the selected-area electron diffraction pattern.

In FIGS. 47B to 47D in which the plurality of spots are observed, the width of the microcrystalline oxide semiconductor film is 50 nm or less. Further, since the diameter of the electron beam was reduced to 1 nmϕ, the measurement area is greater than or equal to 5 nm and less than or equal to 10 nm. Thus, it is assumed that the diameter of the crystal part included in the microcrystalline oxide semiconductor film is 50 nm or less, for example, 10 nm or less or 5 nm or less.

Figure 50:
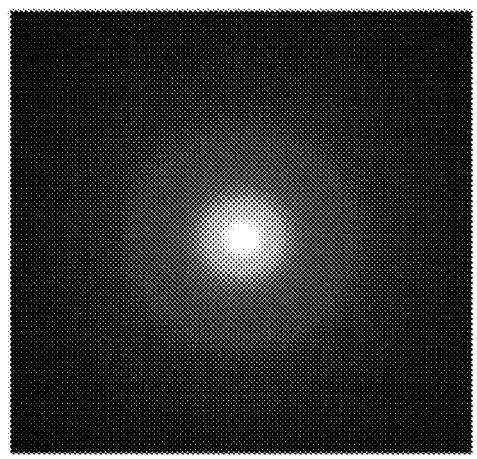
FIG. 50 is a nanobeam electron diffraction pattern of a quartz glass substrate.

FIG. 50 shows a nanobeam electron diffraction pattern of a quartz glass substrate. The measurement conditions were similar to those for the electron diffraction patterns shown in FIGS. 47B to 47D.

As shown in FIG. 50, the nanobeam electron diffraction pattern of the quartz glass substrate having an amorphous structure is a halo pattern without specific spots in which the luminance is gradually changed from a main spot. This means that a plurality of circumferentially distributed spots like those observed in the pattern of the microcrystalline oxide semiconductor film are not observed in the pattern of a film having an amorphous structure even when electron diffraction is performed on a minute region. This indicates that the plurality of circumferentially distributed spots observed in FIGS. 47B to 47D are peculiar to the microcrystalline oxide semiconductor film.

Figure 51:
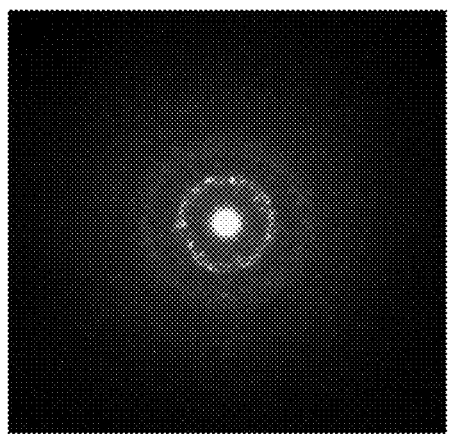
FIG. 51 is a nanobeam electron diffraction pattern of a microcrystalline oxide semiconductor film.

FIG. 51 shows an electron diffraction pattern obtained after one-minute irradiation of Point 2 in FIG. 47A with an electron beam whose diameter was reduced to about 1 nmϕ.

As in the electron diffraction pattern shown in FIG. 47C, a plurality of circumferentially distributed spots are observed in the electron diffraction pattern shown in FIG. 51, and there is no significant difference from FIG. 47C. This means that the crystal part observed in the electron diffraction pattern shown in FIG. 47C existed at the time of the formation of the microcrystalline oxide semiconductor film and did not result from irradiation with the electron beam with the reduced diameter.

Figure 52A:
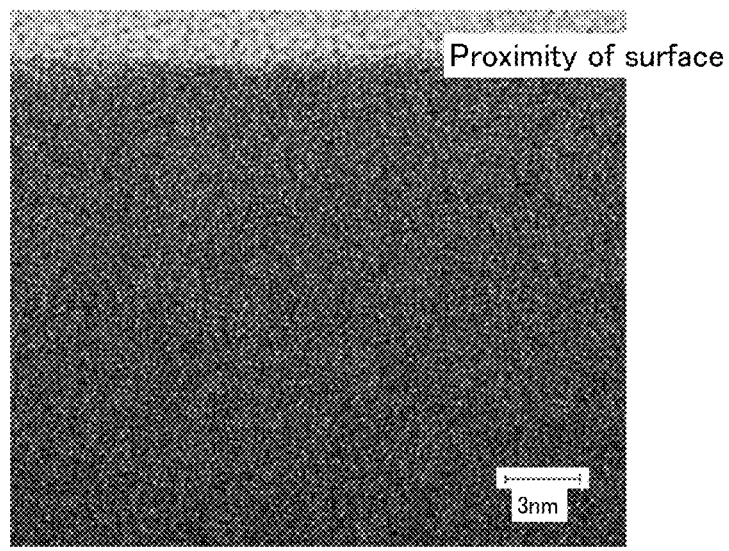
FIGS. 52A and 52B are cross-sectional TEM images of a microcrystalline oxide semiconductor film.
Figure 52B:
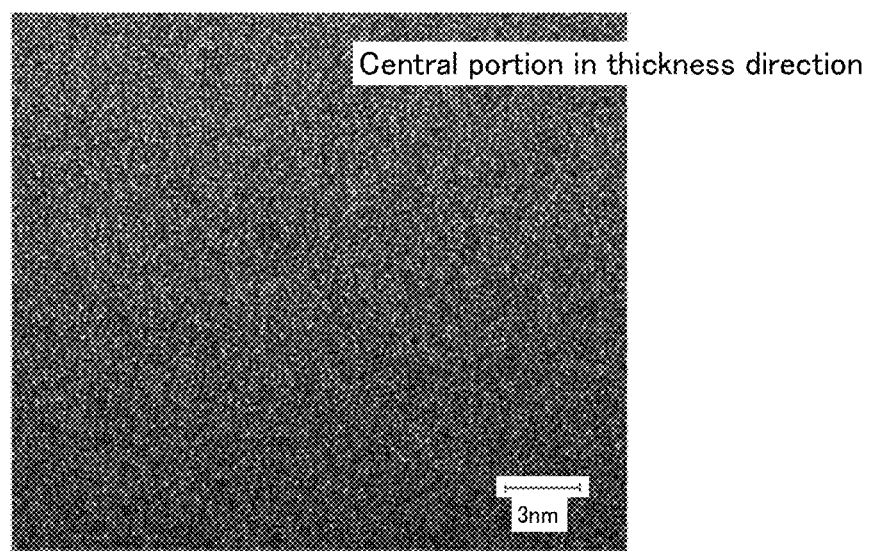

FIGS. 52A and 52B are enlarged images of portions in the cross-sectional TEM image of FIG. 47A. FIG. 52A is a cross-sectional TEM image of the vicinity of Point 1 (the surface of the microcrystalline oxide semiconductor film) in FIG. 47A, which was observed at an observation magnification of 8,000,000 times. FIG. 52B is a cross-sectional TEM image of the vicinity of Point 2 (the central portion of the microcrystalline oxide semiconductor film in the thickness direction) in FIG. 47A, which was observed at an observation magnification of 8,000,000 times.

According to each of the TEM images of FIGS. 52A and 52B, a crystalline structure cannot be clearly observed in the microcrystalline oxide semiconductor film.

Figure 53:
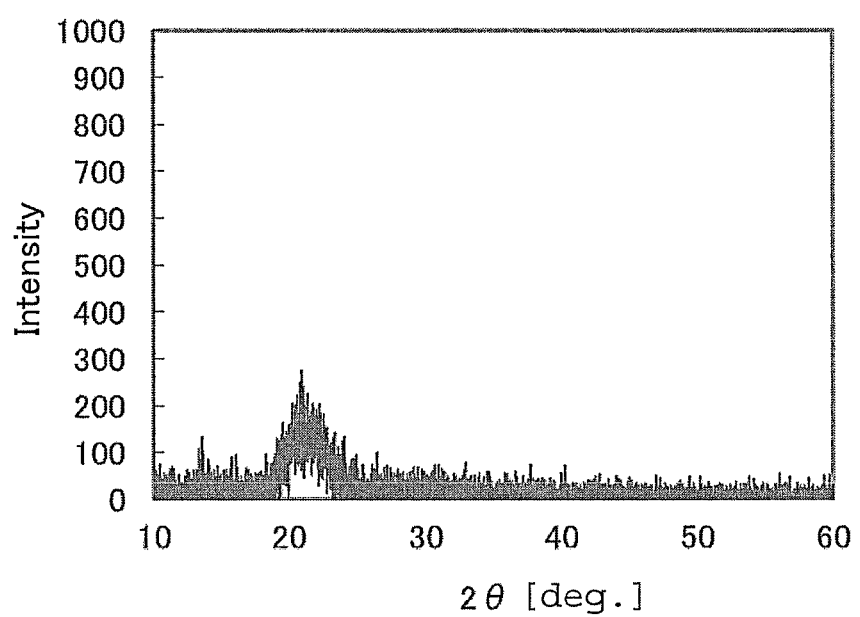
FIG. 53 shows an XRD spectrum of a microcrystalline oxide semiconductor film.

The samples in each of which the microcrystalline oxide semiconductor film of this embodiment was formed over the quartz glass substrate, which were used for FIGS. 47A to 47D and FIGS. 48A and 48B, were analyzed by X-ray diffraction (XRD). FIG. 53 shows an XRD spectrum of the samples measured by an out-of-plane method.

In FIG. 53, the vertical axis represents the X-ray diffraction intensity (arbitrary unit) and the horizontal axis represents the diffraction angle 2θ (degree). Note that the XRD spectrum was measured with an X-ray diffractometer, D8 ADVANCE manufactured by Bruker AXS.

As shown in FIG. 53, a peak corresponding to quartz is observed at around 2θ=20° to 23°; however, a peak corresponding to the crystal part included in the microcrystalline oxide semiconductor film cannot be observed.

The results in FIGS. 52A and 52B and FIG. 53 also indicate that the crystal part included in the microcrystalline oxide semiconductor film is minute.

As described above, in the case of the microcrystalline oxide semiconductor film of this embodiment, a peak indicating an orientation was not observed by X-ray diffraction (XRD) analysis the measurement area of which is wide and the electron diffraction pattern obtained by selected-area electron diffraction the measurement area of which is wide is a halo pattern. This indicates that the microcrystalline oxide semiconductor film of this embodiment is macroscopically equivalent to a film having disordered atomic arrangement. However, spots (bright points) can be observed in the nanobeam electron diffraction pattern of the microcrystalline oxide semiconductor film which was obtained by nanobeam electron diffraction in which the diameter of an electron beam is sufficiently small (e.g., 10 nmϕ or less). Thus, it can be assumed that the microcrystalline oxide semiconductor film of this embodiment is a film in which minute crystal parts having random surface orientations (e.g., crystal parts each with a diameter of 10 nm or less, 5 nm or less, or 3 nm or less) cohere. A microcrystalline region including the minute crystal parts is included in the entire region of the microcrystalline oxide semiconductor film in the thickness direction.

Here, Table 1 shows comparison between oxide semiconductors (represented by OS) having crystal structures and silicon semiconductors (represented by Si) having crystal structures.

TABLE 1

|    |    | Amorphous | Microcrystal | Polycrystal | Continuous crystal | Single crystal |
|----|----|-----------|--------------|-------------|--------------------|----------------|
| OS |    | a-OS      | nc-OS        | Polycrystalline OS | CAAC-OS | Single crystal OS |
|    |    | a-OS: H   | μc-OS        |             |                    |                |
|    | Nanobeam electron diffraction | Halo | Ring + Spot | Spot | Spot | Spot |
|    | Crystal part | — | nm-μm | Discontinuous | Continuously connected | — |
|    | DOS | High | Slightly low | — | Low | Extremely low |
|    | Density | Low | Medium | — | High | — |
| Si |    | a-Si      | nc-Si        | Polycrystalline Si | CG silicon | Single crystal Si |
|    |    | a-Si: H   | μc-Si        |             |                    |                |

As shown in Table 1, examples of oxide semiconductors having crystal structures include an amorphous oxide semiconductor (a-OS and a-OS:H), a microcrystalline oxide semiconductor (nc-OS and μc-OS), a polycrystalline oxide semiconductor (polycrystalline OS), a continuous crystal oxide semiconductor (CAAC-OS), and a single crystal oxide semiconductor (single crystal OS). Note that examples of the crystal state of silicon include, as shown in Table 1, amorphous silicon (a-Si and a-Si:H), microcrystalline silicon (nc-Si and μc-Si), polycrystalline silicon (polycrystalline Si), continuous crystal silicon (continuous grain (CG) silicon), and single crystal silicon (single crystal Si).

When the oxide semiconductors in the above crystal states are subjected to electron diffraction (nanobeam electron diffraction) using an electron beam whose diameter is reduced to less than or equal to 10 nmϕ, the following electron diffraction patterns (nanobeam electron diffraction patterns) can be observed. A halo pattern (also referred to as a halo ring or a halo) is observed in the amorphous oxide semiconductor. Spots and/or a ring pattern are/is observed in the microcrystalline oxide semiconductor. Spots are observed in the polycrystalline oxide semiconductor. Spots are observed in the continuous crystal oxide semiconductor. Spots are observed in the single crystal oxide semiconductor.

According to the nanobeam electron diffraction pattern, a crystal part in the microcrystalline oxide semiconductor has a diameter of nanometers (nm) to micrometers (µm). The polycrystalline oxide semiconductor has grain boundaries between crystal parts; thus, the crystal parts are discontinuous. No grain boundary is observed between crystal parts in the continuous crystal oxide semiconductor and the crystal parts are connected continuously.

The density of the oxide semiconductor in each crystal state is described. The amorphous oxide semiconductor has a low density. The microcrystalline oxide semiconductor has a medium density. The continuous crystal oxide semiconductor has a high density. That is, the density of the continuous crystal oxide semiconductor is higher than that of the microcrystalline oxide semiconductor, and the density of the microcrystalline oxide semiconductor is higher than that of the amorphous oxide semiconductor.

A feature of density of states (DOS) existing in the oxide semiconductor in each crystal state is described. The DOS of the amorphous oxide semiconductor is high. The DOS of the microcrystalline oxide semiconductor is slightly low. The DOS of the continuous crystal oxide semiconductor is low. The DOS of the single crystal oxide semiconductor is extremely low. That is, the DOS of the single crystal oxide semiconductor is lower than that of the continuous crystal oxide semiconductor, the DOS of the continuous crystal oxide semiconductor is lower than that of the microcrystalline oxide semiconductor, and the DOS of the microcrystalline oxide semiconductor is lower than that of the amorphous oxide semiconductor.

Embodiment 8

In this embodiment, examples of formation methods of the metal film, the oxide semiconductor film, the inorganic insulating film, and the like disclosed in the above embodiments are described.

Various films such as the metal film, the oxide semiconductor film, and the inorganic insulating film disclosed in the above embodiments can be formed by a sputtering method or a plasma CVD method; however, these films may be formed by another method such as a thermal chemical vapor deposition (CVD) method. A metal organic chemical vapor deposition (MOCVD) method or an atomic layer deposition (ALD) method may be employed as an example of a thermal CVD method.

A thermal CVD method has an advantage that no defect due to plasma damage is generated because it does not utilize plasma to form a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the metal film, the oxide semiconductor film, and the inorganic insulating film which have been disclosed in the embodiment can be formed by a thermal CVD method such as a MOCVD method or an ALD method. For example, in the case where an $InGaZnO_x$ (x>0) film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. The combination of the compositions of the $InGaZnO_x$ (x>0) film is not limited to the above, and triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed using a deposition apparatus employing ALD, two kinds of gases, that is, ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, that is, $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, for example, an In—Ga—Zn—$O_x$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—$O_2$ layer, an In—Zn—$O_2$ layer, a Ga—In—O layer, a Zn—In—O layer, or a Ga—Zn—O layer may be formed by mixing these gases. Note that although an $H_2O$ gas which is obtained by bubbling with an inert gas such as Ar may be used instead of an $O_3$ gas, it is preferable to use an $O_3$ gas which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Note that this embodiment can be combined as appropriate with any of the other embodiments in this specification.

Embodiment 9

In this embodiment, an example of an apparatus for deposition and heating an oxide semiconductor is described with reference to FIG. 22, FIGS. 23A and 23B, and FIGS. 24A and 24B.

FIG. 22 is a block diagram illustrating a structure of a deposition apparatus 2000 described in this embodiment.

In the deposition apparatus 2000, a load chamber 2101, a first deposition chamber 2111, a second deposition chamber 2112, a first heating chamber 2121, a third deposition chamber 2113, a second heating chamber 2122, a fourth deposition chamber 2114, a third heating chamber 2123, and an unload chamber 2102 are connected in this order. Note that hereinafter except for the load chamber 2101 and the unload chamber 2102, each deposition chamber and each heating chamber may be collectively referred to as a deposition chamber when there is no need to distinguish them from each other.

A substrate carried into the load chamber 2101 is transferred to the first deposition chamber 2111, the second deposition chamber 2112, the first heating chamber 2121, the third deposition chamber 2113, the second heating chamber 2122, the fourth deposition chamber 2114, the third heating chamber 2123 in this order by a moving unit and then transferred to the unload chamber 2102. Treatment is not necessarily performed in each deposition chamber, and the substrate can be transferred to the next deposition chamber as appropriate without being processed if a step is omitted.

The load chamber 2101 in the deposition apparatus 2000 has a function of receiving the substrate from the outside. The substrate put in a horizontal state is carried into the load chamber 2101, and then the substrate is made to stand in a vertical state with respect to a horizontal plane by a mechanism provided in the load chamber 2101. Note that in the case where a unit for receiving the substrate, such as a robot, has a mechanism for making the substrate stand up in the vertical state, the load chamber 2101 does not necessarily have the mechanism for making the substrate stand up in the vertical state. Note that the "horizontal state" means a horizontal state with a margin of −10° to +10°, preferably −5° to +5°, and the "vertical state" means a vertical state with a margin of 80° to 100°, preferably 85° to 95°.

The unload chamber 2102 has a function of setting the substrate in the vertical state to in the horizontal state. After being processed, the substrate is carried into the unload chamber 2102 by the moving unit. The substrate in the vertical state is set to be in the horizontal state in the unload chamber 2102, and then carried out of the apparatus.

The load chamber 2101 and the unload chamber 2102 each have an evacuation unit for evacuating the chamber to vacuum and a gas introduction unit which is used when the vacuum state is changed to the atmospheric pressure. As a gas introduced by the gas introduction unit, air or an inert gas such as nitrogen or a rare gas can be used as appropriate.

The load chamber 2101 may have a heating unit for preheating the substrate. By preheating the substrate in parallel with the evacuation step, impurities such as a gas (including water, a hydroxyl group, and the like) adsorbed to the substrate can be eliminated, which is preferable. As the evacuation unit, for example, an entrapment vacuum pump such as a cryopump, an ion pump, or a titanium sublimation pump or a turbo molecular pump provided with a cold trap may be used.

The load chamber 2101, the unload chamber 2102, and the deposition chambers are connected via gate valves. Therefore, when the substrate is transferred to the next deposition chamber after being processed, the gate valve is opened so that the substrate is carried thereinto. Note that this gate valve is not necessarily provided between the deposition chambers. Each deposition chamber has an evacuation unit, a pressure adjusting unit, a gas introduction unit, and the like; thus, the deposition chamber can always be under reduced pressure even when treatment is not performed therein. A deposition chamber is isolated with the use of the gate valve and thus can be prevented from being contaminated by another deposition chamber.

In addition, the load chamber 2101, the unload chamber 2102, and the deposition chambers are not necessarily arranged in one line; for example, a transfer chamber can be provided between adjacent deposition chambers and chambers can be arranged in two lines. The transfer chamber includes a turntable, so that the substrate carried into the transfer chamber can make a 180-degree turn and the path of the substrate can be turned.

Next, a structure common to the first deposition chamber 2111, the second deposition chamber 2112, the third deposition chamber 2113, and the fourth deposition chamber 2114 will be described.

In the first deposition chamber, a sputtering apparatus or a CVD apparatus is provided. In each of the second deposition chamber, the third deposition chamber, and the fourth deposition chamber, a sputtering apparatus is provided.

As the sputtering apparatus used in the above deposition chambers, for example, a sputtering apparatus for a microwave sputtering method, an RF plasma sputtering method, an AC sputtering method, a DC sputtering method, or the like can be used.

Figure 23A:
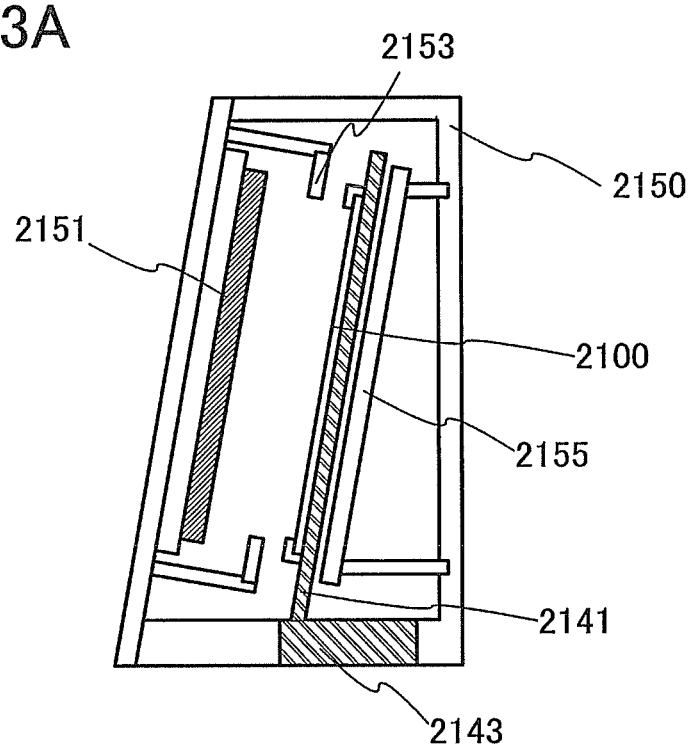
FIGS. 23A and 23B illustrate a deposition chamber.
Figure 23B:
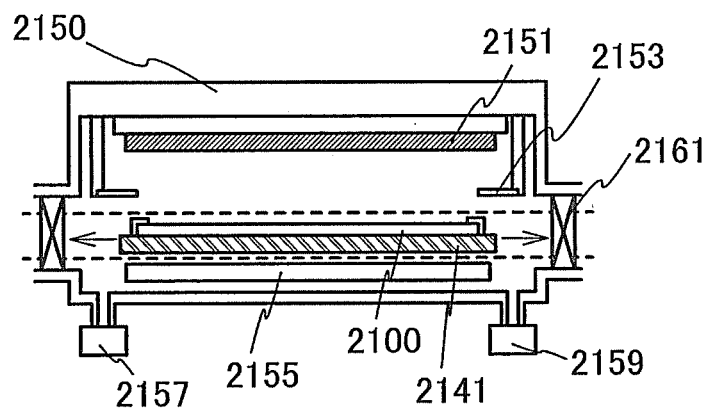

Here, an example of a deposition chamber using a DC sputtering method will be described with reference to FIGS. 23A and 23B. FIG. 23A is a schematic cross-sectional view of a deposition chamber, which is taken perpendicularly to the direction in which the substrate moves. FIG. 23B is a schematic cross-sectional view illustrating a cross section, which is taken horizontally to the direction in which the substrate moves.

First, the substrate 2100 is fixed by a substrate supporting portion 2141 such that an angle between a deposition surface and the vertical direction is at least in the range from 1° to 30°, preferably from 5° to 15°. The substrate supporting portion 2141 is fixed to a moving unit 2143. The moving unit 2143 has a function of fixing the substrate supporting portion 2141 so as to prevent the substrate from moving during treatment. Moreover, the moving unit 2143 can move the substrate 2100, and has a function of carrying the substrate 2100 into and out of the load chamber 2101, the unload chamber 2102, and each deposition chamber as well.

In the deposition chamber 2150, a target 2151 and an attachment prevention plate 2153 are arranged in parallel with the substrate 2100. By arranging the target 2151 and the substrate 2100 in parallel, variation in the thickness of a film formed by sputtering, variation in the step coverage with the film formed by sputtering, and the like, which result from variation in the distance between the target and the substrate, can be prevented.

Further, the deposition chamber 2150 may have a substrate heating unit 2155 positioned behind the substrate supporting portion 2141. With the substrate heating unit 2155, deposition treatment can be performed while the substrate is being heated. As the substrate heating unit 2155, for example, a resistance heater, a lamp heater, or the like can be used. Note that the substrate heating unit 2155 is not necessarily provided.

The deposition chamber 2150 has a pressure adjusting unit 2157, and the pressure in the deposition chamber 2150 can be reduced to a desired pressure. As an evacuation apparatus used for the pressure adjusting unit 2157, for example, an entrapment vacuum pump such as a cryopump, an ion pump, or a titanium sublimation pump or a turbo molecular pump provided with a cold trap may be used.

Further, the deposition chamber 2150 has a gas introduction unit 2159 for introducing a deposition gas or the like. For example, an oxide film can be formed in such a manner that a gas which includes a rare gas as a main component and to which oxygen is added is introduced, and deposition is performed by a reactive sputtering method. As the gas introduced by the gas introduction unit 2159, a high-purity gas in which impurities such as hydrogen, water, and hydride are reduced can be used. For example, oxygen, nitrogen, a rare gas (typically argon), or a mixed gas of any of these can be introduced.

In the deposition chamber 2150 having the pressure adjusting unit 2157 and the gas introduction unit 2159, a hydrogen molecule, a compound including hydrogen such as water ($H_2O$), (preferably, also a compound including a carbon atom), and the like are removed. Accordingly, the concentration of impurities in a film formed in the deposition chamber 2150 can be reduced.

The deposition chamber 2150 and an adjacent chamber are separated by a gate valve 2161. The chamber is isolated using the gate valve 2161, so that impurities in the chamber can be easily eliminated and a clean deposition atmosphere can be maintained. Moreover, the gate valve 2161 is opened and the substrate is carried out of the chamber after the chamber is made clean, whereby contamination of an adjacent deposition chamber can be inhibited. Note that the gate valve 2161 is not necessarily provided.

Then, a portion common to the first heating chamber 2121, the second heating chamber 2122, and the third heating chamber 2123 will be described. Lastly, a feature of each deposition chamber will be described.

In the first heating chamber 2121, the second heating chamber 2122, and the third heating chamber 2123, heat treatment can be performed on the substrate 2100. An apparatus using a resistance heater, a lamp, a heated gas, or the like may be provided as a heating apparatus.

Figure 24A:
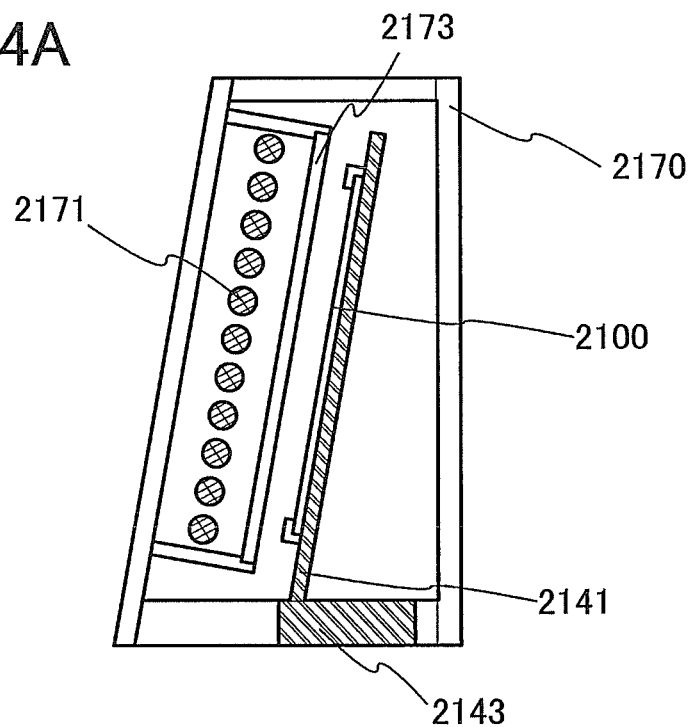
FIGS. 24A and 24B illustrate a heating chamber.
Figure 24B:
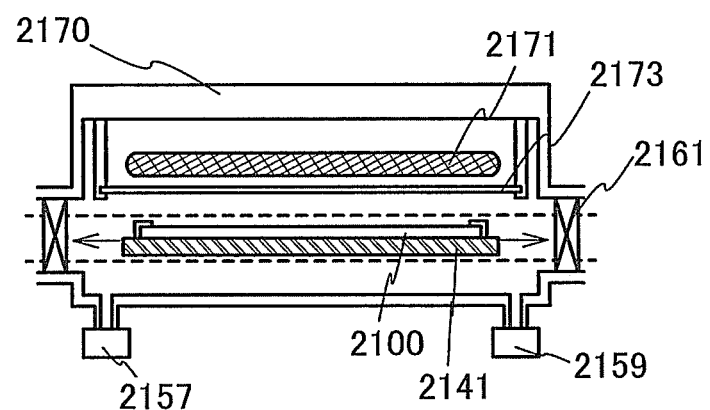

FIGS. 24A and 24B illustrate an example of a heating chamber to which a heating apparatus using a rod-shaped heater is applied. FIG. 24A is a schematic cross-sectional view of the heating chamber, which is taken perpendicularly to the direction in which the substrate moves. FIG. 24B is a schematic cross-sectional view of the heating chamber, which is taken horizontally to the direction in which the substrate moves.

As in the deposition chamber 2150, the substrate 2100 supported by the substrate supporting portion 2141 can be carried into and out of a heating chamber 2170 by the moving unit 2143.

In the heating chamber 2170, rod-shaped heaters 2171 are arranged in parallel with the substrate 2100. FIG. 24A schematically illustrates the shape of a cross section of the rod-shaped heater 2171. A resistance heater or a lamp heater can be used as the rod-shaped heater 2171. The resistance heater includes one using induction heating. Further, a lamp that emits light having a center wavelength in the infrared region is preferred for a lamp used for the lamp heater. By arranging the rod-shaped heaters 2171 in parallel with the substrate 2100, the distance therebetween can be uniform and heating can be performed uniformly. In addition, it is preferable that the temperature of the rod-shaped heaters 2171 be individually controlled. For example, when a heater in a lower portion is set at a temperature higher than that of a heater in an upper portion, the substrate can be heated at a uniform temperature.

The heating mechanism provided in the heating chamber 2170 is not limited to the mechanism described above, and can be, for example, a heating mechanism utilizing a resistance heater or the like or a heating mechanism utilizing heat conduction or heat radiation from a medium such as a heated gas, such as rapid thermal annealing (RTA) such as gas rapid thermal annealing (GRTA) or lamp rapid thermal annealing (LRTA), without no particular limitations. The LRTA treatment is treatment for heating an object by radiation of light (an electromagnetic wave) emitted from a lamp, such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. An inert gas is used as a gas. With the RTA apparatus, the process time can be shortened and thus the RTA apparatus is preferred for mass production.

In the heating chamber 2170, a protection plate 2173 is provided between the rod-shaped heaters 2171 and the substrate 2100. The protection plate 2173 is provided in order to protect the rod-shaped heaters 2171 and the substrate 2100 and can be formed using quartz or the like, for example. The protection plate 2173 is not necessarily provided.

Further, the heating chamber 2170 has the pressure adjusting unit 2157 and the gas introduction unit 2159, like the deposition chamber 2150. Therefore, the heating chamber 2170 can always be kept under reduced pressure during heat treatment and even when treatment is not performed therein. In the heating chamber 2170, a hydrogen molecule, a compound including hydrogen such as water ($H_2O$), (preferably, also a compound including a carbon atom), and the like are removed, whereby the concentration of impurities in a film processed in the heating chamber, impurities at an interface of the film, or impurities included in or adsorbed to a surface of the film can be reduced.

With the pressure adjusting unit 2157 and the gas introduction unit 2159, heat treatment in an inert gas atmosphere or an atmosphere including oxygen can be performed. Note that as the inert gas atmosphere, an atmosphere that contains nitrogen or a rare gas (e.g., helium, neon, or argon) as its main component and does not contain water, hydrogen, or the like is preferred. For example, the purity of nitrogen or a rare gas such as helium, neon, or argon introduced into the heating chamber 2170 is 6N (99.9999%) or higher, preferably 7N (99.99999%) or higher (i.e., the impurity concentration is 1 ppm or lower, preferably 0.1 ppm or lower).

Next, an example of a structure of each deposition chamber is described.

In the first deposition chamber 2111, an oxide insulating film is formed over the substrate. A deposition apparatus may be either a sputtering apparatus or a PE-CVD apparatus without no particular limitation. A film that can be formed in the first deposition chamber 2111 may be any film functioning as a base layer or a gate insulating layer of a transistor or the like; for example, a film of silicon oxide, silicon oxynitride, silicon nitride oxide, aluminum oxide, gallium oxide, aluminum oxynitride, aluminum nitride oxide, hafnium oxide, or the like, a mixed film of any of these, and the like can be given.

In the case of a sputtering apparatus, for example, a proper target can be used in accordance with the kind of the film. In the case of a PE-CVD apparatus, a deposition gas is selected as appropriate.

In the second deposition chamber 2112, an oxide film can be formed by a sputtering method. As the oxide film formed here, for example, a film of an oxide of zinc and gallium, and the like can be given. As a deposition method, a microwave plasma sputtering method, an RF plasma sputtering method, an AC sputtering method, or a DC sputtering method can be used.

In the second deposition chamber 2112, deposition can be performed while the substrate is being heated by the substrate heating unit 2155 at a temperature of 600° C. or lower, preferably 450° C. or lower, further preferably 300° C. or lower.

In the first heating chamber 2121, the substrate can be heated at a temperature higher than or equal to 200° C. and lower than or equal to 700° C. Furthermore, with the pressure adjusting unit 2157 and the gas introduction unit 2159, heat treatment can be performed in an oxygen atmosphere, a nitrogen atmosphere, or a mixed atmosphere of oxygen and nitrogen, whose pressure is set to 10 Pa to 1 normal atmospheric pressure, for example.

In the third deposition chamber 2113, an oxide semiconductor film is formed over the substrate 2100. An example of the oxide semiconductor is an oxide semiconductor including at least Zn, and an oxide semiconductor described in the above embodiments, such as an In—Ga—Zn oxide semiconductor given above can be deposited.

Deposition can be performed while the substrate is being heated by the substrate heating unit 2155 at a deposition temperature higher than or equal to 200° C. and lower than or equal to 600° C.

In the second heating chamber 2122, the substrate 2100 can be heated at a temperature higher than or equal to 200° C. and lower than or equal to 700° C. Furthermore, with the pressure adjusting unit 2157 and the gas introduction unit 2159, heat treatment can be performed in an atmosphere where oxygen or nitrogen is included and impurities such as hydrogen, water, and a hydroxyl group are extremely reduced under a pressure higher than or equal to 10 Pa and lower than or equal to 1 normal atmospheric pressure.

In the fourth deposition chamber 2114, an oxide semiconductor film is formed over the substrate 2100, as in the third deposition chamber 2113. For example, an In—Ga—Zn oxide semiconductor film can be formed using a target for an In—Ga—Zn oxide semiconductor. In addition, deposition can be performed while the substrate is being heated at a temperature higher than or equal to 200° C. and lower than or equal to 600° C.

Finally, in the third heating chamber, heat treatment can be performed on the substrate 2100 at a temperature higher than or equal to 200° C. and lower than or equal to 700° C. Furthermore, with the pressure adjusting unit 2157 and the gas introduction unit 2159, the heat treatment can be performed in a nitrogen atmosphere, an oxygen atmosphere, or a mixed atmosphere of nitrogen and oxygen.

The heating temperature in the first heating chamber 2121, the second heating chamber 2122, and the third heating chamber 2123 is preferably 450° C. or lower, further preferably 350° C. or lower, in view of mass production, strain of a substrate, and energy efficiency.

In addition, the deposition apparatus described in this embodiment has a structure in which exposure to the air is thoroughly prevented, from the load chamber through each deposition chamber to the unload chamber, and the substrate can always be transferred under reduced-pressure environment. Therefore, entry of an impurity into an interface of a film formed in this deposition apparatus can be inhibited, so that a film with extremely favorable interfacial state can be formed.

This embodiment have described the example where the load chamber, the deposition chambers, the heating chambers and the unload chamber are continuous; however, for example, an apparatus including a load chamber, a deposition chamber, and an unload chamber (a so-called deposition apparatus) and an apparatus including a load chamber, a heating chamber, and an unload chamber (a so-called heating apparatus) can be provided independently, without being limited to the example in this embodiment.

This embodiment can be combined with another embodiment in this specification.

Embodiment 10

In this embodiment, a human interface to which the semiconductor device of one embodiment of the present invention can be applied is described. In particular, a structure example of a sensor that can detect proximity or touch of an object (hereinafter referred to as a touch sensor) is described.

For a touch sensor, a variety of types such as a capacitive type, a resistive type, a surface acoustic wave type, and an infrared type can be employed.

Examples of the capacitive touch sensor are typically of a surface capacitive type, a projected capacitive type, and the like. Further, examples of the projected capacitive type are of a self capacitive type, a mutual capacitive type, and the like mainly in accordance with the difference in the driving method. Here, the use of a mutual capacitive type is preferable because of simultaneous sensing of multiple points (also referred to as multipoint sensing or multi-touch).

Besides the touch sensor described here in detail, a sensor that can detect the operation (gesture) of an object (e.g., a finger or a hand), eye movements of users, or the like by a camera (including an infrared camera) or the like can be used as a human interface.

<Example of Detection Method of Sensor>

Figure 25A:
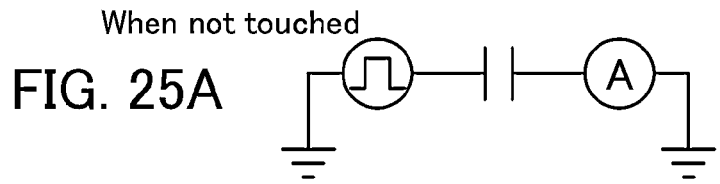
FIGS. 25A to 25C illustrate a touch sensor of one embodiment.
Figure 25B:
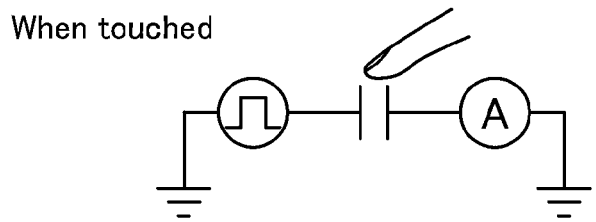

FIGS. 25A and 25B are schematic diagrams each illustrating a structure of a mutual capacitive touch sensor and input and output waveforms. The touch sensor includes a pair of electrodes. Capacitance is formed between the pair of electrodes. Input voltage is input to one of the pair of electrodes. Further, a detection circuit which detects current flowing in the other electrode (or a potential of the other electrode) is provided.

For example, in the case where a rectangular wave is used as an input voltage waveform as illustrated in FIG. 25A, a waveform having a sharp peak is detected as an output current waveform.

Further, in the case where an object having conductivity is proximate to or touches a capacitor as illustrated in FIG. 25B, the capacitance value between the electrodes is decreased; accordingly, the current value of the output is decreased.

By detecting a change in capacitance by using a change in output current (or potential) with respect to input voltage in this manner, proximity or a touch of an object can be detected.

<Structure Example of Touch Sensor>

Figure 25C:
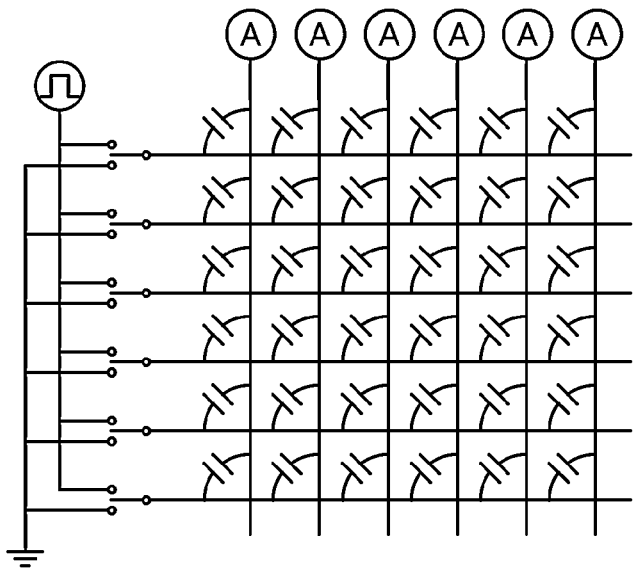

FIG. 25C illustrates a structure example of a touch sensor provided with a plurality of capacitors arranged in a matrix.

The touch sensor includes a plurality of wirings extending in an X direction (the horizontal direction of this figure) and a plurality of wirings extending in a Y direction (the vertical direction of this figure) which intersect with the plurality of wirings. Capacitance is formed between two wirings intersecting with each other.

One of input voltage and a common potential (including a grounded potential and a reference potential) is input to each of the wirings extending in the X direction. Further, a detection circuit (e.g., a source meter or a sense amplifier) is electrically connected to the wirings extending in the Y direction and can detect current (or potential) flowing through the wirings.

The touch sensor can perform sensing two dimensionally in such a manner that the touch sensor sequentially scans the plurality of wirings extending in the X direction so that input voltage is input and detects a change in current (or potential) flowing through the wirings extending in the Y direction.

<Structure Example of Touchscreen>

A structure example of a touchscreen including a touch sensor and a display portion including a plurality of pixels and a case where the touchscreen is incorporated in an electronic device are described below.

Figure 26A:
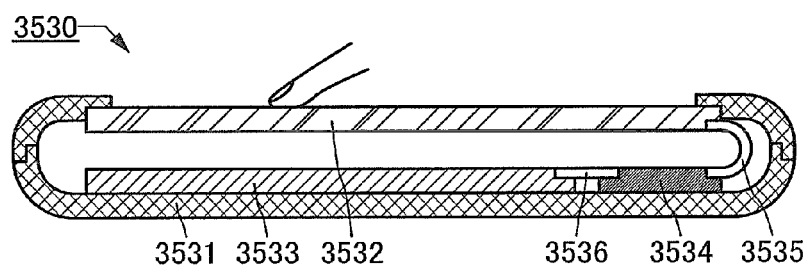
FIGS. 26A to 26E illustrate structural examples of a touchscreen and an electronic device of one embodiment.

FIG. 26A is a schematic cross-sectional view of an electronic device including a touchscreen.

An electronic device 3530 includes a housing 3531 and at least a touchscreen 3532, a battery 3533, and a control portion 3534, which are provided in the housing 3531. The touchscreen 3532 is electrically connected to the control portion 3534 through a wiring 3535. The control portion 3534 controls image display on a display portion and the sensing operation of the touch sensor. The battery 3533 is electrically connected to the control portion 3534 through a wiring 3536 to supply electric power to the control portion 3534.

The touchscreen 3532 is provided so that its surface is not covered. An image can be displayed on the exposed surface of the touchscreen 3532 and the proximity or the contact of an object can be detected.

FIGS. 26B to 26E each illustrate a structure example of a touchscreen.

Figure 26B:
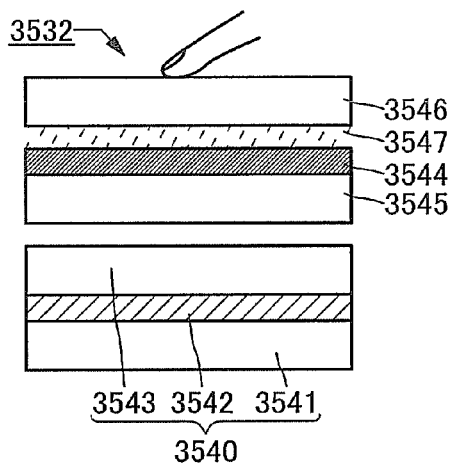

The touchscreen 3532 illustrated in FIG. 26B includes a display panel 3540 in which a display portion 3542 is provided between a first substrate 3541 and a second substrate 3543, a third substrate 3545 provided with a touch sensor 3544, and a protective substrate 3546.

As the display panel 3540, a variety of display devices such as a display device including a liquid crystal element or an organic electroluminescence (EL) element and an electronic paper can be used. Note that the touchscreen 3532 may additionally include a backlight, a polarizing plate, and the like in accordance with the structure of the display panel 3540.

An object comes in contact with or close to one of the surfaces of the protective substrate 3546; thus, the mechanical strength of at least the surface is preferably high. For example, a tempered glass which has been subjected to physical or chemical treatment by an ion exchange method, a thermal tempering method, or the like and has a surface to which compressive stress has been applied can be used as the protective substrate 3546. Alternatively, a flexible substrate with a coated surface, such as a plastic substrate can be used. Note that a protective film or an optical film may be provided over the protective substrate 3546.

The touch sensor 3544 is provided on at least one of the surfaces of the third substrate 3545. Alternatively, a pair of electrodes included in the touch sensor 3544 may be formed on both surfaces of the third substrate 3545. A flexible film may be used as the third substrate 3545 for thickness reduction of the touchscreen. The touch sensor 3544 may be held between a pair of substrates (provided with a film).

Although the protective substrate 3546 and the third substrate 3545 provided with the touch sensor 3544 are bonded to each other by a bonding layer 3547 in FIG. 26B, the protective substrate 3546 and the third substrate 3545 are not necessarily bonded to each other. The third substrate 3545 and the display panel 3540 may be bonded to each other by the bonding layer 3547.

In the touchscreen 3532 illustrated in FIG. 26B, the display panel and the substrate provided with the touch sensor are separately provided. The touchscreen having such a structure can also be referred to as an externally attached touchscreen. In such a structure, the display panel and the substrate provided with the touch sensor are separately formed and then they are overlapped with each other, so that the display panel can have a touch sensor function. Thus, the touchscreen can be easily manufactured without a special manufacturing process.

Figure 26C:
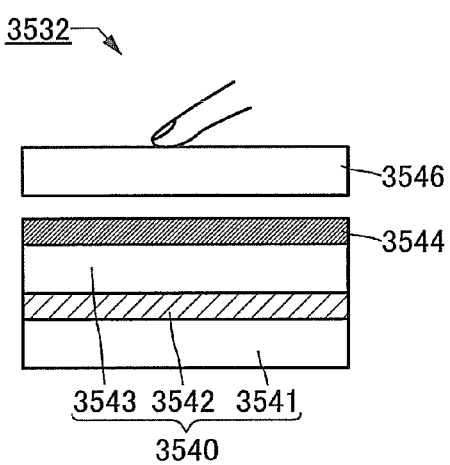

In the touchscreen 3532 illustrated in FIG. 26C, the touch sensor 3544 is provided on a surface of the second substrate 3543 which is on the protective substrate 3546 side. The touchscreen having such a structure can also be referred to as an on-cell touchscreen. With such a structure, the number of substrates needed can be reduced, which results in reductions in the thickness and weight of the touchscreen.

Figure 26D:
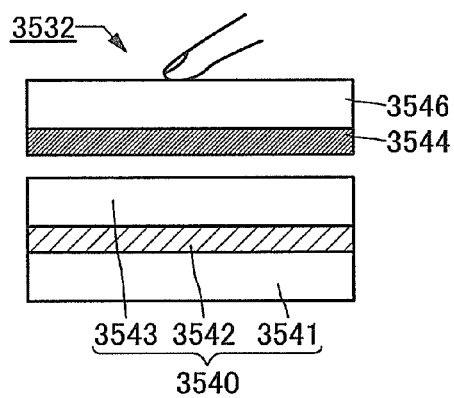

In the touchscreen 3532 illustrated in FIG. 26D, the touch sensor 3544 is provided on one of the surfaces of the protective substrate 3546. With such a structure, the display panel and the touch sensor can be separately manufactured; thus, the touchscreen can be easily manufactured. Furthermore, the number of substrates needed can be reduced, which results in reductions in the thickness and weight of the touchscreen.

Figure 26E:
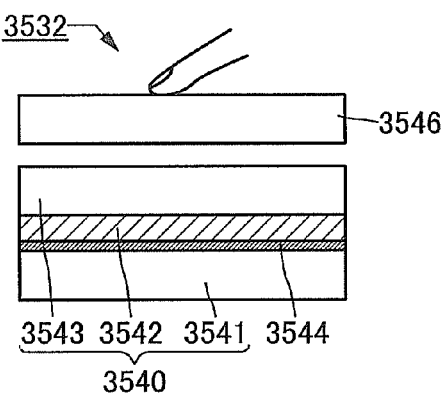

In the touchscreen 3532 illustrated in FIG. 26E, the touch sensor 3544 is provided between the pair of substrates in the display panel 3540. The touchscreen having such a structure can also be referred to as an in-cell touchscreen. With such a structure, the number of substrates needed can be reduced, which results in reductions in the thickness and weight of the touchscreen. Such a touchscreen can be achieved, for example, in such a manner that a circuit functioning as a touch sensor is formed using a transistor, a wiring, an electrode, and the like included in the display portion 3542 on the first substrate 3541 or the second substrate 3543. Further, in the case of using an optical touch sensor, a photoelectric conversion element may be provided.

<Structural Example of In-Cell Touchscreen>

A structure example of a touchscreen incorporating the touch sensor into a display portion including a plurality of pixels is described below. Here, an example where a liquid crystal element is used as a display element provided in the pixel is shown.

Figure 27A:
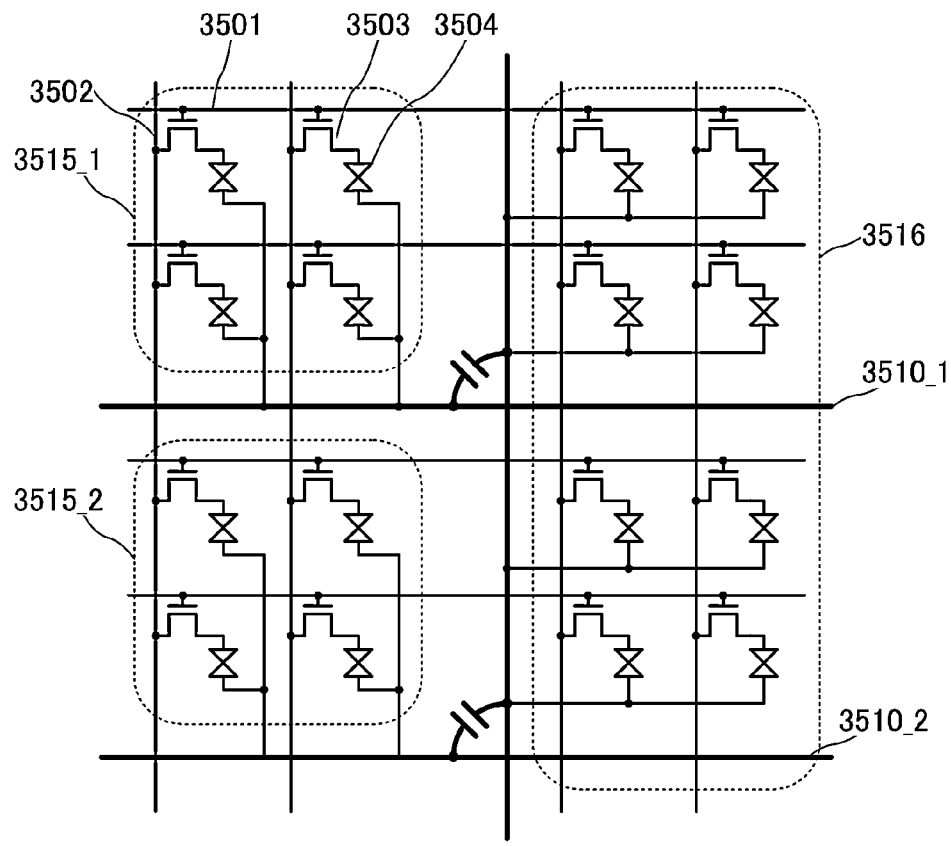
FIGS. 27A and 27B illustrate a pixel provided with a touch sensor of one embodiment.

FIG. 27A is an equivalent circuit diagram of part of a pixel circuit provided in the display portion of the touchscreen exemplified in this structure example.

Each pixel includes at least a transistor 3503 and a liquid crystal element 3504. In addition, a gate of the transistor 3503 is electrically connected to a wiring 3501 and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to intersect with each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that only part of the pixel circuit is illustrated in FIGS. 27A and 27B, and actually, these two kinds of blocks are repeatedly arranged in the X direction and the Y direction.

The wiring 3510_1 (or 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Further, the wiring 3511 extending in the Y direction is electrically connected to the linear block 3516.

Figure 27B:
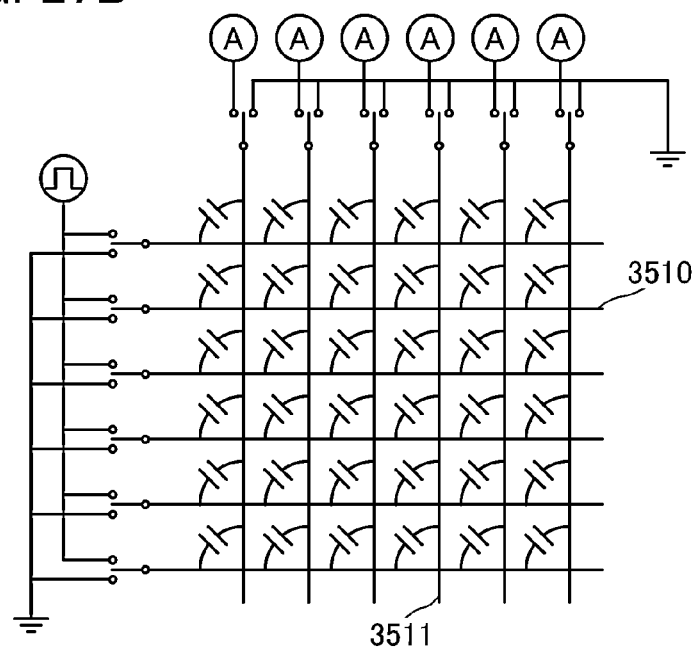

FIG. 27B is an equivalent circuit diagram in which a plurality of wirings 3510 extending in the X direction and the plurality of wirings 3511 extending in the Y direction are illustrated. Input voltage or a common potential can be input to each of the wirings 3510 extending in the X direction. Further, a ground potential can be input to each of the wirings 3511 extending in the Y direction, or the wirings 3511 can be electrically connected to the detection circuit.

<Example of Operation of Touchscreen>

Operation of the above-described touchscreen is described with reference to FIGS. 28A to 28C.

Figure 28A:
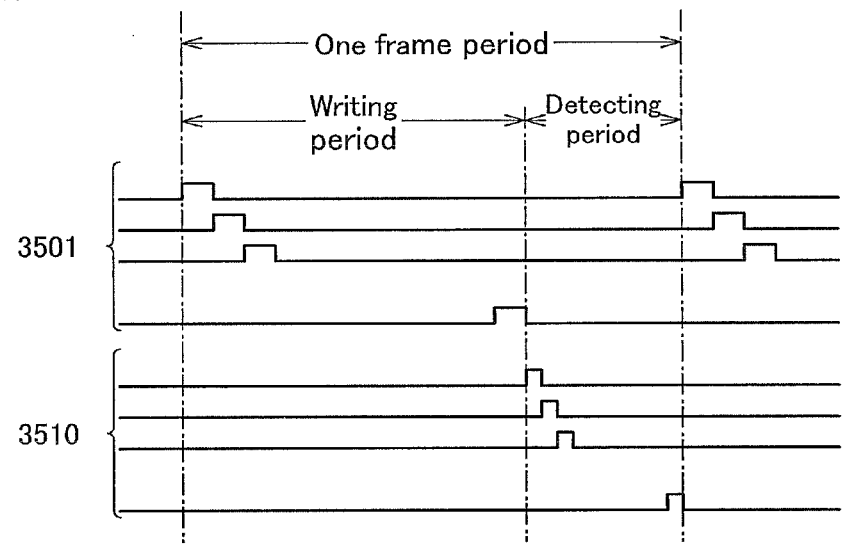
FIGS. 28A to 28C illustrate operations of touch sensors and pixels of one embodiment.

As illustrated in FIG. 28A, one frame period is divided into a writing period and a detecting period. The writing period is a period in which image data is written to a pixel, and the wirings 3510 (also referred to as gate lines) are sequentially selected. On the other hand, the detecting period is a period in which sensing is performed by a touch sensor, and the wirings 3510 extending in the X direction are sequentially selected and input voltage is input.

Figure 28B:
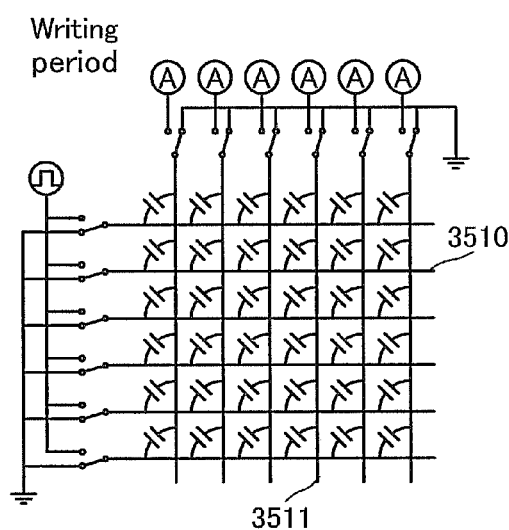

FIG. 28B is an equivalent circuit diagram in the writing period. In the writing period, a common potential is input to both the wiring 3510 extending in the X direction and the wiring 3511 extending in the Y direction.

Figure 28C:
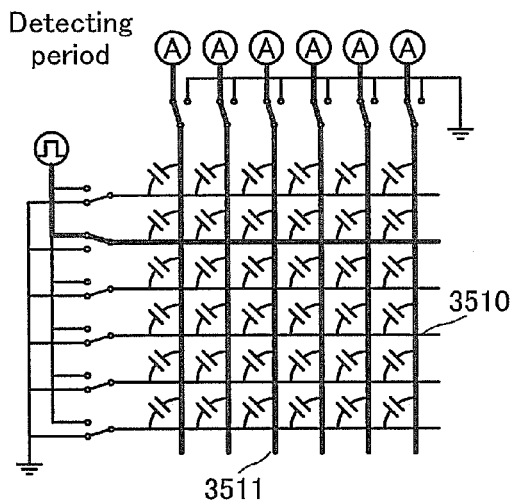

FIG. 28C is an equivalent circuit diagram at some point in time in the detection period. In the detection period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

It is preferable that a period in which an image is written and a period in which sensing is performed by a touch sensor be separately provided as described above. Thus, a decrease in sensitivity of the touch sensor caused by noise generated when data is written to a pixel can be suppressed.

Embodiment 11

The display device which is one embodiment of the present invention can be applied to a variety of electronic devices. Examples of electronic devices include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console. Examples of such electronic devices are illustrated in FIGS. 29A to 29C.

Figure 29A:
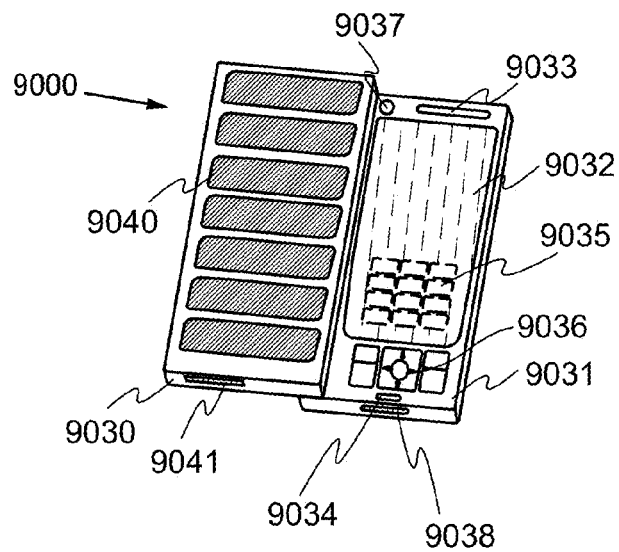
FIGS. 29A to 29C each illustrate an example of an electronic device.
Figure 29B:
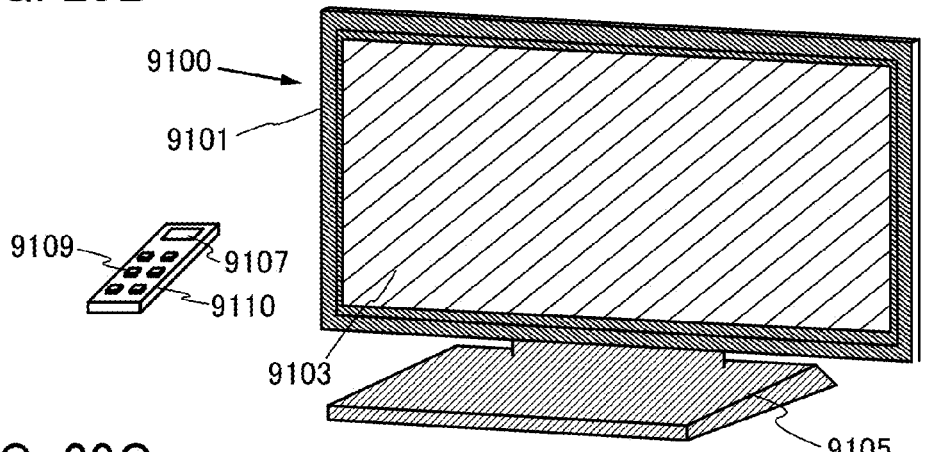
Figure 29C:
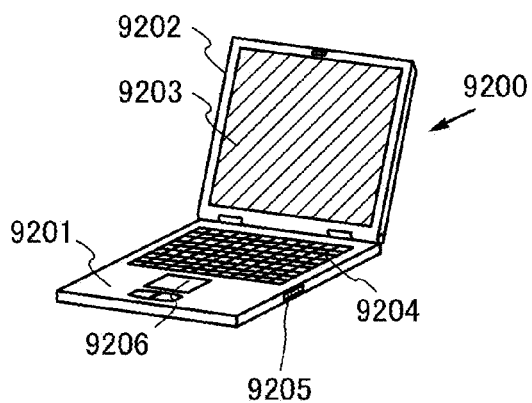

FIG. 29A illustrates an example of a mobile phone 9000. The mobile phone 9000 includes two housings 9030 and 9031. The housing 9031 includes a display panel 9032, a speaker 9033, a microphone 9034, a pointing device 9036, a camera lens 9037, an external connection terminal 9038, and the like. In addition, the housing 9030 includes a solar cell 9040 having a function of charge of the portable information terminal, an external memory slot 9041, and the like. In addition, an antenna is incorporated in the housing 9031. The display device described in the above embodiments is used for the display panel 9032, whereby the display quality of the mobile phone can be improved.

The display panel 9032 is provided with a touchscreen. A plurality of operation keys 9035 which is displayed as images is illustrated by dashed lines in FIG. 29A. Note that a boosting circuit by which a voltage output from the solar cell 9040 is increased to be sufficiently high for each circuit is also included.

In the display panel 9032, the display direction can be appropriately changed depending on a usage pattern. Further, the mobile phone is provided with the camera lens 9037 on the same surface as the display panel 9032, and thus it can be used as a video phone. The speaker 9033 and the microphone 9034 can be used for videophone calls, recording and playing sound, and the like as well as voice calls. Moreover, the housings 9030 and 9031 in a state where they are developed as illustrated in FIG. 29A can shift by sliding so that one is lapped over the other; therefore, the size of the mobile phone can be reduced, which makes the mobile phone suitable for being carried.

The external connection terminal 9038 can be connected to an AC adapter and various types of cables such as a USB cable, and charging and data communication with a personal computer or the like are possible. Moreover, a large amount of data can be stored by inserting a storage medium into the external memory slot 9041 and can be moved.

FIG. 29B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 29B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

Any of the display devices described in the above embodiments can be used for the display portions 9103 and 9107. Thus, the television device can have high display quality.

FIG. 29C illustrates a computer 9200. The computer 9200 includes a main body 9201, a housing 9202, a display portion 9203, a keyboard 9204, an external connection port 9205, a pointing device 9206, and the like.

Any of the display devices described in the above embodiments can be used for the display portion 9203. Thus, a computer can have high display quality.

The display portion 9203 has a touch-input function. When a user touches displayed buttons which are displayed on the display portion 9203 of the computer 9200 with his/her fingers or the like, the user can carry out operation of the screen and input of information. Further, when the computer may be made to communicate with home appliances or control the home appliances, the display portion 9203 may function as a control device which controls the home appliances by operation on the screen. For example, with the use of the touchscreen described in the above embodiment, the display portion 9203 can have a touch-input function.

Figure 30:
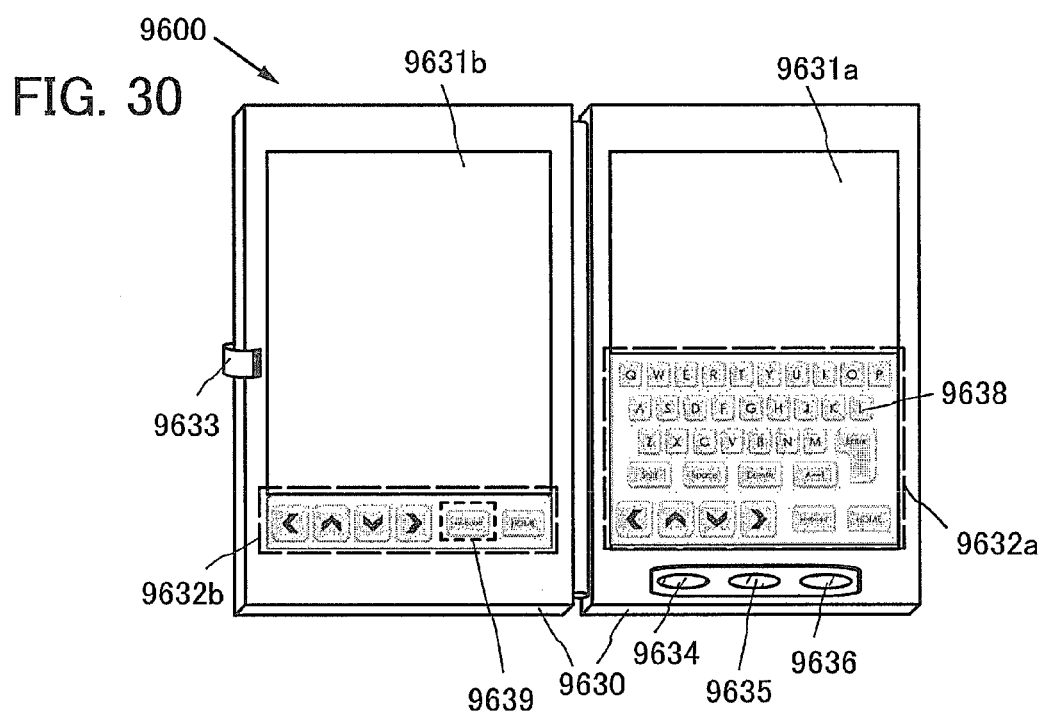
FIG. 30 illustrates an example of an electronic device.

FIG. 30 illustrates a foldable tablet terminal 9600. In FIG. 30, the tablet terminal 9600 is opened and includes a housing 9630, a display portion 9631a, a display portion 9631b, a display-mode switching button 9634, a power button 9635, a power-saving-mode switching button 9636, and a clip 9633.

Any of the display devices described in the above embodiments can be used for the display portion 9631a and the display portion 9631b. Thus, the display quality of the tablet terminal 9600 can be improved.

Part of the display portion 9631a can be a touchscreen region 9632a and data can be input when a displayed operation key panel 9638 is touched. Although a structure in which a half region in the display portion 9631a has only a display function and the other half region also has a touchscreen function is illustrated as an example, the structure of the display portion 9631a is not limited thereto. The whole area of the display portion 9631a may have a touchscreen function. For example, the whole area of the display portion 9631a can display keyboard buttons and serve as a touchscreen while the display portion 9631b can be used as a display screen.

Like the display portion 9631a, part of the display portion 9631b can be a touchscreen region 9632b. When a keyboard display switching button 9639 displayed on the touchscreen is touched with a finger, a stylus, or the like, a keyboard can be displayed on the display portion 9631b.

Touch input can be performed concurrently on the touchscreen regions 9632a and 9632b.

The display-mode switching button 9634 can switch display orientation (e.g., between landscape mode and portrait mode) and select a display mode (switch between monochrome display and color display), for example. The power-saving-mode switching button 9636 can control display luminance in accordance with the amount of external light in use of the tablet terminal 9600 detected by an optical sensor incorporated in the tablet terminal 9600. The tablet terminal 9600 may include another detection device such as a sensor for detecting orientation (e.g., a gyroscope or an acceleration sensor) in addition to the optical sensor.

Although the display portion 9631a and the display portion 9631b have the same display area in FIG. 30, one embodiment of the present invention is not limited to this example. The display portion 9631a and the display portion 9631b may have different areas or different display quality. For example, one of them may be a display panel that can display higher-definition images than the other.

This embodiment can be implemented in appropriate combination with any of the structures described in the other embodiments and examples.

Example 1

In this example, the resistances of an oxide semiconductor film and a multilayer film will be described with reference to FIGS. 33A to 33D and FIG. 34.

First, the structure of a sample is described with reference to FIGS. 33A to 33D.

Figure 33A:
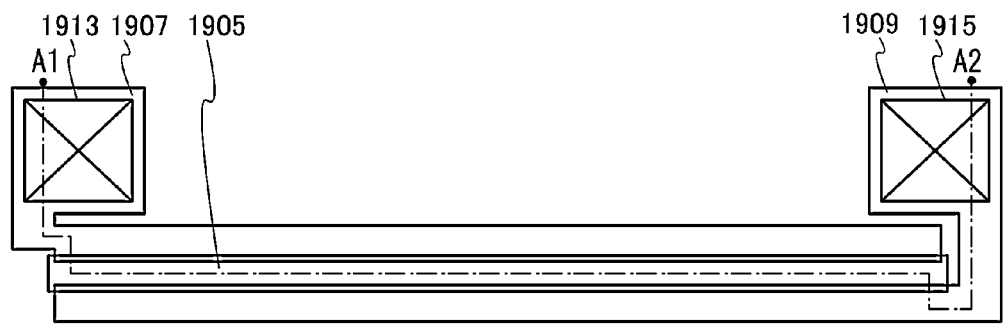
FIGS. 33A to 33D illustrate structures of samples.
Figure 33B:
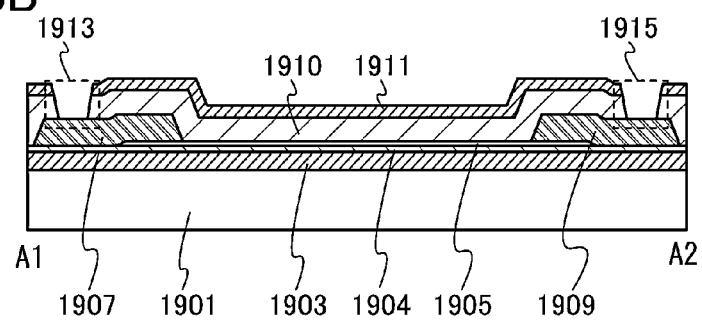
Figure 33C:
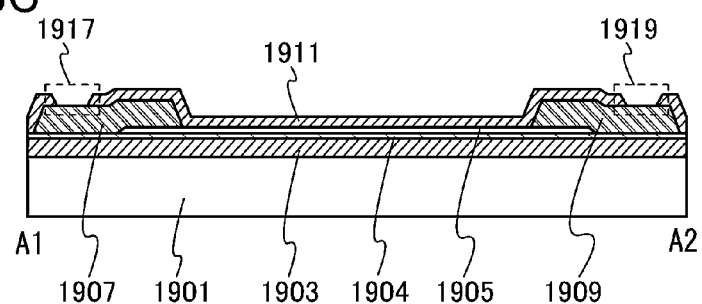
Figure 33D:
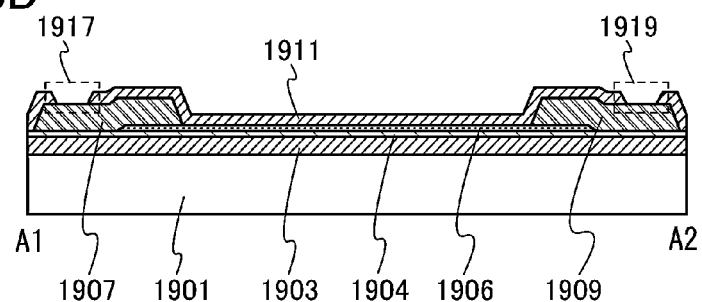

FIG. 33A is a top view of Sample 1, Sample 2, Sample 3, and Sample 4, and FIGS. 33B to 33D are cross-sectional views taken along dashed-dotted line A1-A2 in FIG. 33A. Note that the top views of Samples 1 to 4 are the same, and the cross-sectional views thereof are different because the stacked-layer structures of the cross sections are different. The cross-sectional views of Sample 1, Sample 2, and Samples 3 and 4 are illustrated in FIG. 33B, FIG. 33C, and FIG. 33D, respectively.

As for Sample 1, an insulating film 1903 is formed over a glass substrate 1901, an insulating film 1904 is formed over the insulating film 1903, and an oxide semiconductor film 1905 is formed over the insulating film 1904. The both ends of the oxide semiconductor film 1905 are covered with a conductive film 1907 and a conductive film 1909 each serving as an electrode, and the oxide semiconductor film 1905 and the conductive films 1907 and 1909 are covered with an insulating film 1910 and an insulating film 1911. Note that an opening 1913 and an opening 1915 are provided in the insulating films 1910 and 1911, and the conductive film 1907 and the conductive film 1909 are exposed through the opening 1913 and the opening 1915, respectively.

As for Sample 2, the insulating film 1903 is formed over the glass substrate 1901, the insulating film 1904 is formed over the insulating film 1903, and the oxide semiconductor film 1905 is formed over the insulating film 1904. The both ends of the oxide semiconductor film 1905 are covered with the conductive films 1907 and 1909 each serving as an electrode, and the oxide semiconductor film 1905 and the conductive films 1907 and 1909 are covered with the insulating film 1911. Note that an opening 1917 and an opening 1919 are provided in the insulating film 1911, and the conductive film 1907 and the conductive film 1909 are exposed through the opening 1917 and the opening 1919, respectively.

In each of Samples 3 and 4, the insulating film 1903 is formed over the glass substrate 1901, the insulating film 1904 is formed over the insulating film 1903, and a multilayer film 1906 is formed over the insulating film 1904. The both ends of the multilayer film 1906 are covered with the conductive films 1907 and 1909 each serving as an electrode, and the multilayer film 1906 and the conductive films 1907 and 1909 are covered with the insulating film 1911. Note that the openings 1917 and 1919 are provided in the insulating film 1911, and the conductive film 1907 and the conductive film 1909 are exposed through the opening 1917 and the opening 1919, respectively.

As described above, the structures of the insulating films in contact with the top surface of the oxide semiconductor film 1905 or the multilayer film 1906 are different in Samples 1 to 4. In Sample 1, the oxide semiconductor film 1905 and the insulating film 1910 are in contact with each other; in Sample 2, the oxide semiconductor film 1905 and the insulating film 1911 are in contact with each other; and in Samples 3 and 4, the multilayer film 1906 and the insulating film 1911 are in contact with each other.

Next, methods for forming the samples are described.

First, a method for forming Sample 1 is described.

A 400-nm-thick silicon nitride film was formed as the insulating film 1903 over the glass substrate 1901 by a plasma CVD method.

Next, a 50-nm-thick silicon oxynitride film was formed as the insulating film 1904 over the insulating film 1903 by a plasma CVD method.

Next, a 35-nm-thick In—Ga—Zn oxide film (hereinafter also referred to as an IGZO film) was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process, so that the oxide semiconductor film 1905 was formed.

Next, the conductive films 1907 and 1909 were formed over the insulating film 1904 and the oxide semiconductor film 1905 in such a manner that a 50-nm-thick tungsten film, a 400-nm-thick aluminum film, and a 100-nm-thick titanium film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1910 by a plasma CVD method.

Next, a mask was formed over the insulating film 1911 through a photolithography process and then etching treatment was performed on the insulating film 1910 and the insulating film 1911, so that the openings 1913 and 1915 were formed in the insulating films 1910 and 1911.

Through the above process, Sample 1 was formed.

Next, a method for forming Sample 2 is described.

Next, a 450-nm-thick silicon oxynitride film was formed as the insulating film 1910 over the insulating film 1903, the oxide semiconductor film 1905, the conductive film 1907, and the conductive film 1909 of Sample 1 by a plasma CVD method, and then heat treatment was performed at 350° C. under a mixed atmosphere of nitrogen and oxygen for one hour. After that, the insulating film 1910 was removed.

Next, a 50-nm-thick silicon nitride film was formed as the insulating film 1911 over the insulating film 1904, the oxide semiconductor film 1905, the conductive film 1907, and the conductive film 1909 by a plasma CVD method.

Next, a mask was formed over the insulating film 1911 through a photolithography process and then etching treatment was performed on the insulating film 1911, so that the openings 1917 and 1919 were formed in the insulating film 1911.

Through the above process, Sample 2 was formed.

Next, a method for forming Sample 3 is described.

As for Sample 3, the multilayer film 1906 was used instead of the oxide semiconductor film 1905 of Sample 2. The multilayer film 1906 was formed over the insulating film 1904 in such a manner that a 10-nm-thick IGZO film with a metal oxide target containing In, Ga, and Zn at an atomic ratio of 1:3:2, a 10-nm-thick IGZO film with a metal oxide target containing In, Ga, and Zn at an atomic ratio of 1:1:1, and then a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, Sample 3 was formed.

Next, a method for forming Sample 4 is described.

As for Sample 4, the multilayer film 1906 was used instead of the oxide semiconductor film 1905 of Sample 2. The multilayer film 1906 was formed over the insulating film 1904 in such a manner that a 20-nm-thick IGZO film with a metal oxide target containing In, Ga, and Zn at an atomic ratio of 1:3:2, a 15-nm-thick IGZO film with a metal oxide target containing In, Ga, and Zn at an atomic ratio of 1:1:1, and then a 10-nm-thick IGZO film using a metal oxide target containing In, Ga, and Zn at an atomic ratio of 1:3:2 were successively formed by a sputtering method. Then, etching treatment was performed on the stacked IGZO films with a mask formed through a photolithography process, so that the separated multilayer film 1906 was formed.

Through the above process, Sample 4 was formed.

Next, the sheet resistance of the oxide semiconductor film 1905 provided in each of Samples 1 and 2 and the sheet resistance of the multilayer film 1906 provided in each of Samples 3 and 4 were measured. In Sample 1, a probe is made contact with the openings 1913 and 1915 to measure the sheet resistance of the oxide semiconductor film 1905. In each of Samples 2 to 4, a probe is made contact with the openings 1917 and 1919 to measure the sheet resistance of the oxide semiconductor film 1905 or the multilayer film 1906. Note that in the oxide semiconductor film 1905 in each of Samples 1 and 2 and the multilayer film 1906 in each of Samples 3 and 4, the widths of the conductive films 1907 and 1909 facing each other were each 1 mm and the distance therebetween was 10 μm. Further, in each of Samples 1 to 4, the potential of the conductive film 1907 was a ground potential, and 1 V was applied to the conductive film 1909.

Figure 34:
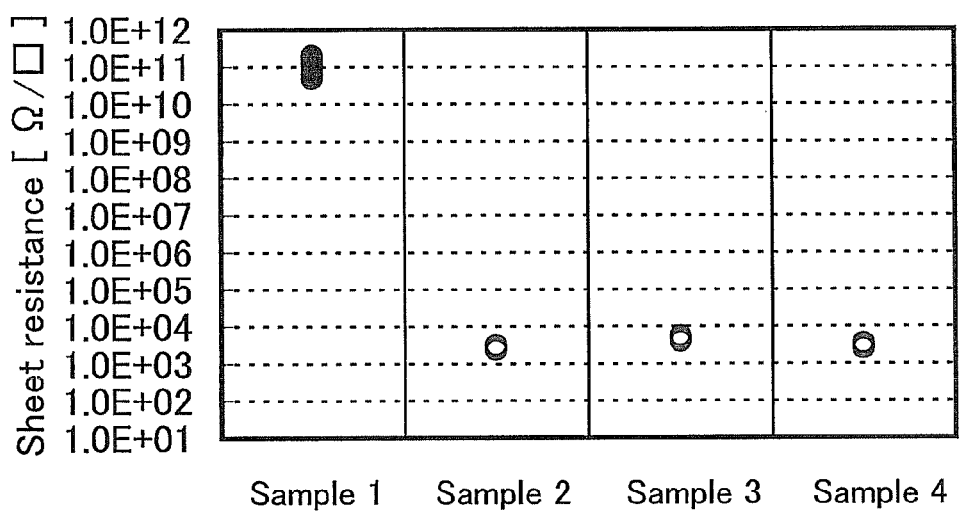
FIG. 34 is a graph showing sheet resistance.

FIG. 34 shows the sheet resistance of Samples 1 to 4.

The sheet resistance of Sample 1 was about $1 \times 10^{11}$ Ω/sq. The sheet resistance of Sample 2 was about 2620 Ω/sq. The sheet resistance of Sample 3 was about 4410 Ω/sq. The sheet resistance of Sample 4 was about 2930 Ω/sq.

In the above manner, the oxide semiconductor films 1905 and the multilayer films 1906 have different values of sheet resistance because the insulating films in contact with the oxide semiconductor film 1905 and the insulating films in contact with the multilayer film 1906 were different.

Note that when the above sheet resistances of Samples 1 to 4 were converted into resistivity, the resistivities of Sample 1, Sample 2, Sample 3, and Sample 4 were $3.9 \times 10^5$ Ωcm, $9.3 \times 10^{-3}$ Ωcm, $1.3 \times 10^{-2}$ Ωcm, and $1.3 \times 10^{-2}$ Ωcm, respectively.

In Sample 1, the silicon oxynitride film used as the insulating film 1910 was formed in contact with the top surface of the oxide semiconductor film 1905 and apart from the silicon nitride film used as the insulating film 1911. On the other hand, the silicon nitride film used as the insulating film 1911 was formed in contact with the top surface of the oxide semiconductor film 1905 in Sample 2 and was formed in contact with the top surface of the multilayer film 1906 in each of Samples 3 and 4. When the oxide semiconductor film 1905 or the multilayer film 1906 is thus provided in contact with the silicon nitride film used as the insulating film 1911, defects, typically oxygen vacancies are generated in the oxide semiconductor film 1905 or the multilayer film 1906, and hydrogen contained in the silicon nitride film is transferred to or diffused into the oxide semiconductor film 1905 or the multilayer film 1906. Accordingly, the conductivity of the oxide semiconductor film 1905 or the multilayer film 1906 is improved.

For example, in the case where an oxide semiconductor film is used for a channel formation region of a transistor, it is preferable to employ a structure in which a silicon oxynitride film is provided in contact with the oxide semiconductor film as shown in Sample 1. Further, as a light-transmitting conductive film used for an electrode of a capacitor, it is preferable to employ a structure in which a silicon nitride film is provided in contact with an oxide semiconductor film or a multilayer film as shown in the Samples 2 to 4. With such a structure, even when an oxide semiconductor film or a multilayer film which is used for a channel formation region of a transistor and an oxide semiconductor film or a multilayer film which is used for an electrode of a capacitor are formed through the same process, the resistivity of the oxide semiconductor film and the resistivity of the multilayer film can be made different from each other.

The structure described in this example can be used as appropriate in combination with any of the structures in the other embodiments and examples.

Example 2

In this example, analysis of impurities in an oxide semiconductor film and an insulating film formed over the oxide semiconductor film will be described with reference to FIGS. 35A and 35B.

In this example, two kinds of samples (hereinafter Sample 5 and Sample 6) were formed as samples for impurity analysis.

First, a method for forming Sample 5 is described below.

As for Sample 5, an IGZO film was formed over a glass substrate and a silicon nitride film was formed thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that as for the IGZO film, a 100-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

In addition, as for the silicon nitride film, a 100-nm-thick silicon nitride film was formed by a PE-CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 220° C.

Next, a method for forming Sample 6 is described below.

An IGZO film was formed over a glass substrate and a silicon oxynitride film and a silicon nitride film were stacked thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that the film formation conditions of the IGZO film and the silicon nitride film were similar to those of Sample 5. In addition, as for the silicon oxynitride film, a 50-nm-thick silicon oxynitride film was formed by a PE-CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, a 400-nm-thick silicon oxynitride film was formed by a PE-CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C.

Figure 35A:
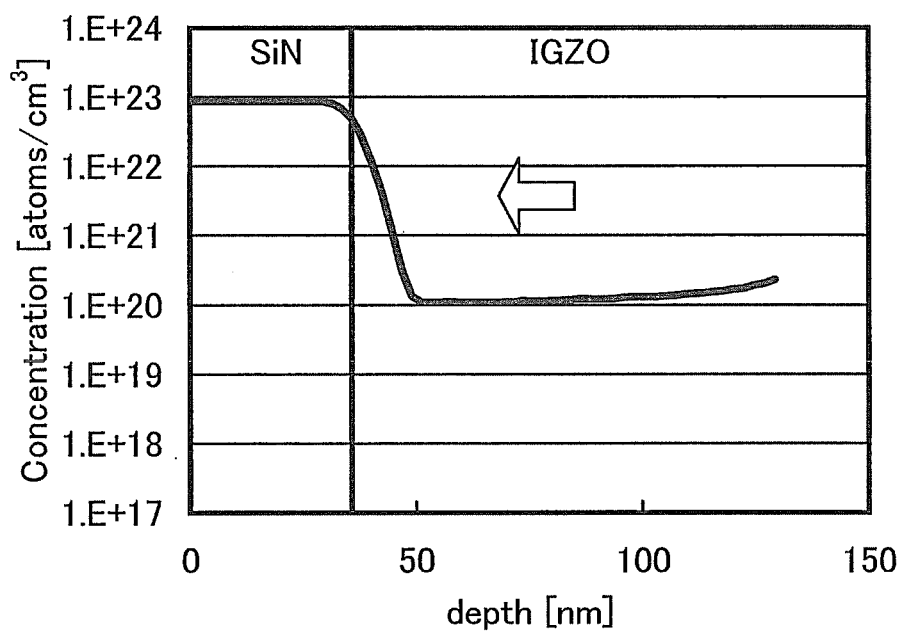
FIGS. 35A and 35B each show a result of SIMS measurement.
Figure 35B:
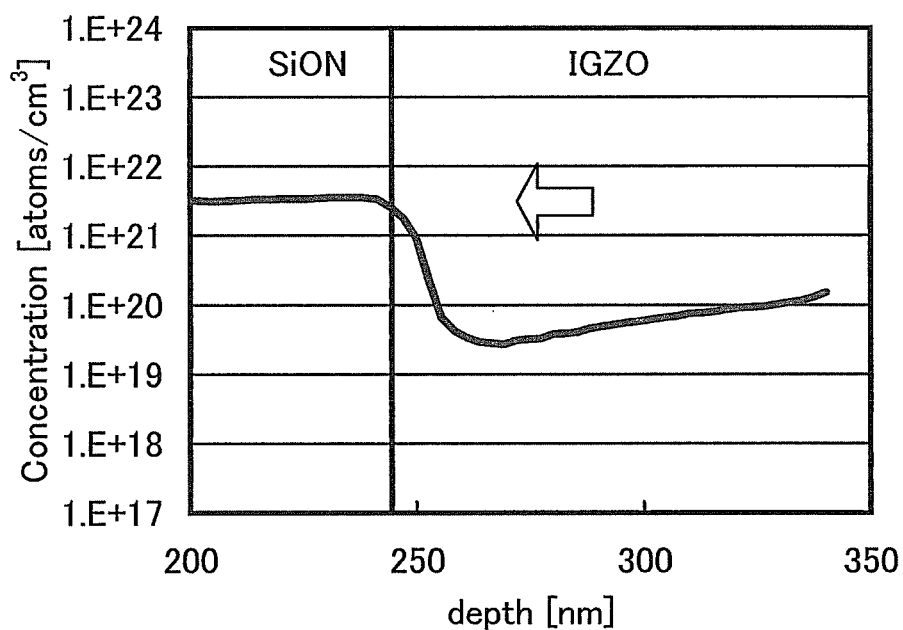

FIGS. 35A and 35B show the results of the impurity analysis of Samples 5 and 6.

Note that the impurity analysis was performed in the direction shown by the arrow in each of FIGS. 35A and 35B by secondary ion mass spectrometry (SIMS). That is, the measurement was performed from the glass substrate side.

FIG. 35A shows the concentration profile of hydrogen (H) which was obtained by measurement of Sample 5. FIG. 35B shows the concentration profile of hydrogen (H) which was obtained by measurement of Sample 6.

FIG. 35A shows that the concentration of hydrogen (H) in the IGZO film is $1.0 \times 10^{20}$ atoms/cm$^3$ and the concentration of hydrogen (H) in the silicon nitride film is $1.0 \times 10^{23}$ atoms/cm$^3$. FIG. 35B shows that the concentration of hydrogen (H) in the IGZO film is $5.0 \times 10^{19}$ atoms/cm$^3$ and the concentration of hydrogen (H) in the silicon oxynitride film is $3.0 \times 10^{21}$ atoms/cm$^3$.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) in the film in the thickness direction are analyzed by SIMS, an average value in a region where the film is provided, the value is not greatly changed, and an almost constant level of strength can be obtained is employed as the concentrations of hydrogen (H).

A difference between the IGZO films in the concentration of hydrogen (H) was found in this manner by changing the structure of the insulating film in contact with the IGZO film.

For example, in the case where any of the above IGZO films is formed in a channel formation region of a transistor, it is preferable to employ a structure in which a silicon oxynitride film is provided in contact with the IGZO film as shown Sample 6. As a light-transmitting conductive film used for an electrode of a capacitor, it is preferable to employ a structure in which a silicon nitride film is provided in contact with the IGZO film as shown in Sample 5. With such a structure, even when an IGZO film which is used for a channel formation region of a transistor and an IGZO film which is used for an electrode of a capacitor are formed through the same process, the hydrogen concentrations of the IGZO films can be made different from each other.

Example 3

In this example, the amounts of defects in an oxide semiconductor film and a multilayer film will be described with reference to FIGS. 36A to 36C and FIG. 37.

First, the structures of samples are described.

Sample 7 includes a 35-nm-thick oxide semiconductor film formed over a quartz substrate and a 100-nm-thick nitride insulating film formed over the oxide semiconductor film.

Sample 8 and Sample 9 each include a 30-nm-thick multilayer film formed over a quartz substrate and a 100-nm-thick nitride insulating film formed over the multilayer film. Note that in the multilayer film of Sample 8, a 10-nm-thick first oxide film, a 10-nm-thick oxide semiconductor film, and a 10-nm-thick second oxide film are stacked in this order. In the multilayer film of Sample 9, a 20-nm-thick first oxide film, a 15-nm-thick oxide semiconductor film, and a 10-nm-thick second oxide film are stacked in this order. Samples 8 and 9 are different from Sample 7 in that the multilayer film is included instead of the oxide semiconductor film.

Sample 10 includes a 100-nm-thick oxide semiconductor film formed over a quartz substrate, a 250-nm-thick oxide insulating film formed over the oxide semiconductor film, and a 100-nm-thick nitride insulating film formed over the oxide insulating film. Sample 10 is different from Samples 7 to 9 in that the oxide semiconductor film is not in contact with the nitride insulating film but in contact with the oxide insulating film.

Next, methods for forming the samples are described.

First, a method for forming Sample 7 is described.

A 35-nm-thick IGZO film was formed as the oxide semiconductor film over the quartz substrate. As for the IGZO film, the 35-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

Next, as first heat treatment, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Next, a 100-nm-thick silicon nitride film was formed as the nitride insulating film over the oxide semiconductor film. As for the silicon nitride film, the 100-nm-thick silicon nitride film was formed by a PE-CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 350° C.

Next, as second heat treatment, heat treatment was performed at 250° C. under a nitrogen atmosphere for one hour.

Through the above process, Sample 7 was formed.

Next, a method for forming Sample 8 is described.

As for Sample 8, the multilayer film was formed instead of the oxide semiconductor film of Sample 7. As for the multilayer film, the 10-nm-thick first oxide film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C. Then, the 10-nm-thick oxide semiconductor film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C. Then, the 10-nm-thick second oxide film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C.

Other steps are similar to those of Sample 7. Through the above process, Sample 8 was formed.

Next, a method for forming Sample 9 is described.

As for Sample 9, the multilayer film was formed instead of the oxide semiconductor film of Sample 7. As for the multilayer film, the 20-nm-thick first oxide film was formed over the quartz substrate under the same conditions as the first oxide film of Sample 8. Then, the 15-nm-thick oxide semiconductor film was formed by a sputtering method under the same conditions as the oxide semiconductor film of Sample 8. Then, the 10-nm-thick second oxide film was formed under the same conditions as the second oxide film of Sample 8.

Other steps are similar to those of Sample 7. Through the above process, Sample 9 was formed.

Next, a method for forming Sample 10 is described.

As for Sample 10, the 100-nm-thick oxide semiconductor film was formed over the quartz substrate under the same conditions as Sample 7.

Next, first heat treatment was performed under conditions similar to those of Sample 7.

Next, a 50-nm-thick first silicon oxynitride film and a 200-nm-thick second silicon oxynitride film were stacked over the oxide semiconductor film as the oxide insulating film. Here, the 50-nm-thick first silicon oxynitride film was formed by a PE-CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, the 200-nm-thick second silicon oxynitride film was formed by a PE-CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C. Note that the second silicon oxynitride film is a film containing oxygen at a higher proportion than oxygen in the stoichiometric composition.

Next, a 100-nm-thick silicon nitride film was formed over the oxide insulating film under the same conditions as Sample 7.

Next, second heat treatment was performed under conditions similar to those of Sample 7.

Through the above process, Sample 10 was formed.

Next, Samples 7 to 10 were measured by ESR. In the ESR measurement performed at a predetermined temperature, a value of a magnetic field ($H_0$) where a microwave is absorbed is used for an equation $g=\text{j}v/\beta H_0$, so that a parameter of a g-factor can be obtained. Note that the frequency of the microwave is denoted by $v$, and the Planck constant and the Bohr magneton are denoted by, respectively, h and $\beta$ which are both constants.

Here, the ESR measurement was performed under the conditions as follows. The measurement temperature was room temperature (25° C.), the high-frequency power (power of microwaves) of 8.92 GHz was 20 mW, and the direction of a magnetic field was parallel to a surface of each sample.

FIG. 36A shows a first derivative curve obtained by ESR measurement of the oxide semiconductor film in Sample 7; and FIGS. 36B and 36C show first derivative curves obtained by ESR measurement of the multilayer films in Samples 8 and 9. FIG. 36A shows the measurement result of Sample 7, FIG. 36B shows the measurement result of Sample 8, and FIG. 36C shows the measurement result of Sample 9.

Figure 37:
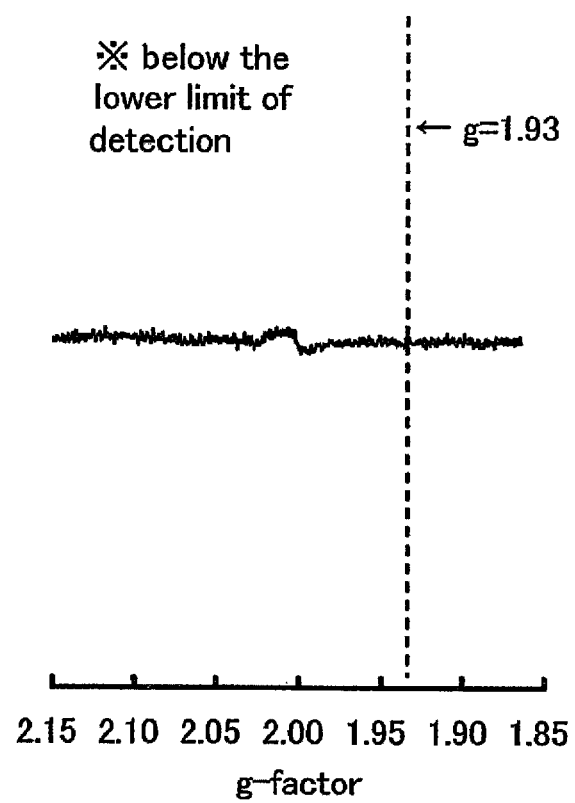
FIG. 37 shows a result of ESR measurement.

FIG. 37 shows a first derivative curve obtained by ESR measurement of the oxide semiconductor film in Sample 10.

In FIGS. 36A to 36C, Sample 7 has signal symmetry due to defects having a g-factor of 1.93 in the oxide semiconductor film. Samples 8 and 9 each have signal symmetry due to a defect having a g-factor of 1.95 in the oxide film. As for Sample 7, the spin density corresponding to a g-factor of 1.93 was $2.5 \times 10^{19}$ spins/cm$^3$, in Sample 8, the total spin densities corresponding to g-factors of 1.93 and 1.95 were $1.6 \times 10^{19}$ spins/cm$^3$, and in Sample 9, the total spin densities corresponding to g-factors of 1.93 and 1.95 were $2.3 \times 10^{19}$ spins/cm$^3$. That is, it is found that the oxide semiconductor film and the multilayer film include defects. Note that an oxygen vacancy is an example of the defect in the oxide semiconductor film and the multilayer film.

Although, in FIG. 37, the thickness of the oxide semiconductor film of Sample 10 is thicker than those of Samples 7 to 9, signal symmetry due to a defect was not detected, i.e., spin density was less than or equal to the lower limit of detection (here, the lower limit of detection was $3.7 \times 10^{16}$ spins/cm$^3$). Accordingly, it is found that the amounts of defects in the oxide semiconductor film cannot be detected.

It is found that when a nitride insulating film, here the silicon nitride film formed by a PE-CVD method is in contact with an oxide semiconductor film or a multilayer film, defects, typically oxygen vacancies are generated in the oxide semiconductor film or the multilayer film. On the other hand, when an oxide insulating film, here the silicon oxynitride film, is provided on an oxide semiconductor film, excess oxygen contained in the silicon oxynitride film, i.e., oxygen contained at a higher proportion than oxygen in the stoichiometric composition is diffused into the oxide semiconductor film and thus the number of defects in the oxide semiconductor film is not increased.

As described above, as shown in Samples 7 to 9, the oxide semiconductor film or the multilayer film which is in contact with the nitride insulating film has a number of defects, typically oxygen vacancies, and has a high conductivity and therefore can be used as an electrode of a capacitor. On the other hand, as shown in Sample 10, an oxide semiconductor film or a multilayer film which is in contact with the oxide insulating film has a small number of oxygen vacancies and low conductivity and therefore can be used as a channel formation region of a transistor.

REFERENCE NUMERALS

100: pixel portion, 102: transistor, 103: transistor, 104: scan line driver circuit, 105: capacitor, 106: signal line driver circuit, 107: scan line, 108: liquid crystal element, 109: signal line, 115: capacitor line, 119: conductive film, 157: pressure adjusting unit, 159: gas introduction unit, 301: pixel, 301a: pixel, 301b: pixel, 301c: pixel, 302: substrate, 303: conductive film, 304a: conductive film, 304b: conductive film, 304c: conductive film, 304d: conductive film, 304f: conductive film, 305: insulating film, 306: insulating film, 306n: insulating film, 307: oxide semiconductor film, 308: multilayer film, 308a: oxide semiconductor film, 308b: oxide semiconductor film, 308c: conductive film, 308d: oxide semiconductor film, 309: conductive film, 310a: conductive film, 310b: conductive film, 310c: conductive film, 310d: conductive film, 310e: conductive film, 310f: conductive film, 310g: conductive film, 311: insulating film, 312: insulating film, 313: insulating film, 314: insulating film, 315: conductive film, 316a: conductive film, 316b: conductive film, 316c: conductive film, 316d: conductive film, 318: alignment film, 320: liquid crystal layer, 322: liquid crystal element, 323: liquid crystal element, 332: insulating film, 342: substrate, 344: light-blocking film, 346: colored film, 348: insulating film, 350: conductive film, 352: alignment film, 372: opening, 372a: opening, 372b: opening, 372c: opening, 372d: opening, 372e: opening, 374a: opening, 374b: opening, 374c: opening, 374d: opening, 374e: opening, 376b: opening, 376c: opening, 380: multilayer film, 380a: oxide semiconductor film, 380b: oxide film, 383: n-type region, 382: opening, 382a: opening, 382b: opening, 384a: opening, 384b: opening, 384c: opening, 1901: glass substrate, 1903: insulating film, 1904: insulating film, 1905: oxide semiconductor film, 1906: multilayer film, 1907: conductive film, 1909: conductive film, 1910: insulating film, 1911: insulating film, 1913: opening, 1915: opening, 1917: opening, 1919: opening, 2000: deposition apparatus, 2100: substrate, 2101: load chamber, 2102: unload chamber, 2111: deposition chamber, 2112: deposition chamber, 2113: deposition chamber, 2114: deposition chamber, 2121: heating chamber, 2122: heating chamber, 2123: heating chamber, 2141: substrate supporting portion, 2143: moving unit, 2150: deposition chamber, 2151: target, 2153: attachment prevention plate, 2155: substrate heating unit, 2157: pressure adjusting unit, 2159: gas introduction unit, 2161: gate valve, 2170: heating chamber, 2171: heater, 2173: protection plate, 3501: wiring, 3502: wiring, 3503: transistor, 3504: liquid crystal element, 3510: wiring, 3510_1: wiring, 3510_2: wiring, 3511: wiring, 3515_1: block, 35152: block, 3516: block, 3530: electronic device, 3531: housing, 3532: touchscreen, 3533: battery, 3534: control portion, 3535: wiring, 3536: wiring, 3540: display panel, 3541: substrate, 3542: display portion, 3543: substrate, 3544: touch sensor, 3545: substrate, 3546: protective substrate, 3547: bonding layer, 9000: mobile phone, 9030: housing, 9031: housing, 9032: display panel, 9033: speaker, 9034: microphone, 9035: operation key, 9036: pointing device, 9037: camera lens, 9038: external connection terminal, 9040: solar cell, 9041: external memory slot, 9100: television device, 9101: housing, 9103: display portion, 9105: stand, 9107: display portion, 9109: operation key, 9110: remote controller, 9200: computer, 9201: main body, 9202: housing, 9203: display portion, 9204: keyboard, 9205: external connection port, 9206: pointing device, 9600: tablet terminal, 9630: housing, 9631*a*: display portion, 9631*b*: display portion, 9632*a*: region, 9632*b*: region, 9633: clip, 9634: display-mode switching button, 9635: power button, 9636: power-saving-mode switching button, 9638: operation key panel, 9639: keyboard display switching button.

This application is based on Japanese Patent Application serial no. 2012-281874 filed with Japan Patent Office on Dec. 25, 2012, the entire contents of which are hereby incorporated by reference.

The invention claimed is:

1. A semiconductor device comprising:
    a transistor, the transistor including:
        a first insulating film;
        an oxide semiconductor film over the first insulating film; and
        a gate electrode adjacent to the oxide semiconductor film;
    a capacitor, the capacitor including:
        a first light-transmitting conductive film over the first insulating film;
        a nitride insulating film over the first light-transmitting conductive film; and
        a second light-transmitting conductive film over the nitride insulating film; and
    an oxide insulating film over the oxide semiconductor film, the gate electrode, and the first light-transmitting conductive film,
    wherein the nitride insulating film is positioned over the oxide insulating film and is in contact with the first light-transmitting conductive film,
    wherein the second light-transmitting conductive film is electrically connected to the oxide semiconductor film through an opening of the oxide insulating film and an opening of the nitride film, and
    wherein a width of the opening of the oxide insulating film is larger than a width of the opening of the nitride insulating film.

2. The semiconductor device according to claim 1, wherein the oxide semiconductor film comprises an In—Ga—Zn oxide.

3. The semiconductor device according to claim 1, wherein the first light-transmitting conductive film comprises an In—Ga—Zn oxide.

4. The semiconductor device according to claim 1, wherein each of the oxide semiconductor film and the first light-transmitting conductive film is in contact with a top surface of the first insulating film.

5. The semiconductor device according to claim 1, wherein an off-state current of the transistor is less than or equal to $1 \times 10^{-13}$ A at a voltage between a source of the transistor and a drain of the transistor of 10 V.

6. A semiconductor device comprising:
    a transistor, the transistor including:
        a gate electrode;
        an insulating film over the gate electrode;
        an oxide semiconductor film over the insulating film; and
        a pair of electrodes in contact with the oxide semiconductor film;
    a capacitor, the capacitor including:
        a first light-transmitting conductive film over the insulating film;
        a dielectric film over the first light-transmitting conductive film; and
        a second light-transmitting conductive film over the dielectric film;
    an oxide insulating film over the pair of electrodes of the transistor; and
    a nitride insulating film over the oxide insulating film,
    wherein the dielectric film included in the capacitor is the nitride insulating film,
    wherein the oxide insulating film has a first opening over each of one of the pair of electrodes and the first light-transmitting conductive film,
    wherein the nitride insulating film has a second opening over the one of the pair of electrodes,
    wherein the second opening is on an inner side than the first opening over the one of the pair of electrodes, and
    wherein the second light-transmitting conductive film included in the capacitor is connected to the one of the pair of electrodes included in the transistor in the second opening over the one of the pair of electrodes.

7. The semiconductor device according to claim 6,
    wherein the oxide semiconductor film and the first light-transmitting conductive film each include a microcrystalline region, and
    wherein in the microcrystalline region, circumferentially arranged spots are observed in an electron diffraction pattern using electron diffraction with a measurement area less than or equal to 10 nmϕ and circumferentially arranged spots are not observed in an electron diffraction pattern using electron diffraction with a measurement area greater than or equal to 300 nmϕ.

8. The semiconductor device according to claim 6, wherein the oxide semiconductor film and the first light-transmitting conductive film each include indium or zinc.

9. The semiconductor device according to claim 6, further comprising:
    a first conductive film over an insulating surface;
    a second conductive film over the insulating film; and
    a third light-transmitting conductive film connecting the first conductive film and the second conductive film, over the nitride insulating film,
    wherein the gate electrode is provided over the insulating surface,
    wherein the oxide insulating film includes a third opening over the first conductive film,
    wherein the nitride insulating film includes a fourth opening over the first conductive film,
    wherein the fourth opening is on an inner side than the third opening, and
    wherein the first conductive film is connected to the third light-transmitting conductive film in the fourth opening.

10. The semiconductor device according to claim 9,
    wherein the first conductive film is formed through the same process as that of the gate electrode,
    wherein the second conductive film is formed through the same process as that of the pair of electrodes, and
    wherein the third light-transmitting conductive film is formed through the same process as that of the second light-transmitting conductive film.

11. The semiconductor device according to claim 6, further comprising a capacitor line formed on the same surface where the gate electrode is formed,
    wherein the first light-transmitting conductive film is in contact with the capacitor line.

12. The semiconductor device according to claim 6, further comprising a capacitor line formed on the same surface where the pair of electrodes is formed, wherein the first light-transmitting conductive film is in contact with the capacitor line.

13. The semiconductor device according to claim 6, wherein an off-state current of the transistor is less than or equal to $1\times10^{-13}$ A at a voltage between a source of the transistor and a drain of the transistor of 10 V.

14. A semiconductor device comprising:
a transistor, the transistor including:
  a gate electrode;
  an insulating film over the gate electrode;
  an oxide semiconductor film over the insulating film; and
  a pair of electrodes in contact with the oxide semiconductor film;
a capacitor, the capacitor including:
  a first light-transmitting conductive film over the insulating film;
  a dielectric film over the first light-transmitting conductive film; and
  a second light-transmitting conductive film over the dielectric film;
an oxide insulating film over the pair of electrodes of the transistor; and
a nitride insulating film over the oxide insulating film,
wherein the dielectric film included in the capacitor is the nitride insulating film,
wherein the second light-transmitting conductive film included in the capacitor is connected to one of the pair of electrodes included in the transistor,
wherein a hydrogen concentration of the oxide semiconductor film is different from a hydrogen concentration of the first light-transmitting conductive film,
wherein the second light-transmitting conductive film is electrically connected to the oxide semiconductor film through an opening of the oxide insulating film and an opening of the nitride insulating film, and
wherein a width of the opening of the oxide insulating film is larger than a width of the opening of the nitride film.

15. The semiconductor device according to claim 14, wherein the hydrogen concentration of the first light-transmitting conductive film is higher than the hydrogen concentration of the oxide semiconductor film.

16. The semiconductor device according to claim 14, wherein the oxide semiconductor film and the first light-transmitting conductive film each include a microcrystalline region, and
wherein in the microcrystalline region, circumferentially arranged spots are observed in an electron diffraction pattern using electron diffraction with a measurement area less than or equal to 10 nmϕ and circumferentially arranged spots are not observed in an electron diffraction pattern using electron diffraction with a measurement area greater than or equal to 300 nmϕ.

17. The semiconductor device according to claim 14, wherein the oxide semiconductor film and the first light-transmitting conductive film each include indium or zinc.

18. The semiconductor device according to claim 14, further comprising:
a first conductive film over an insulating surface;
a second conductive film over the insulating film; and
a third light-transmitting conductive film connecting the first conductive film and the second conductive film, over the nitride insulating film,
wherein the gate electrode is provided over the insulating surface,
wherein the opening of the oxide insulating film is over the first conductive film,
wherein the opening of the nitride insulating film is over the first conductive film,
wherein the opening of the nitride insulating film is on an inner side than the opening of the oxide insulating film, and
wherein the first conductive film is connected to the third light-transmitting conductive film in the opening of the nitride insulating film.

19. The semiconductor device according to claim 18,
wherein the first conductive film is formed through the same process as that of the gate electrode,
wherein the second conductive film is formed through the same process as that of the pair of electrodes, and
wherein the third light-transmitting conductive film is formed through the same process as that of the second light-transmitting conductive film.

20. The semiconductor device according to claim 14, further comprising a capacitor line formed on the same surface where the gate electrode is formed,
wherein the first light-transmitting conductive film is in contact with the capacitor line.

21. The semiconductor device according to claim 14, further comprising a capacitor line formed on the same surface where the pair of electrodes is formed,
wherein the first light-transmitting conductive film is in contact with the capacitor line.

22. The semiconductor device according to claim 14, wherein an off-state current of the transistor is less than or equal to $1\times10^{-13}$ A at a voltage between a source of the transistor and a drain of the transistor of 10 V.

23. A semiconductor device comprising:
a gate electrode;
an insulating film over the gate electrode;
an oxide semiconductor film over the insulating film;
a conductive film of an oxide over the insulating film;
a first conductive film over and electrically connected to the oxide semiconductor film;
a second conductive film over and electrically connected to the oxide semiconductor film;
an oxide insulating film over the oxide semiconductor film, the conductive film of the oxide, the first conductive film and the second conductive film;
a nitride insulating film over the oxide insulating film; and
a third conductive film over the nitride insulating film,
wherein the conductive film of the oxide, the nitride insulating film and the third conductive film form a capacitor,
wherein the nitride insulating film is in contact with the conductive film of the oxide,
wherein the third conductive film is electrically connected to the second conductive film through an opening of the oxide insulating film and an opening of the nitride insulating film, and
wherein the nitride insulating film is in contact with the second conductive film in the opening of the oxide insulating film.

24. The semiconductor device according to claim 23, wherein an off-state current of a transistor including the oxide semiconductor film is less than or equal to $1\times10^{-13}$ A at a voltage between a source of the transistor and a drain of the transistor of 10 V.

* * * * *

UNITED STATES PATENT AND TRADEMARK OFFICE
CERTIFICATE OF CORRECTION

PATENT NO.       : 9,911,755 B2
APPLICATION NO.  : 14/107688
DATED            : March 6, 2018
INVENTOR(S)      : Shunpei Yamazaki et al.

Page 1 of 1

It is certified that error appears in the above-identified patent and that said Letters Patent is hereby corrected as shown below:

Claim 1, Column 73, Line 37, "nitride film," should read --nitride insulating film,--;

Claim 14, Column 75, Lines 38-39, "nitride film." should read --nitride insulating film.--.

Signed and Sealed this
Eighth Day of May, 2018

Andrei Iancu
*Director of the United States Patent and Trademark Office*